United States Patent [19]

Kuhara et al.

[11] Patent Number: 5,787,215
[45] Date of Patent: Jul. 28, 1998

[54] LINEAR PD/LD MODULE, LINEAR PD/LED MODULE, LINEAR LD/PD MODULE, LINEAR LED/PD MODULE AND LINEAR PD MODULE

[75] Inventors: Yoshiki Kuhara; Naoyuki Yamabayashi; Yasuhiro Iguchi; Yasushi Fujimura; Hiromi Nakanishi, all of Osaka, Japan

[73] Assignee: Sumitomo Electric Industries, Ltd., Osaka-Fu, Japan

[21] Appl. No.: 748,623

[22] Filed: Nov. 13, 1996

[30] Foreign Application Priority Data

Nov. 13, 1995 [JP] Japan .................................. 7-319705
Jan. 9, 1996 [JP] Japan .................................. 8-019350

[51] Int. Cl.$^6$ .................................. G02B 6/36; H01S 3/18; H04J 14/02
[52] U.S. Cl. .................................. 385/88; 385/24; 385/49; 385/33; 385/89; 385/93; 372/43; 372/50; 359/115; 359/124
[58] Field of Search .................................. 385/49, 33, 88, 385/89, 92, 93, 24; 359/113, 114, 115, 124, 127, 154; 372/43, 50

[56] References Cited

U.S. PATENT DOCUMENTS

| | | | |
|---|---|---|---|
| 5,109,447 | 4/1992 | Chan | 385/45 |
| 5,146,514 | 9/1992 | Birk | 385/24 |
| 5,177,803 | 1/1993 | Newhouse et al. | 385/43 |
| 5,291,571 | 3/1994 | Kunikane et al. | 385/93 |
| 5,355,237 | 10/1994 | Lang et al. | 359/130 |
| 5,487,120 | 1/1996 | Choy et al. | 385/24 |
| 5,526,155 | 6/1996 | Knox et al. | 359/130 |
| 5,568,576 | 10/1996 | Takai et al. | 385/24 |

FOREIGN PATENT DOCUMENTS 6-45635 2/1994 Japan .................................. 385/24 X

OTHER PUBLICATIONS

Shishikura et al: "A wide tolerance waveguide type PIN photodiode" (A Waveguide PIN-PD with Wide Coupling Tolerance) Electronics Information Communication Society 1995, C-386(1995) and its English version.

Yamada et al: "A Hybrid Integrated Optical WDM Transmitter/Receiver Module for Optical Subscriber Systems Utilizing a Planar Lightwave Circuit Platform".. Postdeadline Papers of Optical Fiber Communication "95. PD 12-2 (1995).

Omori et l: "Optical Devices Technologies for Access Networks", 6th International Workshop On Optical Access Networks, S3.5-1 (1994).

*Primary Examiner*—Brian Healy
*Attorney, Agent, or Firm*—Cushman Darby & Cushman IP Group of Pillsbury Madison & Sutro, LLP

[57] ABSTRACT

WDMs have been used to separate a plurality of signals spatially by the difference of wavelengths in prior bidirectional multiwavelength optical communication network. For excluding WDMs, linear PD/LD modules adopt eigenwavelength photodiodes sensing only the light of an eigen wavelength but allowing all the wavelengths longer than the eigen wavelength. An n-member PD/LD module aligns (n-1) eigen wavelength photodiodes, PD1, PD2, PD3, ..... PDn-1 of $\lambda 1$, $\lambda 2$, $\lambda 3$, ... $\lambda$n-1 and an LD of $\lambda$ n which satisfy inequalities $\lambda 1 < \lambda 2 < \lambda 3 < ... < \lambda$ n in series on a beam line in the order of increasing the eigen wavelengths. Otherwise, an n-member PD/LED module aligns k eigen wavelength PDs of $\lambda 1$, $\lambda 2$, $\lambda 3$, ...., $\lambda$k and (n-k) LEDs emitting light of different wavelengths of $\lambda$k+1, $\lambda$k+2, $\lambda$k+3, ... $\lambda$ n on the beam line in the same order. On the contrary, an n-member LD/PD module aligns a $\lambda 1$ laser and (n-1) eigen-wavelength photodiodes PD2, PD3,...., PDn of $\lambda 2$, $\lambda 3$, ..... $\lambda$n in series on a beam line ( $\lambda 1 < \lambda 2 < \lambda 3 < ... < \lambda$n). Otherwise, an n-member LED/PD module aligns k LEDs emitting light of different wavelengths of $\lambda 1$, $\lambda 2$, $\lambda 3$, ...., $\lambda$k and (n-k) eigen wavelength PDs of $\lambda$k+1, $\lambda$k+2, $\lambda$k+3, ... $\lambda$ n in series on a beamline($\lambda 1 < \lambda 2 < \lambda 3 < ... < \lambda$n).

35 Claims, 20 Drawing Sheets

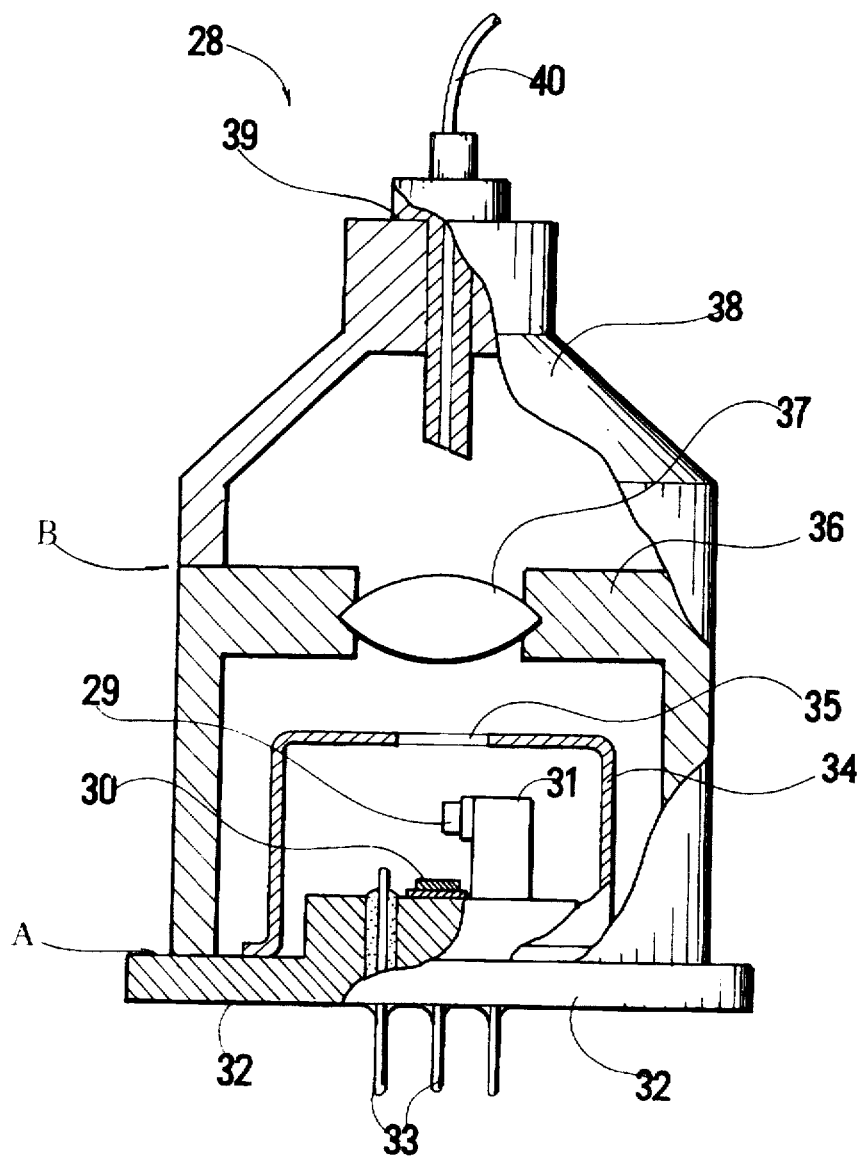

Fig. 19
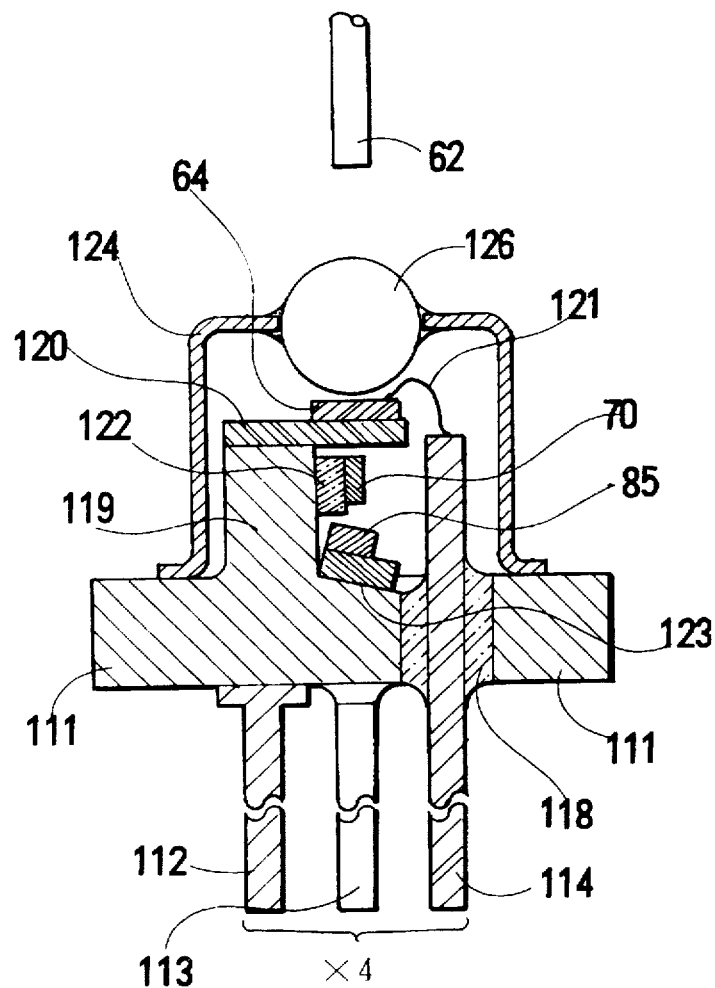
Fig. 20 (a)    Fig. 20 (b)    Fig. 20 (c)
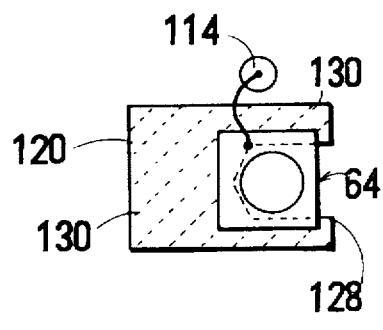 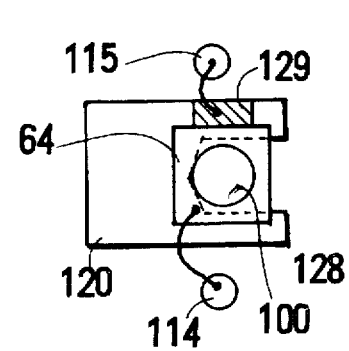 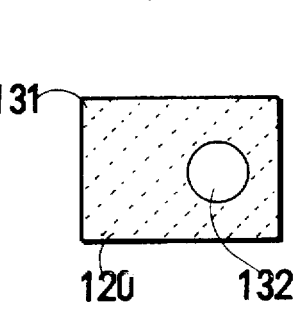

Fig. 23
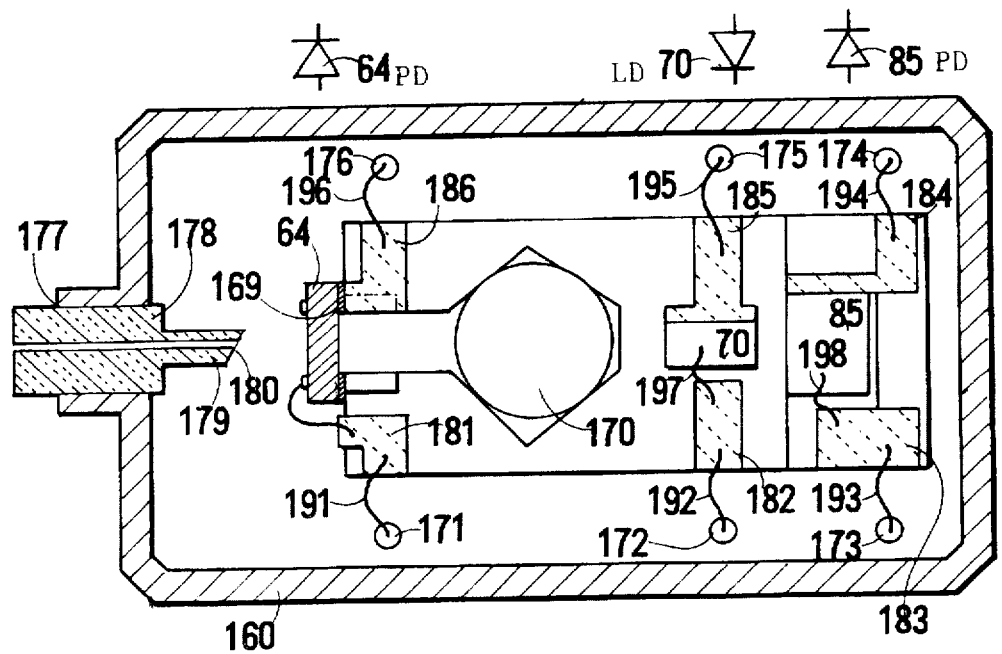
Fig. 24A
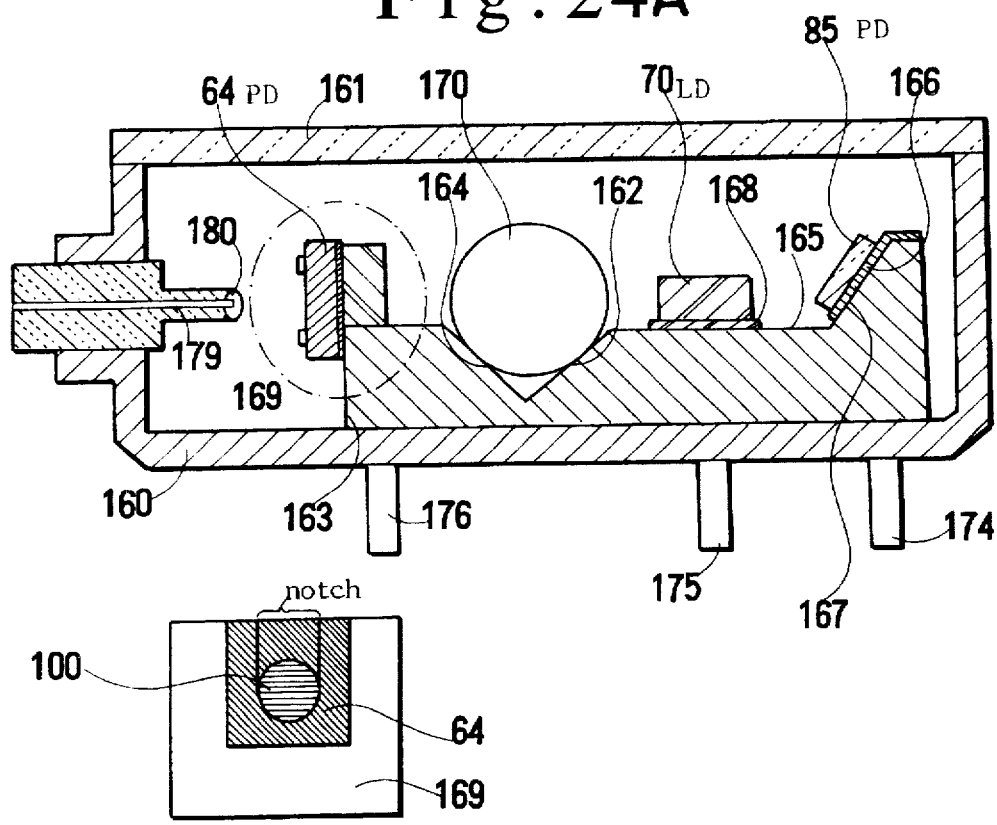
Fig. 24B

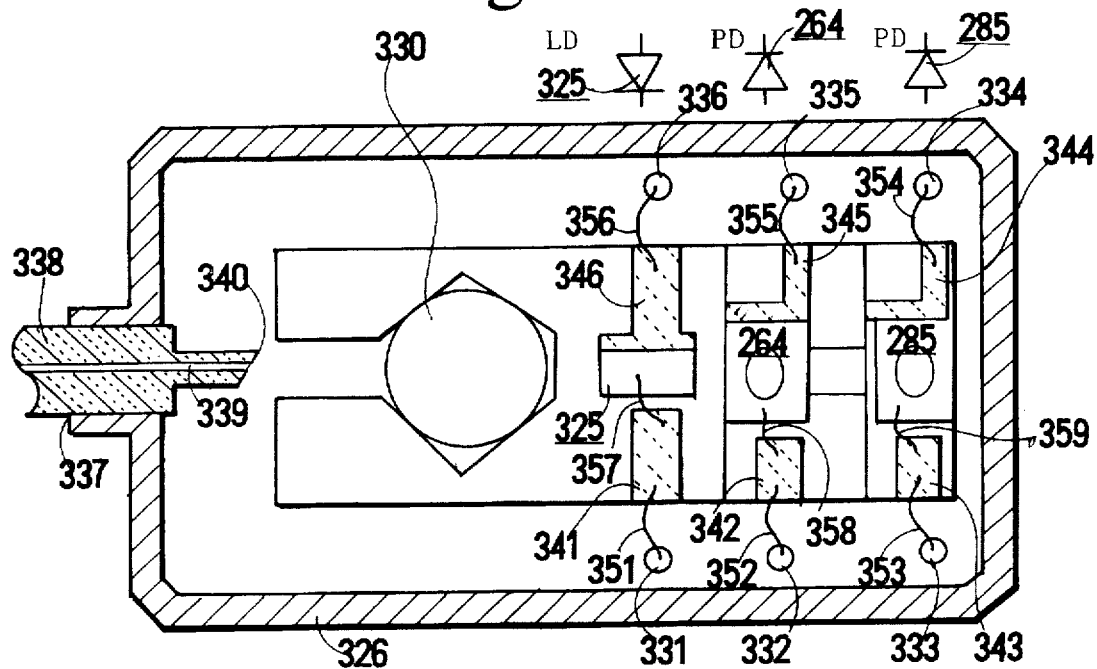
Fig. 41
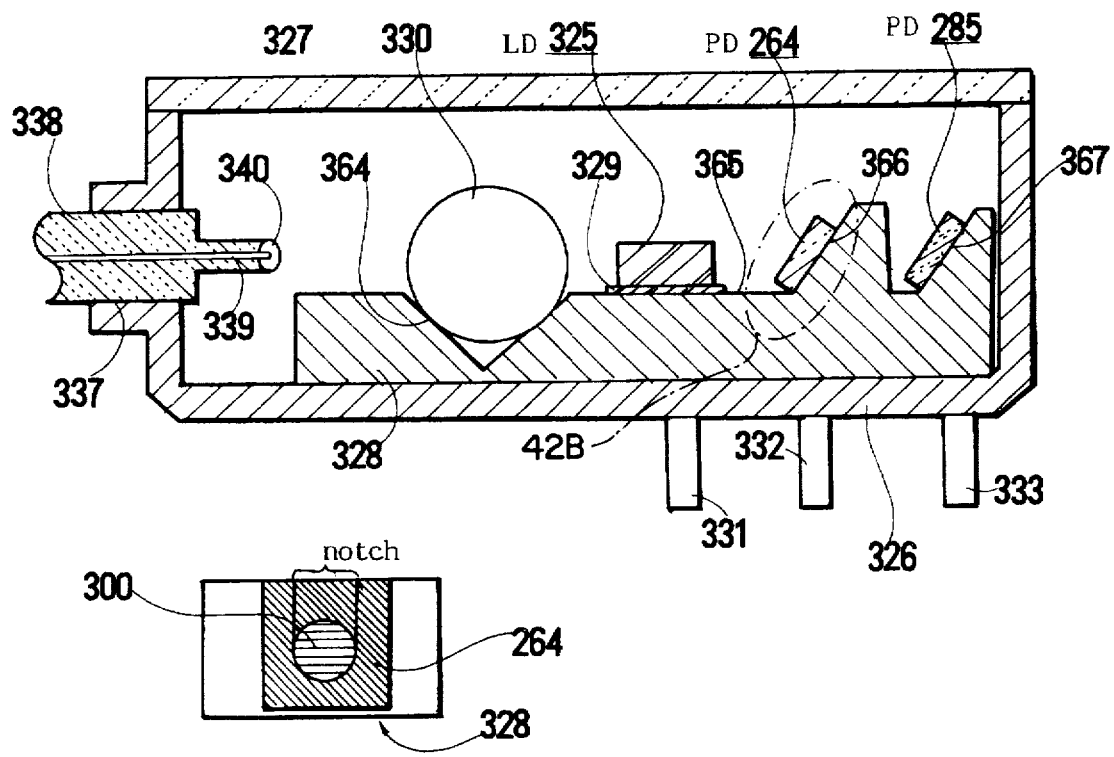
Fig. 42A
Fig. 42B

LINEAR PD/LD MODULE, LINEAR PD/LED MODULE, LINEAR LD/PD MODULE, LINEAR LED/PD MODULE AND LINEAR PD MODULE

FIELD OF THE INVENTION

This invention relates to a light emitting device/ photodiode module which combines a plurality of photodiodes (PD) and laser diodes (LD) or light emitting diodes (LED) in an optical communication system which sends optical signals with different wavelengths in optical fibers bidirectionally between a broadcasting station and ONU terminals.

BACKGROUND OF THE INVENTION

This application claims a priority based on Japanese patent applications No.7-319705(319705/'95) filed on Nov. 13, 1995 and No.8-19350(19350/'96) filed on Jan. 9, 1996, which are incorporated herein by reference.

Explanation of Bidirectional Optical Communication System

Recent development of optoelectronics has reduced the transmission loss of optical fibers and has enhanced the properties of semiconductor lasers (laser diode: LD) and photodiodes (PD). The progress of fiber technology and optoelectronics enable a fiber-optic system to transmit various types of information. The system is called "optical communication" or "fiber-optic communication" since the system sends the information by light signals. The types of information to be exchanged by the fiber-optic communication are, for example, the signals of telephones, facsimiles or televisions. Trials of sending optical signals have been frequently done by employing long wavelength light of, in particular 1.3 μm band or 1.55 μm band. The probability of a bidirectional optical communication system which enables two terminals to send the signals in both directions in a single fiber and to receive the signals from the counterpart at the same time. The system is called "bidirectional communication", because the fiber transmits the signals in both directions. The advantage of the system is that the signals can be sent by only a single fiber.

FIG. 1 shows the principle of a multiwavelength bidirectional optical communication system which utilizes different wavelengths of light. A central broadcasting station is combined by optical fibers with a plurality of terminals which are called an ONU (optical network unit). Although FIG. 1 depicts only one terminal, there are a plenty of ONU terminals and a lot of bisectors in the fiber network. The signals from a broadcasting station travel in many fibers and bisectors to every one of the terminals. The broadcasting station amplifies digital signals of telephones and analog signals of televisions and drives a laser diode (LD1) with the amplified signals (P1). The signals are transduced into optical signals of a wavelength λ1. The optical signals of λ1 go into an optical fiber (1) and progress into a middle fiber (3) through the bisector (2). Travelling in the fiber (3), the λ1 signals arrive at a bisector (4) in an ONU module, and are guided into a fiber (5). Finally, the λ1 signals are transduced into electric signals (P3) by a photodiode (PD2) of the ONU terminal. The electric signals (P3) are amplified, processed and reproduced as voice of telephones or pictures of televisions on the ONU terminal. Such a signal which is sent from the broadcasting station to ONU terminals is called a "downward signal" and the direction of the flow is named a "downward direction".

On the other hand, an ONU converts the signals (P4) of telephones and facsimiles into light signals of a wavelength λ2 by a laser diode (LD2) in the ONU terminal. The λ2 signals enter a fiber (6), pass through the bisector (4) and propagate in the fiber (3) to the broadcasting station. Going through the bisector (2), the λ2 signals reach a photodiode (PD1) of the station. The photodiode (PD1) transduces the λ2 light signals into electric signals (P2) which is fed into a converter, a processor or so. Such a signal which is transmitted from an ONU to the broadcasting station is called an "upward signal". The direction of the signal flow is named an "upward direction". Since the fiber (3) allows light signals to travel in both directions, the system can be called a "bidirectional communication system".

The above system uses the λ1 light only for the downward signals and the λ2 light exclusively for the upward signals. It is, however, also possible to make use of the same wavelength both for the upward signals and the downward signals. Sometimes both wavelengths are commonly used both for the upward signals and the downward signals. In the modes which send the same wavelength light bidirectionally, one of the most important problems is the separation of the light of different wavelengths travelling in the same direction.

Explanation of an Optical Wavelenght Multiplexer

The bidirectional communication system which sends optical signals of two different wavelengths in a single fiber both in the downward direction and in the upward direction requires devices for distinguishing the light signals with the different wavelengths both at the broadcasting station and at the ONU terminals. The WDM (2) (wavelength division multiplexer) at the broadcasting station and the WDM (4) at the ONUs in FIG. 1 play the role of distinguishing and separating the light waves of the different wavelengths. The WDM has a function of selecting one of two different wavelengths in an input fiber and guiding the selected wavelength into an output optical fiber and another function of integrating the light waves of two different wavelengths λ1 and λ2 travelling in two fibers into an optical fiber. The WDM plays an important role in the multiwavelength bidirectional communication.

Various kinds of WDMs have been proposed. FIG. 2 to FIG. 4 exhibit some of the proposed WDMs. FIG. 2 denotes a WDM made of optical fibers or optical waveguides. Two optical paths (8) and (9) join together at a part (10) at which two paths exchange energy with each other. Various modes of coupling are realized by selecting the spacing (D) or the length (L) of the closing part (10). The WDM combines the λ1 light in the path (8) and the λ2 light in the path (9) and introduces both the λ1 light and the λ2 light together into a path (11) to a port (P3). Neither the λ1 nor the λ2 goes into the path (12). Namely, λ1 does not transfer into the neighboring path and remains in the original fiber but λ2 fully transfers into the other path. The WDM made of fibers or waveguides has an advantage of little dependence on the polarization of light waves, since the WDM is made from optical fibers or optical waveguides.

The optical paths in waveguides or fibers have reversibility with regard to the direction of propagation. The WDM shown in FIG. 2 can be used as a bidirectional WDM indicated by FIG. 3 in the bidirectional network. The WDM introduces the λ1 light into a fiber (8) from a port (P1) and guides the light to go out through a fiber (11) to a port (P3). The same WDM receives the λ2 light from the port (P3) and supplies the λ2 light to the port (P2). The WDM can be utilized as the WDM in FIG. 1.

FIG. 4 exhibits another WDM making use of dielectric multilayers. The dielectric type WDM has two transparent isosceles rectangular triangle columns (13) and (14) and a dielectric multilayer (15) coated on the bisecting plane of the column. The multilayer (15) reflects the whole of the λ2 light but makes all the λ1 light pass through by adjusting the refractive indices and the thicknesses of the dielectric films. The dielectric multilayer type WDM has a dependence upon the polarization, since the selective mirror (15) reflects or permits the beams which collide with the mirror surface at 45 degrees. The dielectric multilayer WDM can also be adopted as the WDMs in the network system in FIG. 1. Such a WDM has been on sale.

A laser/photodiode module on an ONU terminal is now explained by referring to FIG. 5. An end of the fiber (16) leading to a central broadcasting station (not shown) is joined to an inner optical fiber (18) via an optical connector (17). An ONU module in the house of the CATV subscriber has an optical fiber WDM (21) which connects the fiber (18) to a fiber (19) at a joint (20) with wavelength selectivity. The fiber (18) is connected to an LD (laser diode) module (25) of 1.55 μm via a connector (22) and a fiber (24). Another fiber (19) communicates with a PD (photodiode) module (27) via a connector (23) and a fiber (26). The LD (25) and the fiber (24) build an upward system for sending the signals of 1.55 μm light from the ONU terminal to the broadcasting station. The PD (27) and the fiber (26) construct a downward system for receiving the signals of 1.3 μm light from the broadcasting station. The PD (27) converts the 1.3 μm optical signals into electric signals in the ONU module. The LD module (25), a transmitter, includes the devices for amplifying the signals of telephones and facsimiles, modulating the electric signals by some mode and a laser for transducing the electric signals into optical signals. The PD module (27) contains a photodiode for converting the optical signals of TV or telephones from the broadcasting station to electric signals, an amplification circuit and a demodulation circuit. The WDM (21) has a function of separating the 1.55 μm light from the 1.3 μm light. The present system allocates the 1.55 μm light to the upward system and the 1.3 μm light to the downward system. In some actual case, the downward system requires two different wavelengths. One wavelength must be used both in the downward system and in the upward system. Thus, the WDM must separate two different wavelengths with a high efficiency.

Another example of prior PD/LD module on an ONU terminal is exhibited by FIG. 34. This module is simply obtained by exchanging the wavelengths of 1.3 μm and 1.55 μm in the mentioned one of FIG. 5. A fiber (226) from the central station is coupled to an inner fiber (228) by an optical connecter (227). A fiber-type WDM (231) separates the light by the wavelength into 1.3 μm and 1.55 μm light spatially. As mentioned before, the distance D and the length L of the WDM determine the wavelengths to be allocated to two paths. The WDM (231) allots the 1.3 μm light to a fiber (228). 1.55 μm light is allotted to another fiber (229). The fiber (228) is joined to an LD module (235) by a connector (232). The LD (235) module converts digital signals of the ONU terminal into light signals and sends the optical signal to the central station. The fiber (229) is coupled by a connector (233) to a PD module (237) which transduces the optical signals sent from the station to electric signals.

This invention relates to an improvement of a laser/photodiode (LD/PD) module for a bidirectional optical communication system by the light of two wavelengths. The laser/photodiode module includes a laser diode, a photodiode and electric circuits for supporting the transducers. Prior art for the parts is explained.

Explanation of Prior Light Emitting Devices

A prior semiconductor light emitting device (28) is now explained by referring to FIG. 6. This is a laser module containing a laser chip (29) and a photodiode chip (30) for monitoring the output of the laser (29). The semiconductor laser diode chip (29) is mounted on a vertical wall of a protrusion (31) of a header (32), because the laser (29) emits light in the direction parallel to the surface. The monitoring photodiode (30) is mounted on an insulating submount bonded on the header (32). The light emitted from the bottom end of the laser (29) is detected by the photodiode (30). A plural lead pins (33) are implanted on the bottom of the header (32). The upper surface of the header (32) is covered by a cap (34). The cap (34) has an opening (35) at the center of the upper wall. The laser emits light upward and downward. A lens (37) is upholstered just above the opening (35). A cylindrical lens holder (36) holds the lens (37). A conical housing (38) is welded on the lens holder (36). The top of the housing (38) maintains a ferrule (39) which fixes an end of an optical fiber (40). Ends of the ferrule (39) and the optical fiber (40) are ground in a slanting plane at an angle of e.g., 8 degrees. The slanting end of the fiber prevents the reflected light from returning the laser diode (29). The lens holder (36) is welded at the periphery (A) on the header (32) at the optimum position in which the lens axis coincides with the laser optical axis in the vertical direction. Then the housing (38) is positioned and welded on the holder (36) at the position which maximizes the output from the other end of the fiber (40). Every electrode pad of the laser chip (29) and the photodiode chip (30) is wirebonded to any of the lead pins (33) of the header (32). The light beams emitted from the laser (29) are converged to an end of the fiber (40) by the lens (37). The light beams bring optical signals, because the laser (29) is modulated by the electric signals. The output of the laser (29) is monitored by the photodiode (30). The wavelength of the light is determined by the material of the semiconductor layers of the laser (29). Explanation of Prior Photodiode Modules FIG. 7 demonstrates an example of a prior photodiode module. A photodiode chip (41) is die-bonded on a header (42). The header (42) has lead pins (43) on the bottom. A cap (44) is fitted on the top surface of the header (42). The cap (44) has an opening (45) at the center. A cylindrical holder (46) is fixed on the header (42) for supporting a lens (47). A conical housing (48) is fixed on the lens holder (46). The housing (48) sustains a ferrule (49) holding an end of an optical fiber (50). The ends (51) of the ferrule (49) and the fiber (50) are cut in a slanting plane. The positions of the holder (46), the housing (48) and the ferrule (49) are determined at the positions which maximize the output of the photodiode, when light is led into the other end of the fiber (50). The material of the light receiving layer of the photodiode determines the range of the wavelength of the light detectable by the PD. A Si photodiode is available for sensing visible light. A Si photodiode, however, is unsuitable, since the present invention aims at an improvement of an ONU module which adopts near-infrared light for which a Si PD has no sensitivity. The optical communication requires a compound semiconductor photodiode having an InP substrate for sensing the infrared light.

Explanation of an Example of a Prior Photodiode Chip

A photodiode with an InP substrate for the long wavelength is explained. FIG. 8 is a section of a prior PD chip employed by the optical communication system. The substrate (52) of the PD chip is n-InP. An n-InP buffer layer (53), an n-InGaAs light receiving (absorbing) layer (54) and an n-InP window layer (55) are epitaxially grown in this order on the n-InP substrate (52). A p-region (56) is made at the center of the top surface by diffusing zinc (Zn) through a mask. The region of Zn-diffusion attains to some part of the n-InGaAs light receiving layer (54). Thus, the p-region (56) includes the p-InP window layer and the p-InGaAs light receiving layer. Namely, a pn-junction is formed in the InGaAs absorption layer. A ring p-electrode (57) is formed on the Zn-diffusion region (56). Light enters the photodiode chip at an inner part enclosed by the annular p-electrode (57). The inner part within the p-electrode (57) is covered with an antireflection film (58). The outer part of the window layer (55) is protected with a passivation film (59). An n-electrode (61) is formed on the bottom of the n-InP substrate (52). The whole bottom of the chip is fully covered with the n-electrode (61) in prior photodiodes. This is one of the features of prior PDs. The pn-junction is reversely biased by applying voltage between the p-electrode (57) and the n-electrode (61). The light (60) going out of the optical fiber passes the central antireflection film (58), the p-InP window layer, p-InGaAs layer, the pn-junction and the n-InGaAs layer (54). The light is absorbed in the vicinity of the pn-junction. The absorbed light generates pairs of electrons and holes. Since the photodiode is reversely biased, the electrons run toward the n-electrode (61) and the holes progress to the p-electrode (57). A photocurrent flows in the PD chip. Since the number of photons is in proportion to the photocurrent, the PD can detect the amount of the incident light power.

The InGaAs light receiving layer absorbs both 1.3 µm light and 1.55 µm light. The InP window layer absorbs neither 1.3 µm light nor 1.55 µm light. A semiconductor permits the light of an energy hv less than the energy gap Eg (hv<Eg) to pass through without loss, because the photon energy hv cannot excite the electrons in the valence band up to the conduction band. A semiconductor is transparent for the light of a wavelength $\lambda$ longer than the edge wavelength hc/Eg corresponding to the band gap energy Eg.

On the contrary, a semiconductor absorbs all the light of a wavelength shorter than the edge wavelength hc/Eg, if the semiconductor has an enough thickness, because the photons (hv>Eg) can excite the electrons in the valence band up to the conduction band. Egw denotes the band gap energy of the InP window layer. Egz is the band gap of the InGaAs absorption layer. The light having an intermediate energy hv of Egz<hv<Egw passes the window layer but is entirely absorbed in the absorbing layer. Thus, the photodiode can detect only the light having an energy hv which is bigger than Egz but smaller than Egw. The range of the detectable wavelength $\lambda$ is hc/Egw<$\lambda$<hc/Egz.

The components of the absorption layer (54) is simply represented as InGaAs without a ratio x of a mixture crystal. The ratio x defining the component of $In_{1-x}Ga_xAs$ is uniquely determined by the condition of the lattice fitting of $In_{1-x}Ga_xAs$ to InP. Thus, the band gap of the InGaAs absorption layer is determined without ambiguity.

FIG. 9 shows the sensitivity as a function of the wavelength of the conventional photodiode of FIG. 8. The abscissa is the wavelength $\lambda$ (µm) of the incident light. The ordinate is the sensitivity (A/W). The sensitivity is low for the wavelength below 0.95 µm (P-point). The sensitivity rises rapidly at $\lambda$=0.95 µm. The range (Q-region) from 1.0 µm to 1.5 µm enhances the sensitivity linearly. At 1.7 µm (R-point), the sensitivity falls rapidly. At 1.75 µm, the sensitivity reduces to 0.

There is a relation of hv=hc/$\lambda$=E between the wavelength and the energy, where h is Plank's constant, v is the frequency of light, c is the velocity of light. What determined the lower limit wavelength (0.95 µm) with a definite sensitivity is the band gap Egw of the InP window layer. The light ($\lambda$<hc/Egw) having an energy higher than Egw is fully absorbed by the InP window layer and does not reach the InGaAs light receiving layer. What defines the upper limit wavelength (1.67 µm) with a definite sensitivity is the band gap Egz of the InGaAs absorption layer. The light of energy lower than Egz passes through the light receiving layer without being absorbed. Namely, the band gap Egw of the window layer determines the sensitivity-rising point P. The band gap Egz of the absorption layer determines the sensitivity-falling point R. The prior InGaAs photodiode has a wide range of sensitivity including 1.3 µm and 1.55 µm. Therefore, the same InGaAs photodiode can be used both for detecting 1.3 µm light and for sensing 1.55 µm light.

A photon has an energy of hv=hc/$\lambda$. A photon creates a pair of an electron and a hole which originates a photocurrent of q (q is an elementary charge) in an ideal case with a conversion efficiency of 100%. If the conversion efficiency were 100%, the sensitivity should be given by q $\lambda$/hc (A/W). The fact causes the linear rise of the sensitivity in the Q-region between 1.0 µm and 1.55 µm. A high-performance photodiode has such a sensitivity curve. Apparently, it seems convenient to use a wide-range photodiode which can sense both 1.3 µm light and 1.55 µm light in the multiwavelength communication system employing 1.3 µm and 1.55 µm. The selection of the wide-range photodiode, however, incurs a serious problem.

The other problem is the existence of WDMs (wavelength division multiplexers) in the ONU terminals and the broadcasting station. The conventional ONU terminals require WDMs for separating spatially the light waves of different wavelengths. The conventional WDMs of optical fiber type, waveguide type or dielectric mirror type, can deal with only two different wavelengths. No current WDM can separate the light waves of more than two wavelengths. These WDMs introduce one wavelength into an optical path and the other wavelength into another path by transcribing the difference of the wavelengths to the difference of the phase constants $\beta$, and separating one wavelength from the other wavelength spatially. Thus, the WDMs allocate two different wavelength waves in a rate of 1:1. The conventional WDMs cannot separate three different wavelengths. Namely, the system based on the WDMs is incapable of treating with the multiwavelength containing more than two wavelengths.

WDMs suffer from another defect of imperfection of spatial separation. Two outputs are now denoted by the output 1 and the output 2. The power ratios are e.g., $\lambda1:\lambda2=\epsilon:1$ at the output 1 and $\lambda1:\lambda2=1:\epsilon$ at the output 2 in actual cases. Here "$\epsilon$" is called an extinction ratio. In an ideal case, $\epsilon$=0 of course. However, the minimum of $\epsilon$ is still about 1/100 in the present WDMs. The extinction ratio must be smaller than 1/10000 for separating two wavelengths without cross-talk. To compensate the deficiency of the current WDMs, dielectric multilayer films are sometimes used further to decrease the extinction rate $\epsilon$. Multiwavelength PD modules without a WDM have been suggested for avoiding the difficulty of the definite $\epsilon$.

①Japanese Patent Laying Open No.6-45635(No.45635/'94) proposed a PD module having two PDs on the same chip which have sensitivity for both two different wavelengths $\lambda1$ and $\lambda2$, two filters which admit one of $\lambda1$ and $\lambda2$ to penetrate. The device has a parallel arrangement of PDs. The existence of two parallel PDs dispenses with WDMs.

However, the extinction ratio of the wavelength filter is still not satisfactory yet. Such a parallel selective PD device cannot entirely separate and sense the light waves of two different wavelengths. The device has a more serious drawback that the input power is too weak, since the power is divided into three or two parts. Such a weak input power reduces the sensitivity. A horizontal type photodiode (waveguide type) which senses only the light with a certain wavelength has also been proposed. The photodiode has been investigated and produced tentatively for detecting the light of one wavelength which is separated by a WDM.

②MASATO SHISHIKURA, SHIGEHISA TANAKA, HIROSHI MATSUDA, HITOSHI NAKAMURA, TAKAO MIYAZAKI & SHINJI TSUJI,"A wide tolerance waveguide type PIN photodiode", ELECTRONICS INFORMATION COMMUNICATION SOCIETY 1995, C-386, p386 (1995) This report proposed a waveguide-type photodiode which senses only 1.3 μm light, when the light including 1.3 μm and 1.55 μm is introduced into a waveguide. The report wrote that the ratio of the sensitivity of 1.3 μm to 1.55 μm is 23dB (200 times). This photodiode has been developed as a photodiode for detecting only 1.3 μm, after 1.3 μm and 1.55 μm have been separated by a WDM. The photodiode demands a WDM of course. A large reflection loss at the end reduces the quantum efficiency of the photodiode to about 36%.

THE PROBLEMS TO BE SOLVED

A prior LD/PD module consists of three important parts; a WDM, a laser and a photodiode. The large number of the parts raises the cost of the module. This is a large drawback as a LD/PD module for the bidirectional optical communication system. Another weak point is a large power loss at the joints of optical fibers and WDMs. Thus, the conventional LD/PD modules cannot be used in a long range communication system for the reasons. The prior LD/PD modules have been applied only to a short range communication system.

One purpose of the present invention is to provide a LD/PD module which is built with a smaller number of parts. Another purpose of the present invention is to provide a smaller size LD/PD module produced at a lower cost. Another purpose of the present invention is to provide a LD/PD module with a lower loss of light. Another object of the present invention is to provide a LD/PD module feasible to a long range optical communication. Another purpose of the present invention is facilitating the pervasion of optical subscriber network by proposing LD/PD modules of low cost and low loss. The further purpose of the present invention is to provide a LD/PD module suitable to multi-wavelength bidirectional optical communication adopting more than two different wavelengths.

SUMMARY OF THE INVENTION

The Inventors have considered the reason why prior LD/PD modules are expensive and bulky. Prior modules intended to separate the light beams of different wavelengths spatially without exception. The prior LD/PD modules became large, bulky devices because of the spatial separation of the beams. Besides, the spatial separation of different wavelengths is still not perfect. The defective separation of wavelengths brought about a large loss. The spatial separation is equivalent to the wavelength separation in all the prior devices. If the spatial separation is imperfect, the wavelength separation becomes defective. The imperfection of the wavelength separation invites the problem of cross-talk. In the case of TV signals, flickers appear on the screen due to the fault of wavelength separation. An enhancement of the spatial separation requires more sophisticated, expensive WDMs, which increase the size and the cost of the module.

The Inventors thought of a new idea of receiving the light of different wavelengths through the same path without separating spatially the paths in contradiction to the prior ones. This invention does not divide the optical paths for different wavelengths but guides all the wavelengths in the same straight path and detects the different wavelengths at different spots on the same path. If such a "linear detection" is possible, the device would be immune from the problem of the spatial separation and the problem of the cross-talk due to the imperfection of the spatial separation. Is the linear detection truly possible?

Prior LD/PD modules have already utilized wide range photodiodes which sense all the wavelengths included in the signals. Namely, prior modules have adopted general-purpose photodiodes. This is an origin of the serious problems of the prior modules. Since the photodiodes have sensitivity to all the light waves included in the signals, WDMs or dielectric multilayers were indispensable for separating spatially the signals by wavelengths. The prior modules separated the different wavelengths, guided the light of the different wavelengths into different paths having a general-use PD at the end and detected the power of the light of the respective wavelengths by the common-use end PDs.

The present invention does not employ such wide range sensitive general-purpose photodiodes but adopts narrow range sensitive photodiodes which are novel enough themselves. Namely, the present invention uses a special-use, narrow range sensitive photodiode Dj which can sense only λj. Expensive WDMs are excluded from the present invention. The same function as WDMs is carried out by a set of the narrow range sensitive photodiodes. Thus, the module of the invention dispenses with WDMs. The present invention is based upon the profound consideration over the physics of the semiconductors of photodiodes. The inventors thought of a method of making a photodiode which can sense only a single wavelength.

The dependence of sensitivity upon the wavelength has been explained by referring to FIG. 9. The sensitivity dependence on the wavelength is important for the teaching of the present invention. FIG. 29 shows the relation between the energy of the incident light and the band structure of semiconductor in a photodiode. "Ec" denotes the energy of the bottom of the conduction band. "Ev" indicates the energy of the top of the valence band. The difference is the band gap Eg of the semiconductor. Eg=Ec−Ev. The intermediate part between the conduction band and the valence band is called a forbidden band (forbidden gap). There is no electron level in the forbidden band (forbidden gap), if the semiconductor includes no impurity. A little electrons exist in the conduction band. The valence band is nearly filled with electrons. The deficiencies of electrons in the valence band is named holes. At 0K, the electron concentration is 0 in the conduction band and the hole concentration is 0 in the valence band. If the forbidden band (forbidden gap) has no impurity level, the Fermi level is just at the middle in the forbidden band (forbidden gap). Electrons are excited in the conduction band and holes are excited in the valence band by heat at a definite temperature.

When light enters semiconductor, a photon (quantum of light) raises an electron of the valence band up to the conduction band. The phenomenon is named an excitation of a pair of an electron and a hole. The phenomenon occurs only when the light energy is higher than the band gap Eg (hv≧Eg). If the semiconductor has an enough thickness, all the light having an energy higher than Eg is absorbed by the semiconductor. With regard to the wavelength λ, λg(=hc/Eg), the semiconductor absorbs all the light of the wavelength shorter than the edge wavelength λg (λ<λg). On the contrary, when the light of an energy lower than Eg attains a semiconductor, the excitation energy is insufficient, as demonstrated by arrow b or arrow c. Since there is no level in the forbidden band (forbidden gap), such transition of arrow b or arrow c never takes place. Thus, the light (hv<Eg) passed the semiconductor without loss. The semiconductor is transparent for the light of hv<Eg (or λ<λg).

The above is an explanation of the electron transition in the case of an intrinsic semiconductor having no level in the forbidden band (forbidden gap). An n-type semiconductor makes shallow donor levels En and a p-type semiconductor makes shallow acceptor levels Ep in the forbidden band (forbidden gap). FIG. 30 shows the impurity levels in an n-type semiconductor or in a p-type semiconductor. Due to the existence of the impurity levels, the limit for permitting the transition is lowered from Eg to (Eg−En) or (Eg−Ep). The shallow levels En or Eg are about one hundredth to one tenth. Thus, the same matter occurs also in n-type semiconductors or p-type semiconductors except replacing Eg by (Eg−En) or (Eg−Ep). Such an impurity which makes a deep level Es is not doped for controlling the conduction property. A good epitaxial layer has no deep impurity level. The actual values of (Eg−En) or (Eg−Ep) are nearly equal to Eg.

In any case, the photons of energy higher than the band gap Eg (E≦Eg:λ≧λg) are absorbed. The photons of an energy lower than Eg (E<Eg:λ>λg) pass the semiconductor. Namely, a semiconductor has an intrinsic wavelength selectivity. However, there is no device which has utilized a semiconductor as a wavelength selector. The present invention takes advantage of the wavelength selectivity of semiconductors. This invention proposes a new device which makes the best use of the wavelength selectivity of semiconductors.

A photodiode can be regarded as a set of an absorption layer (Egz) and a window layer (Egw) (Egz<Egw). The light of energy lower than Egw passes the window layer. The light of energy higher than Egz is absorbed by the absorption layer (light receiving layer). The other light of energy lower than Egz penetrates through the absorption layer but absorbed and annihilated by the n-electrode (61) in FIG. 8. Namely, the incident light can be classified into three different types by the energy.

(1) E≧Egw: The window layer fully absorbs and annihilates the light. Insignificant light.

(2) Egw>E≧Egz: The light receiving (absorption) layer absorbs the light and generates a photocurrent. Effective light.

(3) Egz>E: The receiving layer is insensitive. Insignificant light.

Neither the light (1) with excess high energy nor the light (3) with excess low energy can be sensed by the photodiode. The photodiode can detect only the light with a intermediate range of energy and can convert the light into a photocurrent.

What determines the lower limit P of sensitivity is the band gap Egw of the window layer. What defines the upper limit R is the band gap Egz of the light receiving (absorbing) layer. In any PD, Egz<Egw. The photodiode senses all the light of a wavelength between Egz and Egw. If the difference (Egw−Egz) is reduced to an enough small value, the photodiode senses only the light of a narrow range Em of energy, where Egz<Em<Egw. Thus, a narrow range sensitive photodiode can be built by selecting the materials of the window layer and the absorption layer for nearly equalizing Egz up to Egw.

The same matter is explained again by the term of wavelength. "λw" is the edge wavelength of the window layer (Egw=hc/λw). "λz" denotes the edge wavelength of the absorption layer (Egz=hc/λz). The photodiode can detect only the light of λm which satisfies the inequality λw<λm<λz. When the difference (Egz−Egw) is decreased to a small value, the photodiode becomes a narrow range sensitive, specialized photodiode. A photodiode is now specified by the edge wavelength λw of a window layer and the edge wavelength λz of an absorption layer. A photodiode is written as D(λw, λz). The symbol D(λw, λz) means that the photodiode has sensitivity only for λof λw<λ<λz.

If a packet of light waves includes n different wavelengths λ1,λ2,λ3, . . . and λn(λ1<λ2 <λ3< . . . <λn), a set of narrow-range sensitive photodiodes D1(λw1,λz1), D2(λw2, λz2), D3(λw3,λz3), . . . and Dn(λwn,λzn) can be designed for detecting only the counterpart wavelength λ1, λ2, λ3, . . . or λn respectively by determining the materials of the window layers and the receiving layers as follows.

$$D1(\lambda w1, \lambda z1): \lambda w1 < \lambda 1 < \lambda z1 < \lambda 2. \tag{1}$$

$$D2(\lambda w2, \lambda z2): \lambda 1 < \lambda w2 < \lambda 2 < \lambda z2 < \lambda 3. \tag{2}$$

$$D3(\lambda w3, \lambda z3): \lambda 2 < \lambda w3 < \lambda 3 < \lambda z3 < \lambda 4. \tag{3}$$

$$Dj(\lambda wj, \lambda zj): \lambda j-1 < \lambda wj < \lambda j < \lambda zj < \lambda j+1. \tag{4}$$

$$Dn(\lambda wn, \lambda zn): \lambda n-1 < \lambda wn < \lambda n < \lambda zn. \tag{5}$$

where number j denotes a general term (j=1, 2, 3, . . . , n).

In Eq.(4), the inequality λwi<λj<λzj is the requirement for sensing the λj light by photodiode Dj. Attention should be paid to the inequalities on both sides. λj−1<λwj and λzj<λj+1 signify that Di is fully insensitive to the neighboring the λj−1 light or the λj+1 light. Namely, photodiode Dj is defined by a positive condition of sensing λj and a negative condition of being insensitive to the neighboring λj−1 and λj+1 light. Namely, the sensitivity curves of the neighboring photodiodes do not overlap. Further, n photodiodes do not overlap in the sensitivity curves. In other word, the sensitivity curves are all independent and isolated from each other. Such a narrow-range photodiode Dj can be called an eigen-wavelength photodiode. Eigen-wavelength photodiodes play an important role in the present invention.

There is another important new condition for the present invention. This has caused no problem in prior photodiodes which annihilate or block the light of wavelengths longer than λz by the bottom n-electrode (61). If an communication system constructs a fiber network of transmitting optical signals including a plurality of wavelengths through an optical fiber, the light travelling in a fiber contains many signals carried by the wavelengths higher than λz in addition to the signal which has been sensed by the current PD. Annihilating many signals at the bottom electrode (61) is a waste of light power and optical signals. The prior PDs are too incompetent for such a communication system. The system demands an improvement also of photodiodes.

This invention proposes a novel photodiode which permits the light of wavelengths higher than λz to pass through the bottom without being blocked. Such a photodiode can be produced by replacing the conventional overall bottom electrode (61) by a ring electrode, coating the revealed substrate bottom with a transparent rotection film. When light enters the improved photodiode, a part of the light is sensed and converted into a photocurrent but the rest of the light with longer wavelengths than $\lambda z$ goes out from the bottom of the photodiode. Such a photodiode may be named a "transmission type" photodiode. Adoption of the transmission type photodiodes is the other feature of the present invention. One condition was the "eigen-wavelength" character of photodiodes. The other condition is the "transmission" type of photodiodes. Therefore, the photodiode this invention utilizes is an eigen-wavelength, transmission type photodiode. The feature of the photodiode of the invention is then expressed by an eigen-wavelength, transmission type photodiode. On the contrary, the conventional PD may be called a common-wavelength, blocking type photodiode.

This invention builds a novel, linear LD/PD module for multiwavelength optical fiber communication by aligning a plurality of eigen-wavelength, transmission type photodiodes in series in the order of increasing eigen wavelengths. Since the whole photodiodes align along a straight line, the same light passes the series of the photodiodes one by one. Each of the wavelengths is detected and fully absorbed by the eigen PD. All the wavelengths are detected by the set of photodiodes arranged on a direct line. All the prior multiwavelength modules intended to separate wavelengths spatially by WDMs. The prior modules are called a parallel detection type. The present invention may be called a serial detection type module in contrast to the prior ones. Then the modules of the invention are called "linear modules".

Since the subject matter of the invention is complex enough, the invention is now exactly explained with the help of mathematical expressions. The group of the photodiodes requires a special algebra. The signal light is denoted by "S". The signal S including n wavelengths $\lambda 1$, $\lambda 2$, $\lambda 3$, $\lambda n$ is written as $S(n:\lambda 1,\lambda 2,\lambda 3, \ldots ,\lambda n)$. The wavelengths are arranged in the increasing order ($\lambda 1 < \lambda 2 < \lambda 3 < \ldots < \lambda n$).

A photocurrent is denoted by I. If the photocurrent I includes m wavelengths $\lambda 1$, $\lambda 2$, $\lambda 3$, ..., $\lambda m$ ($\lambda 1 < \lambda 2 < \lambda 3 < \ldots < \lambda m$), the photocurrent is indicated by I ($m:\lambda 1$, $\lambda 2$, $\lambda 3$, ..., $\lambda m$). If a mixture of a plurality of wavelengths is converted into a photocurrent I at the same device, cross-talk occurs. This invention succeeds in avoiding an occurrence of cross-talk which is caused by a mixture of more than one wavelength in a photocurrent by allocating a wavelength to an eigen photodiode. Every photodiode senses only one wavelength in the signals. The j-th PD originates only a simple photocurrent $I(1:\lambda j)$ in the present invention.

Light is introduced via the top surface into a photodiode. The light is an input for the PD. A part of the light is absorbed and converted into a photocurrent in the PD. The photocurrent is an output. The rest goes out from the bottom of the PD. This is also another output. Namely, the photodiode plays the role of receiving an input optical signal S and making outputs of S+I. Or the PD can be deemed an operator of converting an input S into output S+I.

An output of the PD is given by (input)×(PD operator) in the photodiode algebra. Unlike ordinary mathematics, an operator acts upon the value on the left side for facilitating to compare the equations with the drawings in the algebra. The operation of a photodiode is described by an equation (input)(PD operator)=(output) by omitting the multiplying symbols ×. "D" is the operator of a photodiode. SD=S+I indicates the fundamental function of a photodiode. The first problem is what expression the algebra gives to the prior PD. [For prior PDs] The prior wide-range, common wavelength type PD will give an expression for the light signals including a plurality of wavelengths.

$$S(n:\lambda 1,\lambda 2,\lambda 3, \ldots ,\lambda n)D(\text{prior})=I(n:\lambda 1,\lambda 2,\lambda 3, \ldots ,\lambda n). \quad (6)$$

This equation signifies two facts. One is that the prior PD makes a photocurrent as a sum of elementary photocurrents of all the wavelengths, if signal light including n different wavelengths is input into the PD. Namely, no partial photocurrent can be deduced from the photocurrent. The other is that there is no output light emitted from the prior PD. [For present invention] This invention uses the eigen wavelength, transmission type photodiodes aligned in series. The j-th PD senses only the j-th wavelength $\lambda j$, absorbs all the light of (j−1) wavelengths shorter than $\lambda j$ and permits the rest of (n−j) wavelengths longer than $\lambda j$ to pass through. The rest can be an input for the next (j+1)-th photodiode. Dj is an operator for the j-th PD. But the j-th PD is sometimes represented by Dj hereinafter for brevity. The function of the j-th PD can be represented by the equation;

$$S(n:\lambda 1,\lambda 2,\lambda 3, \ldots ,\lambda n)Dj(\lambda wj,\lambda zj)=I(1:\lambda j)+S(n-j:\lambda j+1,\lambda j+2, \ldots ,\lambda n). \quad (7)$$

This is the fundamental equation clarifying the property of the novel photodiode. $Dj(\lambda wj,\lambda zj)$ is the operator of the j-th PD. $S(n:\lambda 1,\lambda 2,\lambda 3, \ldots ,\lambda n)$ means that the light including n different wavelengths is introduced into the j-th PD. $I(1:\lambda j)$ is a photocurrent of the j-th wavelength produced by the j-th PD. $S(n-j:\lambda j+1,\lambda j+2, \ldots ,\lambda n)$ indicates that (n−j) wavelengths higher than $\lambda j$ go out of the j-th PD without being absorbed. Since (n−j) wavelengths appear out from the bottom of the j-th PD, another k-th PD can be placed on the beam line. Then, the k-th PD follows the i-th PD. If j>k, it is insignificant, because the k-th PD cannot detect $\lambda k$. If j<k≤n, the k-th PD senses the $\lambda k$ and allows the rest wavelengths from the (k+1)-th one to the n-th one to go out. Thus, the two PDs aligned in series are expressed by equations;

$$S(n:\lambda 1,\lambda 2,\lambda 3, \ldots ,\lambda n)Dj(\lambda wj,\lambda zj)Dk(\lambda wk,\lambda zk)=I(1:\lambda j)(k<j\leq n). \quad (8)$$

$$S(n:\lambda 1,\lambda 2,\lambda 3, \ldots ,\lambda n)Dj(\lambda wj,\lambda zj)Dk(\lambda wk,\lambda zk)=I(1:\lambda j)+I(1:\lambda k)+S(n-k:\lambda k+1,\lambda k+2, \ldots ,\lambda n) \; (j<k\leq n). \quad (9)$$

The disposition aligning more than two PDs in series is called a "series conjunction" or a "linear conjunction". Eq.(8) is meaningless. Eq.(9) is important. Eq.(9) says that if two photodiodes Dj and Dk with a relation of j<k are aligned in this order, the conjunction can sense individually $\lambda j$ and $\lambda k$ and can give an optical output comprising $\lambda k+1$, $\lambda K+2$, ..., $\lambda n$ from the bottom of Dk. The difference between Eq.(8) and Eq.(9) means that the operators Dk and Dj are not commutative. Eq.(9) teaches us that if plural PDs are joined in series in the order of wavelengths, respective wavelengths can be independently sensed by the PDs in charge.

In the long run, the best module can be produced by aligning photodiodes D1, D2, D3, ... Dn in series in the order of increasing wavelengths ($\lambda 1 < \lambda 2 < \lambda 3 < \ldots < \lambda n$). The best mode which is capable of sensing all the wavelengths independently is described by the equation, $$S(n:\lambda 1,\lambda 2,\lambda 3, \ldots ,\lambda n)D1(\lambda w1,\lambda z1)D2(\lambda w2,\lambda z2) \ldots Dn(\lambda wn,\lambda zn)=I(1:\lambda 1)+I(1:\lambda 2)+ \ldots +I(1:\lambda n). \quad (10)$$

The output includes all the photocurrents of the signals carried by the different wavelengths independently.

Eq.(10) says that when photodiodes are joined in series in the order of enhancing the wavelengths, all the photodiodes can sense their eigen wavelengths independently. The fundamental idea of the invention is expressed by a simplified formula, $$S(1,2,\ldots,n)D1D2D3\ldots Dn=I1+I2+I3+\ldots+In. \tag{11}$$

Here $S(1,2,\ldots,n)$ is a simplification of $S(n:\lambda1,\lambda2,\lambda3,\ldots,n)$. D1 is a simplified operator of $D1(\lambda w1,\lambda z1)$. I1 is an abbreviation of $I(1:\lambda1)$. As told before, two operators Dj and Dk are incommutative. The fundamental equation can be further simplified into $$S \prod_{j=1}^{n} D_j = \sum_{j=1}^{n} I_j. \tag{12}$$

where $$\prod_{j=1}^{n} D_j$$

means a product of a set of $\{Dj\}$ from $j=1$ to $j=n$ and $$\sum_{j=1}^{n} I_j$$

means a sum of a set of $\{Ij\}$ from $j=1$ to $j=n$.

FIG. 31 demonstrates the linear conjunction of plural photodiodes expressed by Eq.(11) or Eq.(12). In FIG. 31, the eigen-wavelength, transmission type photodiodes are arranged in a linear conjunction in the order of D1, D2, D3, . . . and Dn. When signals S including the wavelengths $\lambda1, \lambda2, \lambda3, \lambda4, \ldots \lambda n$ is introduced in the series conjunction of photodiodes, D1 detects only $\lambda1$, D2 senses only $\lambda2$, D3 feels only $\lambda3$, and Dn senses only $\lambda n$. In FIG. 31, horizontal arrows $\lambda1, \lambda2, \lambda3, \ldots, \lambda j, \ldots, \lambda n$ show the distance at which the wavelengths arrive. The upward arrows indicate the photocurrents of $\lambda1, \lambda2, \lambda j, \ldots, \lambda n$ converted by photodiodes D1, D2, . . . Dj, . . . and Dn. A straight light path is formed through a series of photodiodes and the wave of a longer wavelength goes further in the linear conjunction of PDs. The above is an improvement of a set of photodiode modules. This invention succeeds in obtaining many profits by linearizing the optical path. In comparison with the prior multiwavelength PD module based upon a parallel disposition of photodiodes, this invention has following advantages.

① The module dispenses with WDMs, because the module need not separate an input path into plural parallel paths. Furthermore, the module can omit couplers for the same reason. Omission of expensive WDMs and couplers brings about a large profit to the invention by reducing the cost of production.

② The number of junctions of fibers is greatly reduced, since the optical paths are integrated into a longitudinal single path. Further, the linear conjunction is accomplished only by aligning the photodiodes in series in the order of raising the eigen wavelengths. The junction needs neither optical fibers nor optical connectors. The reduction of the number of parts alleviates the cost of the module.

③ The cross-talk is suppressed effectively. Prior parallel separation type modules suffered from cross-talk owing to the insufficient extinction ratio of WDMs. This invention, however, has solved the problem of a poor extinction ratio, because this invention is immune from the spatial separation by WDMs.

④ The number of joints of fibers is decreased, which reduces the number of splicing fibers. The reduction of joints decreases the junction loss.

⑤ The freedom of assembling photodiodes is high, since independent, narrow-range sensitive, transmission type photodiodes are utilized. The set of photodiodes is freely selected in accordance with the change of the wavelengths of the signals. If a communication system uses k different wavelengths among n wavelengths of $\lambda1, \lambda2, \lambda3, \ldots, \lambda j, \ldots, \lambda n$, the system can be built by choosing only k eigen-wavelength photodiodes. The 1:1 correspondence of wavelength to photodiode gives the system high flexibility.

The above is an improvement of a PD module having a series conjunction of plural photodiodes. Since photodiodes are passive devices, linearly jointed photodiodes can deduce their eigen wavelengths without interference. The thought of the present invention is not solely restricted within an improvement of an assembly of photodiodes. This invention can be extended to an improvement of a module including a light emitting device. Namely, this invention is capable of applying to a PD/LD module. The light emitting device means a light emitting diode or a laser diode. The wavelength $\lambda q$ of emanating light is determined by the band gap Eg of the emanating layer.

A PD/LD module of the present invention is built by adding a light emitting device at an end of a series of photodiodes. Namely, the PD/LD module consists of a linearly joined (n−1) photodiodes and an n-th light emitting device Ln. Here the emanating wavelength $\lambda q=\lambda n$ of the final laser is longer than the eigen wavelength $\lambda n-1$ of the neighboring photodiode Dn−1. The module has a linear junction of $SD1D2D3Dn-1Ln$. Since the emission wavelength $\lambda n$ of the final light emitted device Ln is longer than the longest one among the eigen wavelengths of the photodiodes D1 to Dn−1, the light emanating from the end light emitting device can progress through all the preceding photodiodes without loss. The direction of the light from the end light emitting device is inverse to the signal light. FIG. 33 demonstrates the structure of the PD/LD module of this invention. Initially, the signal S includes (n−1) wavelengths $\lambda1, \lambda2, \lambda3, \ldots, \lambda(n-1)$ which are all absorbed by the preceding (n−1) photodiodes. Thus, the final light emitting device is not affected by the input signals.

In the case of a laser diode, the PD/LD module has a single laser diode at the end of the series of PDs. The linear module forbids more than one laser to follow the series of photodiodes. The reason is an occurrence of interference between two lasers. If two lasers were allotted at the j-th seat and the n-th seat, the $\lambda j$ would reach the final laser Ln, because $\lambda j<\lambda n$. The $\lambda j$ would perturb the end laser Ln.

The former laser Lj would disturb the final laser Ln by the backward emitted light. Lj would modulate Ln and distort the signal of Ln. For the reason, more than one laser cannot be aligned following a series of photodiodes without special contrivance. Accordingly, the PD/LD module of the teaching of the present invention includes only a single laser at the final seat. The linear PD/LD module can simply be expressed by D1D2 . . . Dn−1Ln. The function of the PD/LD module is formulated by the equations;

$$S(n:\lambda1,\lambda2,\lambda3,\ldots,\lambda n-1)D1(\lambda w1,\lambda z1)D2(\lambda w2,\lambda z2)\ldots$$
$$Dn-1(\lambda wn-1,\lambda zn-1)Ln(\lambda wn,\lambda zn)=I(1:\lambda1)+I(1:\lambda2)+\ldots$$
$$+I(1:\lambda n-1). \tag{13}$$

$$S(1:\lambda n)Ln(\lambda wn,\lambda zn)Dn-1(\lambda wn-1,\lambda zn-1)\ldots D1(\lambda w1,\lambda z1)=$$
$$S(1:\lambda n). \tag{14}$$

Eq.(13) means that if (n−1) photodiodes having eigen wavelengths $\lambda1, \lambda2, \lambda3, \ldots, \lambda n-1$ are positioned in the order of rising wavelengths and a laser of $\lambda n$ is connected at the end, all the (n−1) photodiodes can detect the light of the own wavelength independently. Eq.(14) signifies that the light emanated from the end laser passes all the photodiodes in series and travels in a fiber in the inverse direction as a signal. The idea of this invention is expressed by the following abbreviated equations;

$$S(1,2,3,\ldots,n-1)D1D2D3\ldots Dn-1Ln=I1+I2+I3+\ldots+In-1.(15)$$

$$S(n)LnDn-1\ldots D1=S(n). \quad (16)$$

This is valid only for a PD/LD module which includes a laser as a light emitting device. In the case of a light emitting diode (LED), the restriction is reduced, since an LED is not affected by another LED unlike laser diodes. A PD/LED module allows more than one LEDs to follow the series of photodiodes. A PD/LED module of D1D2 . . . DkLk+1Lk+2 . . . Ln can be built by joining linearly k photodiodes D1D2 . . . Dk and further positioning (n–k) LEDs Lk+1Lk+2 . . . Ln in series.

The PD/LED module including plural LEDs is explained by FIG. 32. The signals to be received are brought to the right by the $\lambda 1, \lambda 2, \lambda 3, \ldots, \lambda k$. The signals to be transmitted are carried to the left by the $\lambda k+1, \ldots, \lambda n$. All the rightward light is absorbed by the series of photodiodes and does not arrive at any one of the LEDs. The leftward light passes through the PDs since the wavelengths are longer than the band gap of the absorbing layers. The function can be expressed by $$S(k:\lambda 1,\lambda 2,\lambda 3,\ldots,\lambda k)D1(\lambda w1,\lambda z1)\ldots Dk(\lambda wk,\lambda zk)Lk+1(\lambda wk+1, \lambda zk+1)\ldots Ln(\lambda wn,\lambda zn)=I(1:\lambda 1)+I(1:\lambda 2)+\ldots+I(1:\lambda K). \quad (17)$$

$$S(n-k:\lambda k+1,\ldots,\lambda n)Dk(\lambda wk,\lambda zk)D1(\lambda w1,\lambda z1)+S(n-k-1:\lambda k+2,\ldots \lambda n)Lk+1(\lambda wk+1,\lambda zk+1)Dk(\lambda wk,\lambda zk)\ldots D1(\lambda w1,\lambda z1)+S(n-k-2:\lambda k+3,\ldots,\lambda n)Lk+2(\lambda wk+2,\lambda zk+2)Lk+1(\lambda wk+1,\lambda zk+1)Dk(\lambda wk,\lambda zk)\ldots D1(\lambda w1,\lambda z1)+\ldots+S(1:\lambda n)Ln(\lambda wn,\lambda zn)\ldots Lk+1(\lambda wk+1,\lambda zk+1)Dk(\lambda wk,\lambda zk)\ldots D1(\lambda w1,\lambda z1)=S(n-k:\lambda k+1,\ldots,\lambda n). \quad (18)$$

Eq.(18) which is rather difficult to understand means that the light emitted by every LED becomes a set of leftward transmitting signals.

This invention has three typical modes of application, as explained hereto, ① a plurality of photodiodes, ② a plurality of photodiodes and a single light emitting device and ③ a plurality of photodiodes and a plurality of light emitting devices. In any cases, the devices of $\lambda 1, \lambda 2, \lambda 3, \ldots,$ and $\lambda n$ should be aligned in the order of raising the wavelengths $\lambda 1 < \lambda 2 < \lambda 3 < \ldots < \lambda n$ in series. The photodiodes should be allotted with shorter wavelengths than the light emitting devices. Namely, the modes are briefly expressed by the series;

mode ① of photodiodes alone; D1D2D3 . . . Dn. (19)

mode ② of photodiodes and a light emitting device; D1D2 . . . Dn–1Ln. (20)

mode ③ of photodiodes and light emitting devices; D1D2 . . . DkLk+1 . . . Ln. (21)

Modes ② and ③, in particular, are quite novel as embodiments of the present invention. Since mode ① is the most suitable to understand the regularity of the arrangement of devices, mode ① has been explained in the first place.

There is another problem. It is a problem of the substrate. The explanation has simplified a photodiode as an assembly of a window layer for filtering light and an absorption layer for sensing the power of the light. Namely, the description has been based on simplification of PD=window layer+absorption layer. The window layer is regarded as a filter for eliminating the low wavelength light ($\lambda < \lambda j$). The absorption layer fully absorbs the $\lambda j$ light and prohibits the lower wavelength light $\lambda \leq \lambda j$ from going out. But the rest of the light higher wavelength ($\lambda j < \lambda$) penetrates out of the absorption layer. A photodiode plays two roles of a detector and a filter. Since the filter admits the wave with lower frequency, it may be called a "low-pass filter" in the term of electronics.

A photodiode, however, has a substrate and a buffer layer, as shown in FIG. 8. An absorption layer and a window layer are epitaxially grown on the substrate and the buffer layer in a photodiode. Since light penetrates through the photodiode from the top surface to the bottom surface, another problem is caused from the transmission and absorption property of the buffer layer and the substrate. This is a newly-appearing problem in the new photodiode through which light pierces. The substrate must be made from a material which admits all the light of the wavelengths $\lambda$ longer than $\lambda j$ sensed by the photodiode Dj.

The material has not been chosen by the condition of being transparent to the light. The substrate material is chosen by the requirement of growing a plenty of large single crystals by Czochralski method or Bridgman method. Accordingly, there are a small number of materials capable of being a substrate material. Only InP, GaAs, Si, Ge, CdTe and Gap are deserving to be substrate wafers. Three-component mixture crystals or four-component mixture crystals are impotent to be wafers, because the current technology cannot grow large single crystals of three-component or four-component crystals.

In addition to the poor kinds of materials for substrates, there is another condition of lattice-fitting for restricting the scope of selecting the material of a substrate. If the lattice constant of the epitaxial layers were not equal to the lattice constant of the substrate, the film property of the epitaxial layer became bad. Even three-component or four-component epitaxial layers cannot often make an epitaxial layer fitting to the substrate. For the reasons, the difficult condition imposed upon the substrate impedes the realization of the photodiode module for multiwavelength optical communication.

The band gap of InP is 1.35 eV, the band gap of GaAs is 1.4 eV and the band gap Si is 1.2 eV. Ge has a band gap of 0.67 eV. GaP has a band gap of 2.26 eV. Among these materials for substrates, what is used frequently as a substrate in three-compone nt or four-component materials is InP and GaAs. The band gap of InP is 1.35 eV. The corresponding wavelength is 0.92 μm. If all the wavelengths ($\lambda 1 < \lambda 2 < \lambda 3 < \ldots < \lambda n$) used in the multiwavelength optical network are longer than 0.92 μm, all these wavelengths can penetrate through the InP substrate. Since $\lambda 1$ is the shortest, the requirement is simply given by an inequality of $\lambda 1 > 0.92$ μm. If the set of wavelengths satisfies the requirement, all the signals can pass the InP substrate. The condition of $\lambda > 0.92$ μm can be contented by the wavelengths used in the current optical communication. The wavelengths are at present restricted by the wavelength-dependence of transparency of the quartz fiber. The bands are e.g., 1.3 μm and 1.55 μm which are immune from absorption of InP which is used as the material of the substrates of PDs.

Even if the substrate allows the all signals to pass, if the epitaxial layers could not have a band gap smaller than the band gap of the substrate, this invention would be inoperative. Fortunately, InP suffices the condition. All the four-component mixture crystals which satisfy the requirement of the lattice-fitting with InP have a bad gap smaller than the band gap of InP.

GaAs substrates allow four-component mixture crystals to form thin films on the substrate epitaxially. However, the four-component mixture crystals have all and gaps larger than the band gap of the substrate. Thus, GaAs cannot realize this invention. This invention do not adopt GaAs as a material of the substrate crystal. Namely, only InP can be utilized as a common material of the substrates for the photodetectors of the present invention. This is a convenient property. The technology of growing InGaAs three-component crystal films or InGaAsP four-component crystal films on an InP substrate has already ripened. The four-component mixture crystals are more convenient because they have an extra parameter of mixture ratios. A four-component mixture crystal has two parameters of the ratios. One freedom, however, is canceled by the lattice-fitting condition (for example; Vegard law). Thus, one freedom remains in the four-component crystals. A mixture crystal including In, Ga, As and P can be expressed by "$In_xGa_{1-x}As_yP_{1-y}$", where x and y are ratio parameters. The parameters x and y of the four-component material are uniquely determined by the lattice-fitting condition and the desired bad gap Eg.

If three-component films or four-component films are grown on an InP substrate with the lattice-fitting, all the films have the band gaps smaller than the band gap of InP. All the wavelengths $\lambda 1 < \lambda 2 < \lambda 3 < \ldots < \lambda n$ used in the optical communication satisfy the restrictions $\lambda wj < \lambda j < \lambda zj$, where $\lambda wj$ is the eigen wavelength of the window layer of the j-th photodiode, $\lambda zj$ is the eigen wavelength of the absorption layer of the j-th photodiode and $\lambda j$ is the wavelength of the j-th signal which should be sensed by the j-th photodiode. $\lambda wj$ and $\lambda zj$ are all longer than 0.92 μm which is the edge wavelength of the substrate of InP. Then, all the wavelengths $\lambda 1 < \lambda 2 < \lambda 3 < \ldots < \lambda n$ are longer than 0.92 μm. $\lambda s$ denotes the edge wavelength (0.92 μm) of the substrate InP. The relation is simply written by $$\lambda s < \lambda 1 < \lambda 2 < \lambda 3 < \ldots < \lambda n \quad (22)$$

All the light signals pass all the InP substrates of the diodes as a transparent material. Buffer layers are made by InP in the photodiodes. Thus, the signals can also penetrate without loss through the buffer layers. The substrates and the buffer layers are transparent to all the signal light. Therefore, a set of photodiodes according to the teaching of the present invention can be produced by choosing InP as a substrate material and selecting InGaAsP mixture crystals for the window layers and the absorption layers. Namely, the materials of the absorption layer and the window layer can be designed without taking the buffer layers and the substrates into consideration. However, this fact does not mean that this invention is restricted to InP substrates and InGaAsP films. This invention can be applied also to other substrate materials and other film materials as long as the band gap of the substrate is narrower than the band gap of the four-compound or three compound films.

For instance, anther application of the present invention is a photodiode having a CdTe substrate (Eg=1.5 eV) and $Hg_xCd_{1-x}Te$ films. All the values from 0 to 1 of x allow $Hg_xCd_{1-x}Te$ to pile on the CdTe substrate with lattice-fitting. Further, the band gap of $Hg_xCd_{1-x}Te$ is smaller than the Eg of the substrate CdTe for all x between 0 and 1. Besides the $Hg_xCd_{1-x}Te/CdTe$, the idea of the present invention can be also applied to a device having a ZnTe (Eg=2.3 eV) substrate and $Zn_xCd_{1-x}Se_yTe_{1-y}$ four component films, since all the mixture crystals $Zn_xCd_{1-x}Se_yTe_{1-y}$ satisfying the condition of lattice-fitting have band gaps lower than the band gap of the ZnTe substrate.

Then, case ② having (n−1) photodiodes and a light emitting device is explained. The function of the portion of the (n−1) photodiodes is quite similar to the case ①. The light emitting device in case ② emanates the $\lambda n$ light which depends upon the material of the emanating material. The series of wavelengths $\lambda 1 < \lambda 2 < \lambda 3 < \ldots < \lambda n-1$ of photodiodes and a wavelength $\lambda n$ of the light emitting device should satisfy an inequality of $\lambda 1 < \lambda 2 < \lambda 3 < \ldots < \lambda n$. Since the wavelength of the light emitting device is longer than any one of the eigen wavelengths of the photodiodes, the light from the light emitting device can pass through the photodiodes aligning in front of the light emitting device. The light is neither detected nor absorbed by the photodiodes. A laser diode has inherently a narrow emission spectrum. A laser emits essentially monochromatic light.

On the contrary, a photodiode has usually a wide range of sensitivity. The uniformity of sensitivity is also required for prior photodiodes. Asymmetry exists between a laser and a photodiode for the requirement of the range of wavelength inherently. The invention reduces the asymmetry between lasers and photodiodes by reducing the range of active wavelength of photodiodes. One of the important features of the present invention is to endow photodiodes with eigen wavelengths or with monochromatic property. A laser is inherently monochromatic. This invention intends to balance photodiodes with lasers by giving monochromaticity to photodiodes.

The $\lambda n-1$ light is completely absorbed by the (n−1)-th photodiode. The light received by the photodiodes does not disturb the oscillation of the laser diode. This is the explanation of the relation between the materials and the absorption spectrum. The situation is different for light emitting devices (lasers LDs or light emitting diodes LEDs).

This invention can be realized by another type of mode aligning light emitting devices at front positions and photodiodes at rear positions by changing the relation of wavenumber.

The band gap of the active layer determines the wavelength of the light emitted from a light emitting device. A light emitting diode (LED) emits light of a considerable wide range of wavelength in the vicinity of the band gap. A laser diode (LD) emits light of a narrow range of wavelength, since the range of the wavelength is restricted by the condition of stimulated emission and the condition of resonator. The spectrum becomes discrete one in the laser oscillation.

Unlike photodiodes, it is rare that light emitting devices are irradiated by light from another light source. If a light emitting device were irradiated by external light, the device would absorb the light of a wavelength shorter than the absorption edge of the laser. But the light of a wavelength longer than the absorption edge would pass the laser. The present invention attempts to shoot a laser by external light and to induce selective absorption and selective penetration by the laser medium. All the light of energy higher than the band gap of the active layer is completely absorbed. Otherwise the light lower than the band gap passes the laser medium.

$\lambda a$ denotes the absorption edge of a laser. $\lambda a=hc/Ega$, where Ega is a band gap of the active layer. If a communication system intended to adopt multiwavelength transmission using $\lambda 1$ and $\lambda 2$, it would be possible to assign the laser to absorb $\lambda 1$ but to allow $\lambda 2$ to pass by selecting the band gap Ega satisfying an inequality of $\lambda 1 \leq \lambda a < \lambda 2$. However, if the laser were considered as a medium of transmitting light, the active layer acts as a medium of transmission and a medium of emission. Thus, $\lambda 1 = \lambda a$. The consideration teaches us a possibility of producing an LD/PD module for multiwavelength transmission using $\lambda 1$ and $\lambda 2$ by placing a $\lambda 1$ LD at a first spot and a $\lambda 2$ PD at a second spot.

Such an idea led the Inventors to the present invention. The LD/PD module of this invention is constructed by disposing an LD for emitting $\lambda 1$ at a front point on the beam line and by disposing a PD for sensing λ2 at a back point on the same beam line for building the multiwavelength network based upon two wavelengths λ1 and λ2(λ1<λ2). In addition to the LD and the PD, it is possible to interpose a lens between the fiber and the laser. Furthermore, it is also allowable to interpose a monitoring PD between the λ1 laser and the λ2 photodiode. A version of the invention is a coupled module which can attach or detach the LD/PD module aligning the LD and PDs to a receptacle supporting an optical fiber.

BRIEF DESCRIPTION OF THE DRAWINGS

FIG. 6 is a sectional view of a prior laser module.

FIG. 19 is a sectional view of a first embodiment of the present invention which stores a photodiode, a laser and a monitoring photodiode in a metal package.

FIG. 20(a) shows a submount for the PD coated with metal films on both surfaces.

FIG. 20(b) denotes another submount partially coated with metal films on both surfaces.

FIG. 20(c) indicates a further submount with metallized surfaces and a hole.

FIG. 23 is a horizontally-sectioned view of a fourth embodiment of the present invention having a rectangular package containing a PD, a lens, an LD and a PD in series.

FIGS. 24A and 24B is a vertically-sectioned view of the same embodiment.

FIG. 41 is a horizontally-sectioned view of a sixth example of another LD/PD module containing a fiber, a lens, a λ1 laser, a λ1 PD and λ2 PD in series mounted on a submount in a box package.

FIGS. 42A and 42B is a vertically-sectioned view of the same example.

DETAILED DESCRIPTION OF PREFERRED EMBODIMENTS

EXAMPLE 1

Figure 10:
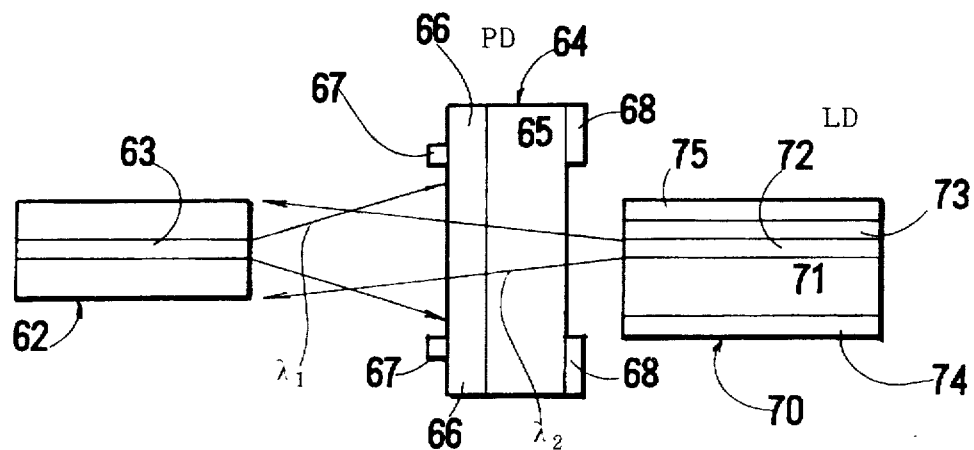
FIG. 10 is a schematic view of an example of an LD/PD module of the present invention which aligns a fiber, a wavelength-selective PD and a laser in series on a beam line.

FIG. 10 demonstrates an example of a PD/LD module having a photodiode and a laser diode. The photodiode detects the λ1 light. The laser diode emits the λ2 light (λ1<λ2). An optical fiber (62) consists of a core (63) with a higher refractive index and a cladding with a lower refractive index enclosing the core. The light emitted from the fiber diverges in a cone with a top angle determined by the refractive indexes of the core and the cladding. The signal light λ1 goes into the photodiode (64) and is detected by the photodiode (64). Since the light λ1 diverges from the fiber (62), the module adopts a photodiode with a wide aperture. The light receiving surface has a diameter from 100 μm to 200 μm. A receiving surface of wider than a 100 μm diameter can catch almost all the light emitted out of the fiber (62). The photodiode (64) is not a conventional one but a special photodiode which has been first proposed by the present invention. In the figure, the inner structure is simplified by depicting a substrate (65) and a reception layer (66). The substrate (65) includes the InP substrate and the InP buffer layer. The reception layer (66) contains the absorption layer and the window layer in the drawing. There is a ring p-electrode (67) on the periphery of the reception layer. An n-electrode (68) is formed on the periphery of the bottom of the substrate (65). The central part is not covered with the n-electrode (68). The central opening allows light to go out from the diode (64). In practice, all the entrance λ1 light has been absorbed by the reception layer (66) and does not attain the bottom opening.

The photodiode of the present invention is characterized by selecting the band gaps of the window layer and the absorption layer, forming an annular n-electrode on the bottom of the substrate and allowing the incident light of a longer wavelength than λz to pass the device from the top surface to the bottom surface or from the bottom surface to the top surface. The photodiode is named a "wavelength-selective photodiode(PD)" in short hereinafter.

The wavelength-selective photodiode (64) is followed by a laser diode chip (70) which emits the λ2 light. The light emanates from an end of the chip (70). The end is vertical to the beam line. Namely, the beam line is parallel to the surface of the laser (70). The semiconductor laser diode (70) has been produced by the steps of growing epitaxially an active layer (72) and a contact layer (73) on a substrate (71), attaching a stripe p-electrode (75) on the top of the contact layer (73), forming an n-electrode (74) on the bottom of the substrate (71). In the case of a buried type laser, burying layers sandwich the central active layer (72). The active layer (72) has a double-hetero structure. Injection of a current from the p-electrode to the n-electrode oscillates the laser (70) to emit the λ2 light. The laser (70) is, however, a conventional laser. There is no need of explaining the detailed structure. The light λ2 carrying a signal from the laser (70) goes into the photodiode (64) from the bottom, passes the diode without loss and goes out from the top surface. Then, the λ2 light enters the fiber (62) and travels in the fiber as a transmission signal.

The example allocates λ1=1.3 μm and λ2=1.55 μm to the PD (64) and the LD(70). Prior modules used to adopt a photodiode with enough sensitivity both to λ1 and λ2. Otherwise, the present invention makes a special photodiode which detects λ1 but does not sense λ2. The photodiode is constructed with an InGaAsP window layer (λw) and an InGaAsP absorption layer (λz) for satisfying the requirement of λw<λ1<λz<λ2. Thus, the ratio of the components of the window layer is determined by the conditions of λw<1.3 μm and the lattice-fitting. The ratio of the components of the absorption layer is determined by the conditions of 1.3 μm<λz<1.5 μm and the lattice-fitting. Restriction of the range of sensitivity of the photodiode (64) permits the laser light to pass the PD (64) without loss.

EXAMPLE 2

Figure 11:
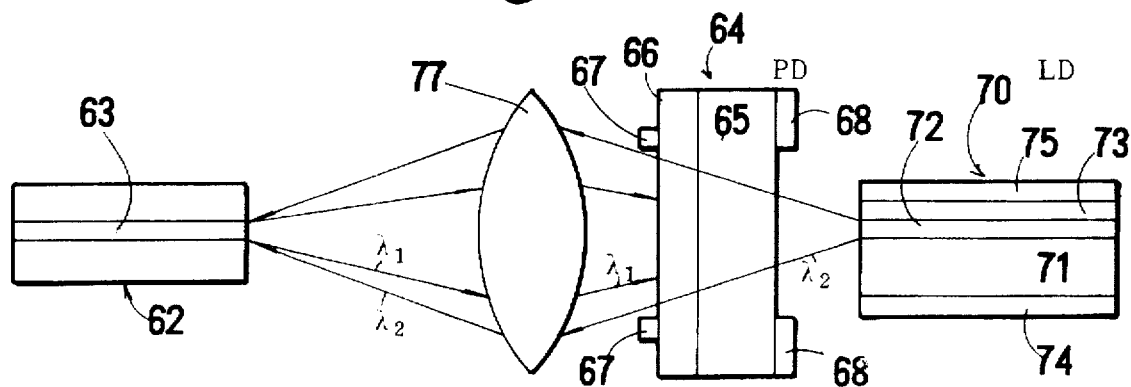
FIG. 11 is a schematic view of another example of an LD/PD module of the present invention of aligning a fiber, a lens, an eigen-wavelength photodiode and a semiconductor laser in series on a beam line.

FIG. 11 shows example 2 which raises the efficiency of introducing the laser light λ2 into the core (63) of the fiber (62) by interposing a lens (77) between the fiber (62) and the wavelength-selective photodiode (64). Other parts and disposition are similar to example 1. The light beams λ1 launched from the fiber core (63) are converged by the lens (77) to the wavelength-selective PD (64), are fully absorbed by the reception layer (66) and are converted to a photocurrent. There is the laser (70) behind the PD (64). The laser (70) generates the light λ2 longer than λ1(λ2>λ1). The light λ2 comes into the PD (64) from the bottom, penetrates the PD (64) and goes out of the PD(64). The λ2 beams are converged by the lens (77). Almost all of the beams are admitted to enter the core (63) of the fiber (62). The lens (77) heightens the connection between the fiber (62) and the laser (70). Of course, the power from the fiber (62) to the PD (64) is also strengthened by the lens (77).

EXAMPLE 3

Figure 12:
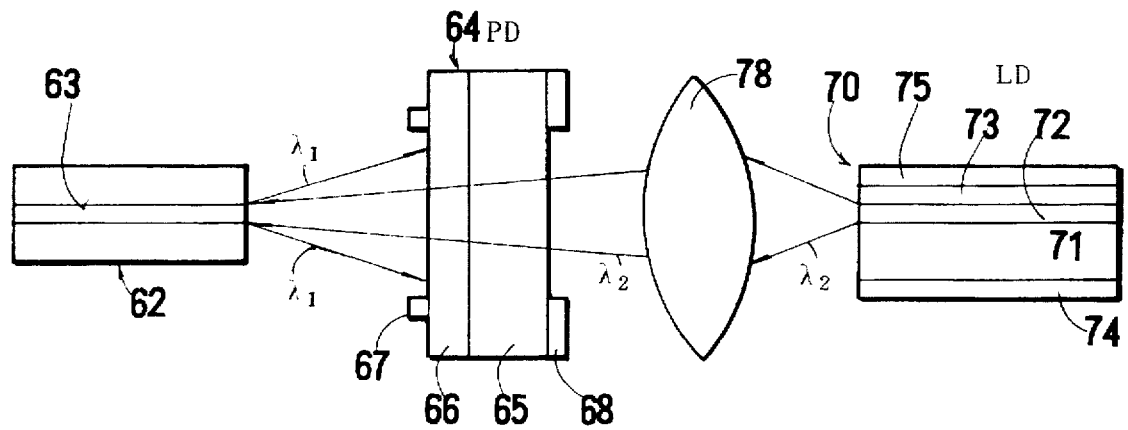
FIG. 12 is a schematic view of a third example of an LD/PD module of the present invention of aligning a fiber, a wavelength-selective(eigen-wavelength) photodiode, a lens and a laser in series on a beam line.

FIG. 12 shows another example which exchanges the positions of the lens and the PD (64) in FIG. 11. A lens (78) is interposed between the PD (64) and the laser (70). The lens (78) is assigned to converge the light λ2 of the laser (70) on the core (63) of the fiber (62). The light λ2 is converged by the lens (78) and penetrates the wavelength-selective photodiode (64) from the bottom to the top. The selection of the front lens type of FIG. 11 or the rear lens type of FIG. 12 should be contingent on the desired coupling efficiency, the photodiode, the laser diode, the mount of the lens and the shape and size of the package.

EXAMPLE 4

Figure 13:
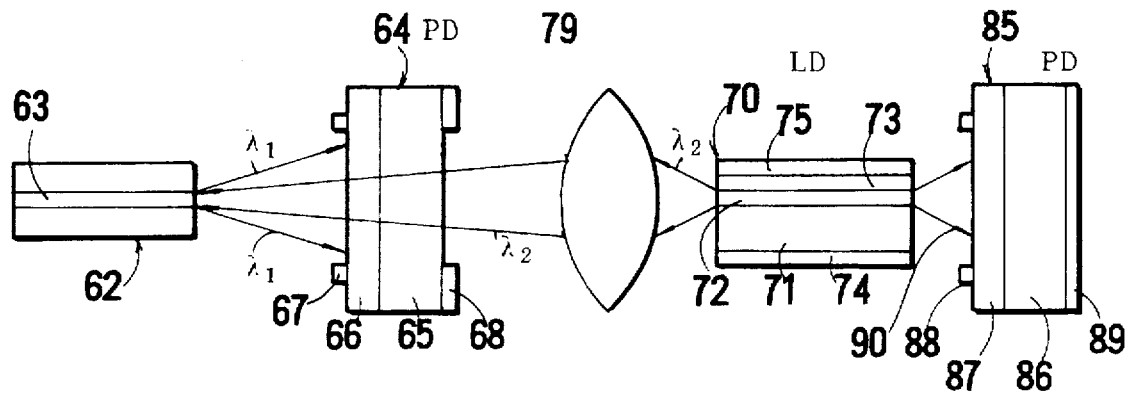
FIG. 13 is a schematic view of a fourth example of an LD/PD module of the present invention of a fiber, an eigen-wavelength photodiode, a lens, a laser, and a monitoring photodiode in series on a beam line.

FIG. 13 exhibits a fourth example which adds another photodiode (85) behind the laser (70) for monitoring the power of the laser (70). The photodiode (85) is an ordinary one having a substrate (86) and a light reception layer (87)

grown on the substrate (86). The reception layer means a set of a buffer layer, an absorption layer, a window layer and a p-region. A ring p-electrode (88) is formed on the p-region. An n-electrode (89) covers the whole bottom of the substrate (86). Unlike the wavelength-selective PD (64), the photodiode (85) for monitoring has no opening on the bottom. The preceding photodiode (64) is the wavelength-selective one according to the idea of this invention. The light λ1 from the fiber (62) is detected by the photodiode (64). The laser (70) emits λ2 light beams both in the forward direction and in the rear direction. The forward λ2 beams are converged by a lens (79), pass the PD (64) and go into the fiber (62) with high efficiency. The rear λ2 beams reach the rear PD (85) which detects the power by the photocurrent. The oscillation of the laser (70) is stabilized by maintaining the photocurrent of the PD (85) at a constant level. A change of temperature varies the emission performance of a laser. The monitoring photodiode (85) enables the module to drive the laser (70) with a constant power in spite of the fluctuation of temperature.

EXAMPLE 5

Figure 14:
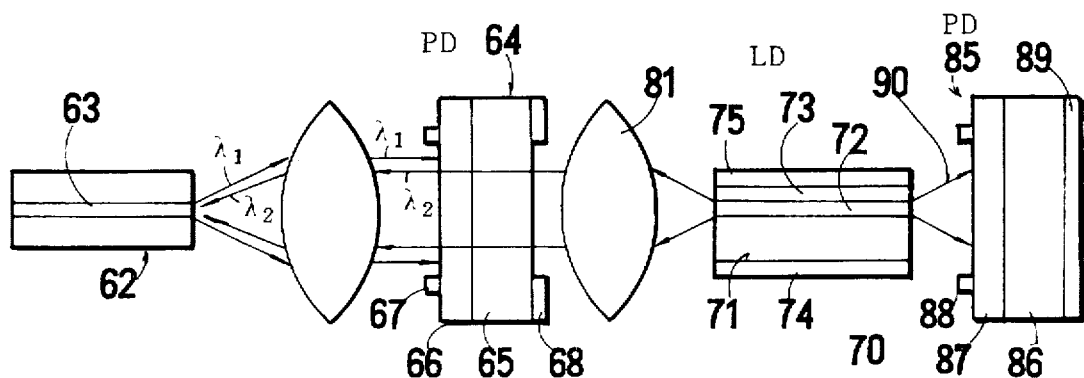
FIG. 14 is a schematic view of a fifth example of an LD/PD module of the present invention of aligning a fiber, a lens, a wavelength-selective photodiode, a lens, a laser and an end photodiode in series on an extension of the beam line of the optical fiber.

Another example is exhibited in FIG. 14. Two lenses (80) and (81) are provided for converging light beams. The forward lens (80) intervenes between the fiber (62) and the wavelength-selective photodiode (64). The rear lens (81) is interposed between the PD (64) and the laser (70). The lens (80) has a forward focus just at the end of the fiber (62). The beams from the fiber (63) become parallel beams by the lens (81). The back focus of the other lens (81) coincides with the end of the laser (70). The lens (81) converts the diverging beams of the laser (70) to parallel beams. The laser light passes the PD (64) as parallel beams and converges on the fiber end by the lens (80). Parallelism of λ1 and λ2 beams enables example 5 to determine freely the positions of the fiber (62), the PD (64) and the laser (70) on the beam line.

EXAMPLE 6

Figure 15:
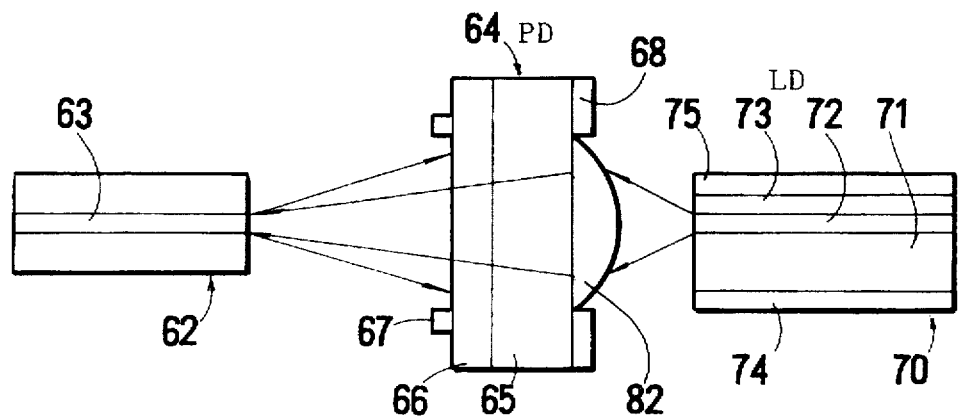
FIG. 15 is a schematic view of a sixth example of an LD/PD module of the present invention of aligning a fiber, a wavelength-selective photodiode with a built-in lens and a laser in series on a beam line.

FIG. 15 denotes another example including a photodiode having a built-in lens (82) on the bottom of the substrate (65). The lens protrusion can be produced by etching stepwise the part of the substrate (65). The built-in lens (82) converges the light λ2 to the fiber (62).

EXAMPLE 7

Another example is give by eliminating the lens (81) from the example of FIG. 14 or replacing the PD (64) and lens (79) in FIG. 13. The module aligns the fiber end, the lens, the PD (64), the laser (70) and the PD (85). A detailed embodiment will be explained by FIG. 19 later.

EMBODIMENT OF WAVELENGTH-SELECTIVE PHOTODIODE CHIP

Figure 16:
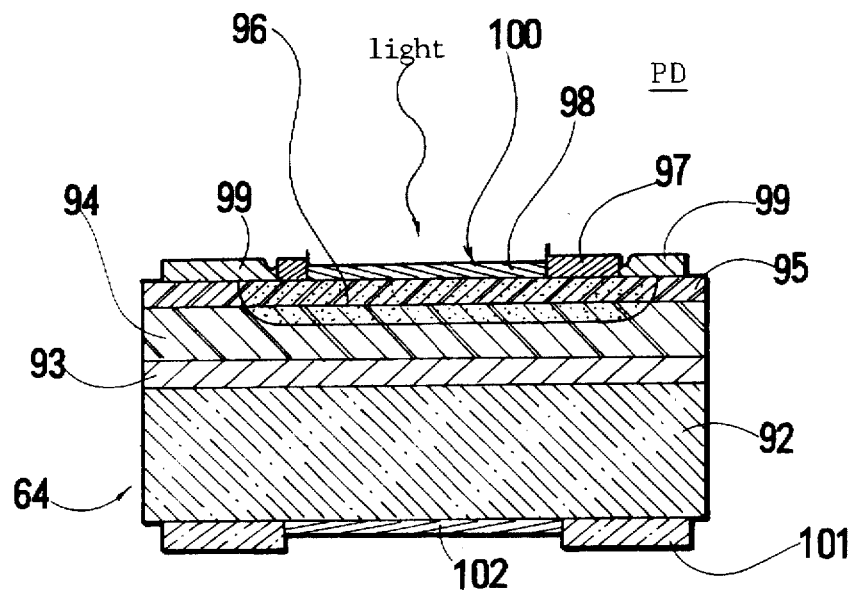
FIG. 16 is a sectional view of an eigen-wavelength (wavelength-selective) photodiode which is sensitive to 1.3 μm but insensitive to 1.55 μm.

The point of the present invention is an improvement of a photodiode. Thus, the wavelength-selective photodiode is first explained. For example, the photodiode for the optical communication using 1.3 μm and 1.55 μm is clarified by referring to FIG. 16. The substrate (92) is an n-InP wafer. An n-InP buffer layer (93), an n-$In_{0.66}Ga_{0.34}As_{0.76}P_{0.24}$ ($\lambda z=1.42$ μm) light receiving layer (94) and an n-$In_{0.82}Ga_{0.18}As_{0.40}P_{0.60}$ ($\lambda w=1.15$ μm) window layer (95) are grown on the n-InP wafer (92) by the liquid epitaxial method. In stead of the liquid epitaxy, the epitaxial layers can be produced by the MBE (molecular beam epitaxy) method, the MOCVD (metalorganic chemical vapor deposition) method or the chloride VPE method. The light receiving layer has the component ratios of x=0.66 and y=0.76 for $\lambda z=1.42$ μm. The window layer has the component ratios of x=0.82 and y=0.40 for $\lambda w=1.15$ μm. The window layer was ($\lambda w=0.92$ μm) InP in conventional InGaAs-type photodiodes without exception. This invention, however, makes another window layer with an InGaAsP mixture crystal having a longer cut-off wavelength ($\lambda w=1.15$ μm). In addition, the light receiving layer is made not from InGaAs ($\lambda z=1.67$ μm) but from InGaAsP ($\lambda z=1.42$ μm) having a shorter eigen wavelength.

The conventional PD had a wide wavelength difference ($\lambda z-\lambda w$) of 0.75 μm between the window layer $\lambda w$ and the absorption layer $\lambda z$. The wide gap gives the wide range of sensitivity of FIG. 9. In this invention, however, the gap ($\lambda z-\lambda w$)=0.27 μm is very small. Namely the sensitivity is restricted in a narrow scope. The restricted range endows the photodiodes of the invention with the eigen wavelength property. The thicknesses of the layers are, for example, 350 μm for the n-InP substrate, 2.5 μm for the n-InP buffer layer, 5 μm for the InGaAsP light receiving layer and 1.5 μm for the InGaAsP window layer. In general, the suitable thickness of the window layer is 1 μm to 4 μm and the proper thickness of the receiving layer is 1 μm to 7 μm.

Figure 17:
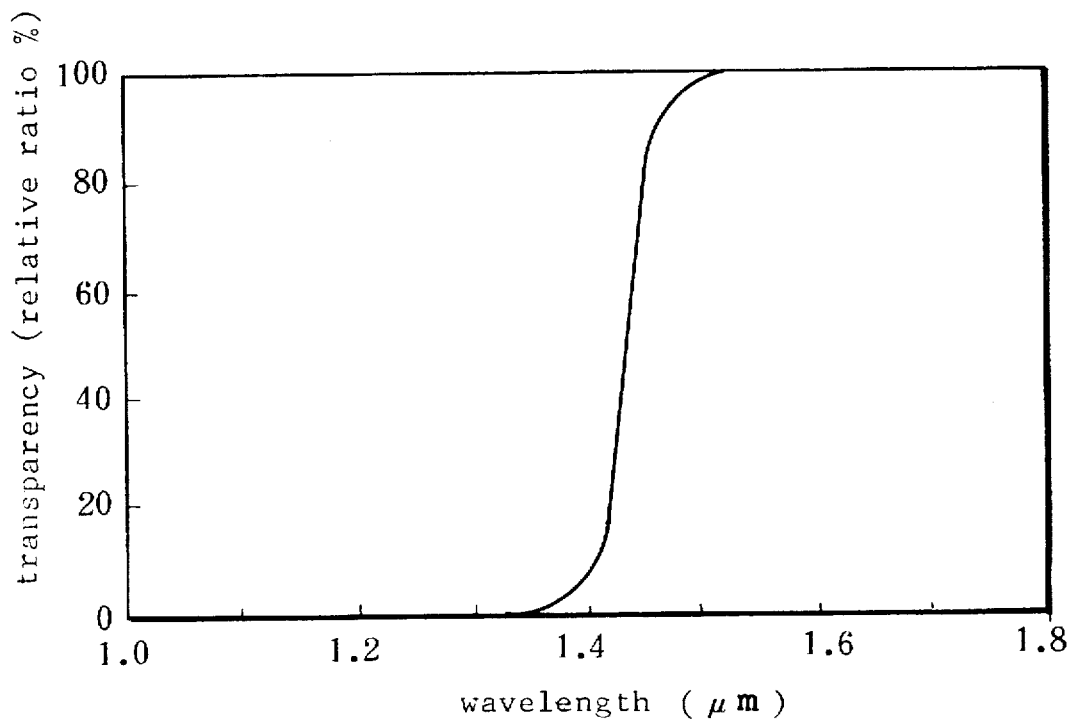
FIG. 17 is a graph showing the wavelength dependence of the transparency of the epitaxial wafer on which the 1.3 μm selective photodiodes have been made.

FIG. 17 shows the result of measurement of the relation between the transparency (relative ratio) and the wavelength (μm) of the epitaxial wafer. The abscissa is the wavelength (μm). The ordinate is the relative transparency (%). The light having the wavelength longer than 1.51 μm fully passes through the epitaxial wafer. The light with the wavelength shorter than 1.3 μm is entirely absorbed by the epitaxial wafer. λ=1.42 μm gives 50% of transparency in the curve. λ=1.42 μm is equal to the edge wavelength of the absorption layer. The transparency rapidly changes from 0% to 100% in a narrow scope of wavelength of 0.18 μm in the epitaxial wafer basing the present invention.

P-regions (96) are produced by masking the wafer and diffusing p-dopant into the epitaxial wafer through the openings of the mask. P-electrodes (97) are formed in a ring-shape on the p-regions (96). The top surfaces of the p-regions (96) enclosed by the p-electrodes (97) are covered with transparent antireflection films (98). The extra surfaces outside of the p-electrodes (97) are protected with passivation films (99).

Annular n-electrodes (101) are formed on the bottom of the substrate in ohmic contact with the n-InP substrate. The central parts are openings for allowing light to pass through. Antireflection films (102) e.g., SiON films are formed on the openings. Then, the wafer is cut crosswise and lengthwise along cleavage lines into individual chips. Chips are mounted on suitable packages for producing photodiodes. Light can enter the chip both from the bottom opening and from the top opening of (100) the device. The light going into the chip from the top opening (100) is reception light. The light going into the device from the bottom opening is transmission light. The antireflection films (98) and (102) suppress the incident light from reflecting on the surfaces for prohibiting the reflecting light from disturbing the oscillation action of the lasers.

Figure 18:
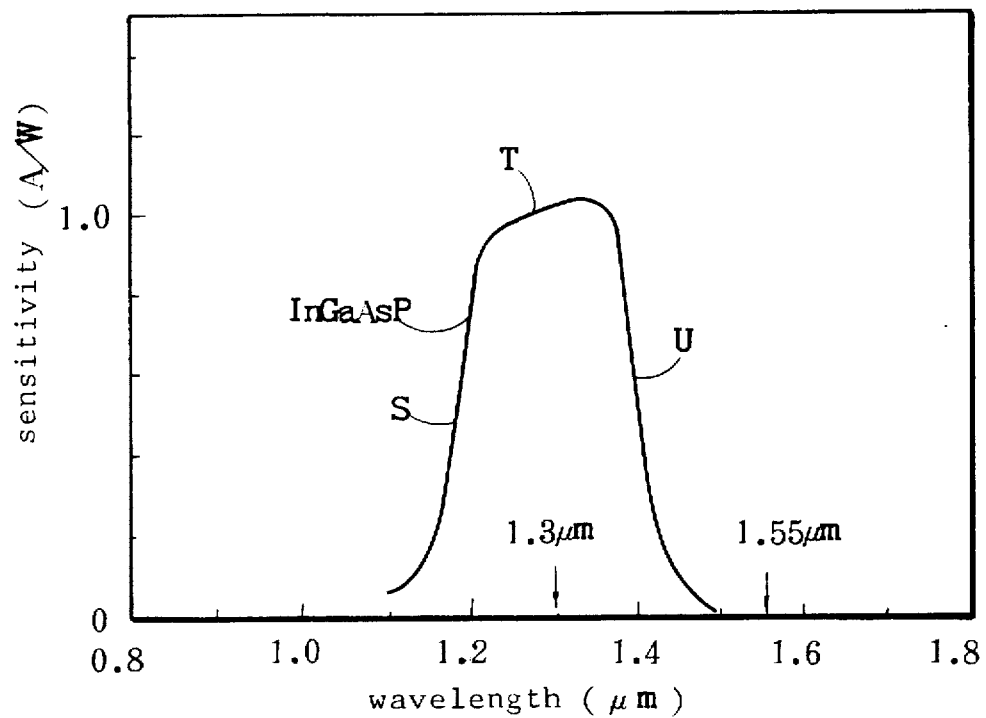
FIG. 18 is a graph of exhibiting the wavelength-dependence of the sensitivity of the 1.3 μm-selective photodiode of the present invention.

The photodiode of the present invention is characterized by the selection of the edge wavelengths $\lambda w$ and $\lambda z$ of the window layer and the absorption layer and the bottom opening enclosed by the n-electrode. FIG. 18 denotes the sensitivity dependence upon the wavelength of the photodiode. Photocurrents have been measured at a reverse bias of 5 V. The sensitivity is defined as a quotient of the photocurrent (A) divided by the light power (W). The sensitivity curve consists of a rising part (S), a high-sensitivity plateau (T) and a falling part (U). The sensitivity range (T) of the PD of the present invention is far narrower than the corresponding range (Q) of the conventional PDs in FIG. 9.

The middle of the rising part (S) is 1.15 μm which is equal to the edge wavelength of the window layer (λw=1.15 μm). All the light of a wavelength shorter than 1.15 μm is totally absorbed by the window layer. The absorption by the window layer is important for producing the wavelength-selective photodiode. The longer edge wavelength of the window layer than the prior ones positively reduces the sensitivity range from the left side.

The end of the falling part (U) is about 1.42 μm. The light of a wavelength longer than 1.42 μm cannot be detected, because the absorption layer does not absorb the light. The sensitivity scope has only a 0.27 μm width ranging from 1.15 μm to 1.42 μm. The sensitivity scope includes 1.3 μm but excludes 1.55 μm. The photodiode is highly sensitive to 1.3 μm but is fully insensitive to 1.55 μm. The photodiode can deduce only the 1.3 μm light from a mixture of 1.3 μm light and 1.55 μm light. Thus, this is an eigen wavelength photodiode for 1.3 μm.

EMBODIMENT 1 (MODULE WITH A CAP HAVING A LENS)

An embodiment having a ball lens is explained by referring FIG. 19. The odule contains a header (111), an eigenwavelength photodiode (64), a laser chip (70) and another photodiode (85). The photodiode (64), the laser (70) and the photodiode (85) are aligned on a direct line in the package, which corresponds to the example 7 of λ1=1.3 μm, λ2=1.55 μm and n=2. The metallic header (111) is made e.g., from covar, iron or copper-tungsten. The embodiment employs a cover header which is provided with four lead pins (112), (113), (114) and (115) projecting downward from the bottom. The ground pin (112) is directly welded on the header (111). The other pins pierce through holes into the inner space. The pins are glued to the holes by an adhesive. A submount (120) is soldered on the top of a pole (119) projected from the header (111). The submount is a plate of an insulator metallized on both surfaces. The submount is, for example, an alumina (Al$_2$O$_3$) plate.

Suitable solder is AuSn, AuGe or SnPb. The submount (120) is soldered with AuSn in the embodiment. An eigenwavelength photodiode (64) is fixed by the AuSn solder on the submount (120) in the surface orientation of being perpendicular to the beam line. A wire (121) connects the electrode of the PD chip (64) to the lead pin (114). The submount (120) has a notch (128) or hole (132). The PD chip (64) is positioned at a point just above the notch (128) or the hole (132).

Another insulating submount (122) is fixed by solder on a vertical plane of the pole (119). The submount (122) is made from e.g., aluminum nitride (AlN). Both surfaces are coated with metal by printing. The submount (122) is parallel with the beam line. A laser chip (70) is bonded on the submount (122). The beam line of the laser coincides with the beam line of the fiber (62). There is a slanting part of the header near the foot of the pole (119). A submount (123) is soldered on the slanting part. A monitoring photodiode (85) is soldered on the submount (123). The photodiode is not vertical to the beam line for suppressing the reflected light from returning to the laser (70).

Wires connect the lead pins to the electrodes of the PD chip (64), the LD chip (70) and the PD chip (85). FIG. 20 shows examples of submount for the PD (64). FIG. 20(A) denotes a submount (120) having a rectangular notch (128) for admitting light to pass. All the other surfaces (top surface, bottom surface and sides) are coated with metal thin films (130). The bottom n-electrode is bonded on the top metallized surface. The bottom metallized surface is bonded on the pole (119). Thus, the n-electrode is electrically connected to the header (111), which saves a step of wire-bonding. The p-electrode of the PD (64) is joined to the lead pin (114) by a golden wire (121) of a 30 μm diameter. The diameter of the light reception aperture (100) of the PD (64) is 200 μm. The span of the notch (128) is 250 μm. The length of the notch is 500 μm which is equal to the size of the PD chip (64). AuSn solders the PD (64) to the submount (120).

The submount (120) of FIG. 20(b) is partially metallized. The n-electrode is in contact with the partial metallized part (129). The metallized part (129) is joined to the pin (115) with a wire. The size of the rectangular notch (128) is 250 μm×500 μm like the former example of FIG. 20(a). The submount (120) of FIG. 20(c) has a circular hole (132) instead of the notch. The whole surfaces are coated with metal films.

All the submounts have a common thickness of 500 μm. In any cases, the submount is positioned by harmonizing the rear end of the submount with the back wall of the pole (119) without special adjustment. When the PD (64), the LD (70) and the PD (85) have been mounted on the header (119), a cylindrical cap (124) with a lens is fixed on the header (119) by putting the cap (124) on the header (119), filling an inert gas (e.g. argon gas or nitrogen gas) into the cap and welding the cap (124) to the header (119) airtightly. The cap (124) requires a window. The window needs a glass plate or a glass lens. The embodiment uses a ball lens (126) for heightening the coupling efficiency by converging the beams emitted from the laser (70) on the end of the fiber (62). An important matter is an alignment of the laser (70), the lens (126) and the optical fiber (62). The alignment is carried out by injecting current to the laser (70), lightening the laser (70), guiding the light into the fiber (62) and monitoring the power at the other end of the fiber (62). The optimum positions of the lens (126) or the fiber (62) are searched by displacing the cap (124) or the fiber (62). Then, the parts are fixed at the positions where optimum power is obtained through the fiber (62).

On the contrary, the PD (64) dose not need a rigorous alignment. The tolerance in the directions orthogonal to the beam line is generous owing to the wide aperture (100) of the light receiving region. Furthermore, the PD (64) does not require converging beams. Namely, there is no need of the PD (64) being settled at the image point of the fiber end with regard to the lens (126). Thus, this invention does not place the PD (64) at the image point of the fiber. This is a strange mode of detection. Since the photodiode detects the total power of the light, the output power is scarcely affected by the position of the PD along the beam line unlike the image processing device, e.g. a camera.

This matter facilitates the assembly of the PD/LD module to a great extent. The example has three semiconductor chips or five optical devices including the lens (126) and the fiber (62). If all the five parts had to be aligned in a beam line, the alignment would be very difficult and the yield would be reduced. The devices requiring the alignment are only the laser (70), the lens (126) and the fiber (62). Since the PD vanishes from the steps of adjustment, the alignment is quite similar to the well-known alignment of a laser module.

Thus, the embodiment can be realized by improving a conventional LD module with a bit of contrivance. Additional steps are changing of the shape of the pole, mounting the PD chip and connecting the electrodes to leads with wires. Such a slight addition of the steps effectively simplifies the multiwavelength, bidirectional optical communication network.

The output power is measured at the other end of the fiber when the 1.55 μm LD (70) is lightened. The output power is similar to the power of the device without the PD chip (64). The interposition of the PD (64) has no bad effect upon the coupling between the fiber (62) and the laser (70). On the contrary, the output from the fiber (62) is measured by the PD (64) when 1.3 μm light is introduced into the other end of the fiber (62). The output is similar to the PD module without the LD. The defocus of the PD does not affect the output of the PD (64), since the wide aperture allows the PD to absorb all the power at any position on the beam line. Thus, the exterpolation of the laser is not a bad influence upon the PD (64). The laser (70) and the photodiode (64) independently emits or detects their own light without correlation.

EMBODIMENT 2 (Fiber built-in PD/LD module)

Figure 21A:
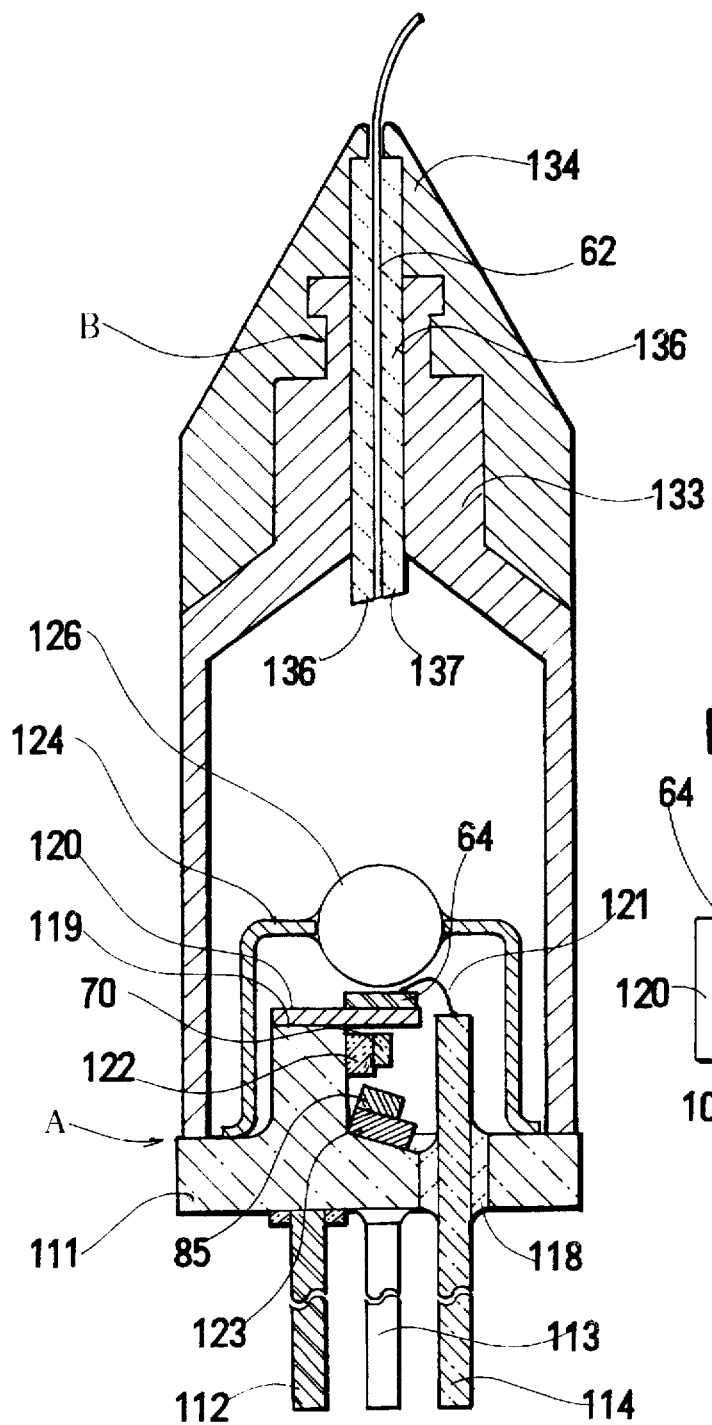
FIGS. 21A and 21B is a vertically-sectioned view of another embodiment of the present invention connecting a header with a PD, an LD and a PD with a fiber.
Figure 21B:
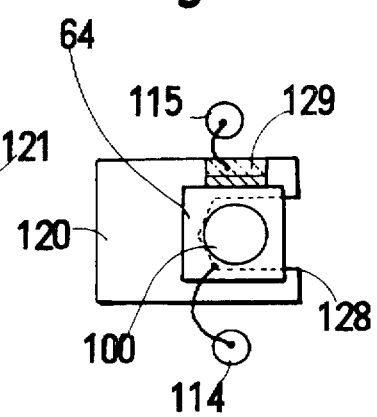

FIGS. 21A and 21B shows another embodiment which couples the module of FIG. 19 with a fiber. The module has coupled a fiber to the FIG. 19 module by welding a ferrule having an end of a fiber to a header (111). The parts enclosed by the header (111) and a cap (124) are the same as embodiment 1. An eigen-wavelength photodiode (64) is fixed via a submount (120) on the top of a pole (119). A metallized part (129) is connected by a wire to a lead pin (115). A p-electrode is joined to a pin (114) by another wire. A laser (70) is mounted on a side of the pole (119). The beam line of the laser (70) is vertical to the header (111).

Embodiment 2 includes a ferrule holder (133), a ferrule (136) and a bending limiter (134) in addition to the PD/LD module of embodiment 1. The ferrule (136) is a tubular member holding an end of the optical fiber (62) in the hole. The ferrule-holder (133) is a metallic cylinder having a conical top. A hole is pierced at the top of the ferrule-holder (133). The ferrule (136) is inserted and fixed in the hole. A bottom end (137) of the ferrule (136) is slantingly cut at an angle of 8 degrees for preventing reflected light from returning to the laser (70).

The ferrule-holder (133) and the ferrule (136) are made from metal, for example, stainless steel. The bending limiter (134) is made from an elastic material, for example, rubber or plastics. The bending limiter (134) is capped on the ferrule-holder (133). The bending limiter (134) protects the fiber from curving in a small radius. The alignment of the laser (70), the photodiode (64) and the lens (126) has been carried out. Then, the fixation of the holder (133) and the ferrule (136) is explained.

The laser diode is excited to emit light by supplying a current. The holder (133) is displaced in two dimensional directions on the surface A of the header (111), while the light power is watched at the other end of the fiber. When the output power takes the maximum value, the holder (133) is welded on the point by the YAG laser welding or the electric welding. Then the ferrule is axially displaced in the hole of the holder for seeking the point which gives a prescribed coupling ratio. When the axial position is found out, the ferrule (136) is welded to the holder (133) by irradiating YAG laser beams to the point B.

A similar experiment to embodiment 1 confirmed that the LD (70) and the PD (64) operate independently at the eigen wavelengths without interference. The embodiment has four lead pins. Otherwise, if the module has six lead pins, the freedom of designing bias circuits is increased, since the non-ground electrodes of the PD (64), the LD (70) and the monitoring PD (85) can be connected to the lead pins independently.

EMBODIMENT 3 (Fiber-separable type PD/LD module)

Figure 22:
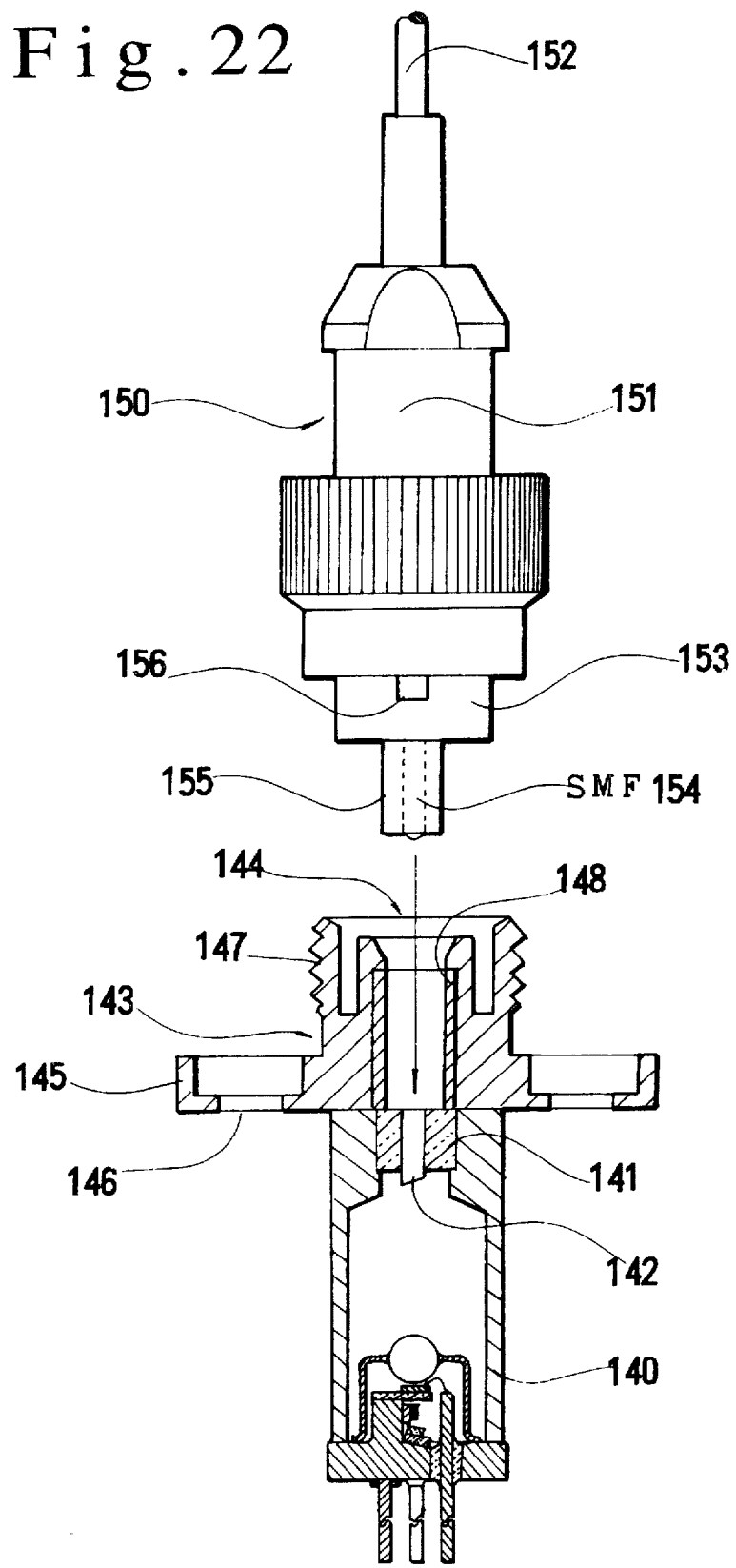
FIG. 22 is a sectioned view of a third embodiment of the present invention enabling a fiber to attach to or detach from the header having the devices.

FIG. 22 shows another embodiment which allows a fiber to attach to or detach from a receptacle. A unit PD/LD module is fixed to a connector. The connector is separable. A header (111) sustains a PD (64), an LD (70) and a PD (85) on the upper surface. A cylinder (140) is welded on the header (111). At the top of the cylinder (140), a dummy fiber holder (141) is fixed. The dummy fiber holder (141) holds a dummy fiber (142) with a slanting end. The slanting end prevents the reflected light from returning to the laser (70). The ends of the dummy fiber holder (141) and the cylinder (140) are welded on the bottom of a female housing (143) of the connector. The female housing (143) has a cylindrical part and a wide flange (145). Several screw holes (146) are perforated. A male screw part (147) is provided on the outer surface of the cylindrical part. A sleeve (148) with low friction is inserted into the hole of the cylindrical part. The sleeve (148) is made from e.g. zirconia.

A male connector (150) has a cylindrical housing (151) for holding an end of an optical fiber cord (152). The housing (151) sustains a union nut (153) on the outer surface. The front part of the housing (151) maintains a ferrule (155) sustaining an optical fiber (154). The end of the fiber (154) is polished in a round surface. There is a key (156) on an outer surface of the housing (151) for determining the orientation of the housing (151). A hole (not shown) is perforated axially on the female housing (143) for coupling the key (156). The pair of the connectors are coupled together by inserting the male connector (150) into the female connector (143) and tightening the union nut (153) to the male screw part (147). The optical fiber (154) comes into contact with the rear end of the dummy fiber (142). Travelling in the optical fiber cord (152), the signal light attains at the lens (126) and the PD (64) and is absorbed by the PD (64). The signal light emanating from the laser (70) is converged by the lens (126) and is guided to the dummy fiber (142).

The embodiment has an advantage of the freedom of attaching and detaching the fiber from the connector. The alignment has been carried out between the dummy fiber and the lens. The freedom enables the module to adapt itself to different fibers in common.

EMBODIMENT 4 (Example stored in a box package)

Another embodiment maintained in a box package is explained by referring to FIG. 23 and FIGS. 24A and 24B. The embodiment also aligns an eigen-wavelength photodiode (64), a laser diode (70) and a photodiode (85) for monitoring along a straight beam line. The LD/PD module mounts the devices in a covar package (160) and a covar cap (161) instead of the cylindrical package of FIGS. 19, 21A, 21B or 22. The package (160) contains an AlN submount (162) on which the optoelectronic devices are fixed. The submount (162) is provided with the eigen-wavelength photodiode (64) for selecting exclusively 1.3 μm at the front (163). A triangle notch (164) is bored at a point following the PD (64) on the submount (162). The submount (162) has a flat part (165) and a protrusion (166) at the rear end.

The monitoring photodiode (85) is affixed via a metal coating (167) to the end protrusion (166). Another submount (168) is fixed on the flat part (165). A 1.55 μm emitting laser diode (70) is bonded on the submount (168). A lens (170) is mounted on the notch (164). The wavelength-selective photodiode (64) is installed via a submount (169) on the front end of the larger submount (162). The eigen-wavelength photodiode (64) only senses 1.3 μm but allows 1.55 μm to pass thought it. The package (160) has six pins (171), (172), (173), (174), (175) and (176) at the bottom which are insulated from the package (160). An axial hole (177) is bored at the forefront of the package (160). An optical fiber cord (178) is inserted in the hole (177). The front end of the fiber (179) faces with the eigen-wavelength photodiode (64). The end (180) of the fiber is ground and polished slantingly for preventing the reflected light from returning to the laser (70).

The notch, the protrusion and the step facilitate positioning of the optoelectronic devices on the submount (162). The upper surface of the submount (162) is provided with metal coatings (181), (182), (183), (184), (185) and (186) for wiring patterns. The n-electrode of the wavelength-selective photodiode (64) is soldered to the metallized pattern (186). The metallized pattern (186) is connected to the lead pin (176) with a wire (196). The p-electrode of the PD (64) is coupled to a metallized pattern (181) with another wire (191) to the pin (171).

The LD (70) is soldered on the metallized pattern (185) which is coupled by a wire (195) to the pin (175). Another electrode of the LD (70) is connected to the metallized pattern (182) by a wire (197). The pattern (182) is led to the pin (172) by a wire (192). The monitoring photodiode (85) is fixed upon the metallizing (184) with a solder. The metallized (184) is coupled to the pin (174) by a wire (194). The other electrode of the PD (85) is coupled via a wire (198), the metallized coat (183) and a wire (193) to the pin (173). In practice, the submount is soldered on the package, after all the optoelectronic devices have been mounted on the submount and the lens has been fixed on the notch. Then, the electrodes, the metallized coats and the pins are connected by wirebonding.

Positioning of the fiber is carried out by loosening the fiber with regard to the package, driving the LD (70) to emanate, measuring the output at the other end of the fiber and fixing the fiber in the hole (177) with an epoxy resin, when the output attains to the predetermined power. Then, the package (160) is covered with the cap (161) and sealed airtight by the seam-seal method in dry nitrogen atmosphere.

The LD/PD module is examined by introducing 1.3 μm light into the fiber, lightening the 1.55 μm laser and detecting the 1.3 μm light by the wavelength-selective photodiode (64). The examination confirmed that the PD (64) exhibits the same sensitivity as an isolated 1.3 μm photodiode and confirmed that the PD and the LD operate individually at the eigen wavelengths.

The advantages of the embodiment are explained.
(1) The box type package facilitates to mount the module on a print circuit plate.
(2) Since the package has a wide volume, the package can include the driving circuit of the laser and the amplification circuit of the PD output in addition to the devices shown in FIG. 23 and FIGS. 42A and 42B.
(3) The unification of the circuits enables the module to reduce the size of the module including the signal procession circuit.

EMBODIMENT 5 (Two photodetectors and one light emitting device: n=3)

Figure 25:
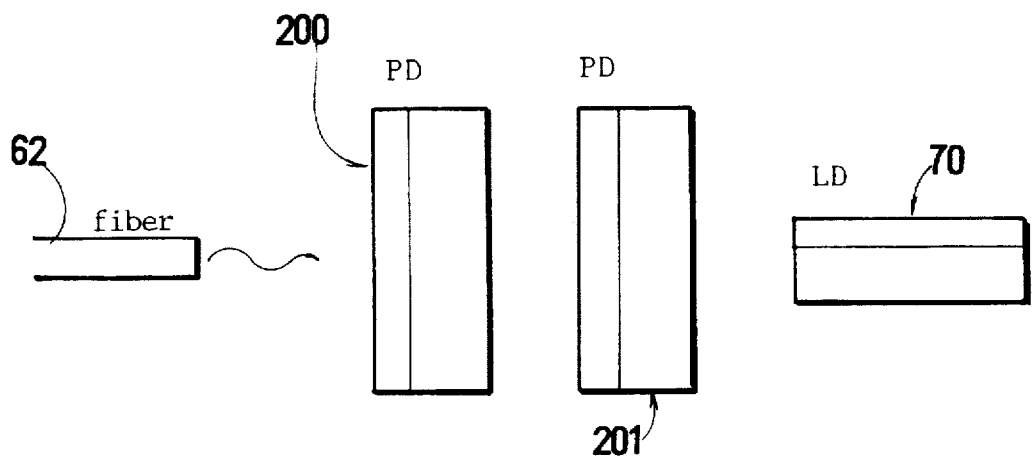
FIG. 25 is a schematic view of a fifth embodiment of the present invention aligning two photodiodes and a laser in series.

FIG. 25 exhibits an embodiment of the case of n=3. A 1.3 μm wavelength-selective photodiode (200) is installed face to face with an optical fiber (62). The eigen-wavelength photodiode (200) has an opening on the rear surface. The edge wavelength $\lambda w1$ of the window layer and the edge wavelength $\lambda z1$ of the absorption layer satisfy an inequality of $\lambda w1 < 1.3$ μm$< \lambda z1$. And the difference ($\lambda z1 - w1$) is small enough. $\lambda 1.46$ μm eigen-wavelength photodiode (201) lies at a point following the 1.3 μm PD (200). The 1.46 μm PD (201) has the similar properties of having an opening on the back and a small difference ($\lambda z2 - \lambda w2$) and of satisfying an inequality of $\lambda w2 < 1.46$ μm$< \lambda z2$.

A 1.55 μm laser (70) is provided at an end of the beam line for producing transmission signals. The laser light of 1.55 μm passes through the 1.46 μm PD (201) and the 1.3 μm PD (200) and goes into the optical fiber (62). The transmission signals are carried by the 1.55 μm light in the optical fiber from the module to the station.

EMBODIMENT 6 (Example of horizontal PD)

Figure 26:
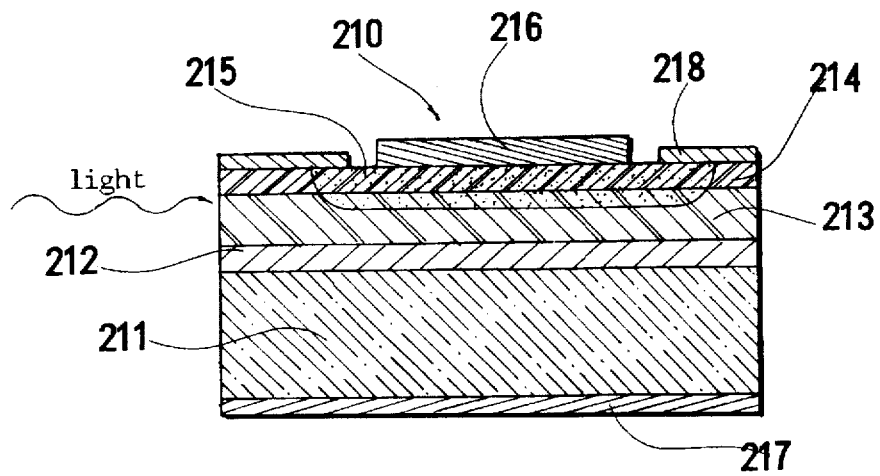
FIG. 26 is a vertically-sectioned view of the horizontal-type photodiode which is adopted in an embodiment of the present invention.

The photodiodes explained hitherto are the vertical-type photodiodes which have an annular p-electrode and a ring n-electrode for allowing light to pass the diode in the vertical direction. Otherwise, this invention can be utilized to a special, horizontal type photodiode (210) which is shown by FIG. 26.

The horizontal photodiode (210) is produced on an epitaxial wafer which comprises an n-type InP substrate (211), an n-InP buffer layer (212), and an InGaAsP light receiving layer (213) ($\lambda z = 1.42$ μm) and an n-type InGaAsP window layer (214) ($\lambda w = 1.15$ μm). P-regions (215) are produced at the center of chips by diffusing zinc as a p-impurity. Instead of an annular electrode, a wide, planar p-electrode (216) is evaporated on the p-region (215). The whole bottom of the n-InP substrate is covered with an n-electrode (217). Signal light is introduced in a horizontal direction to a side of the InGaAsP light receiving layer (213). Such a horizontal photodiode (210) is also feasible to the present invention.

Figure 27:
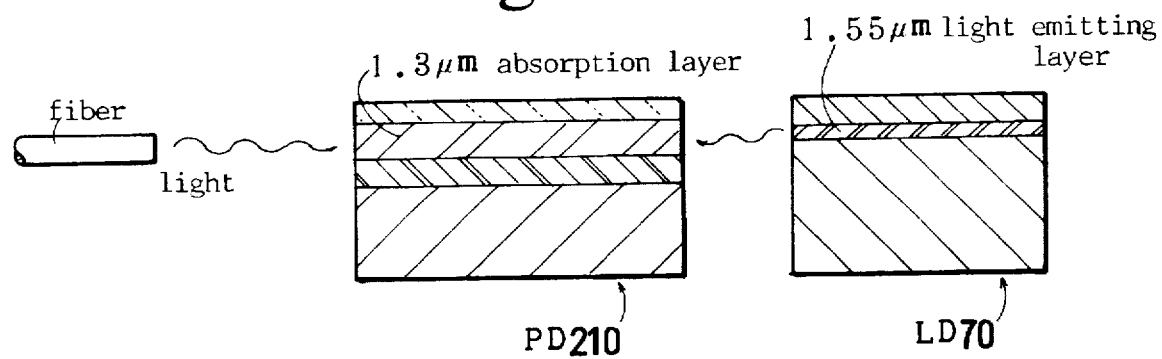
FIG. 27 is a vertically-sectioned view of a sixth embodiment of the present invention disposing a 1.3 μm horizontal-type photodiode and a 1.55 μm laser diode in series on an extension of the beam line of the optical fiber.

FIG. 27 shows another PD/LD module constructed with a horizontal photodiode (210) and a laser (70) which are aligned in a beam line. The signals are sent from the broadcasting station by the light of 1.3 μm to the ONU modules. The signal light is fully absorbed by the first PD (210). The semiconductor laser (70) emits the 1.55 μm light for transmitting signals from the ONU to the central station. The 1.55 μm light pass the PD (210) without loss.

The PD/LD module of the present invention can be built also with the horizontal photodiodes. The module consisting of n horizontal eigen-wavelength photodiodes ($\lambda 1 < \lambda 2 < \lambda 3 < \ldots < \lambda n$) has the following advantages over a module of the vertical photodiodes.

(1) The n PDs can be aligned on a side of the pole of a header, since the beam lines are parallel to the surfaces of the submount and the pole in the case of n PDs. In another case of including a laser and n PDs, the module aligns a series of PDs and an LD on a straight line. The coincidence of the orientation of all the optoelectronic devices facilitates the assembly of the PDs and the LD.

(2) The paths in the PDs are far longer than the path of the case of vertical PDs, since the light travels in the longitudinal direction in the absorbing layer (213). The long travel completely annihilates the light of $\lambda j$ at the j-th PD. The absorbing layer (213) has only a thickness of 1 μm or so but a length of several hundreds of μm.

(3) Since the light does not pass the window layer, the window layer does not absorb the light, which liberates the module from the requirement of $\lambda w < \lambda j$. The fact allows the window layer to be constructed with the same material as the absorption layer.

On the contrary, horizontal-PD built modules (FIG. 27) have the following drawbacks.

(1) Since the receiving layer is thin, some part of the light leaks in the substrate or the buffer layer. The leak light travels through the PD without being absorbed. Some contrivance would be required for forbidding the light from spreading in the substrate, the buffer layer or the window layer. For the purpose, the light must be converged in narrow beams to the narrow light receiving layer. The single-mode fiber has a core of about a 10 µm diameter. The absorption layer of a PD has a thickness of less than 4 µm but a length of several hundreds of µm. It is difficult to penetrate light beams in the light receiving layer.

(2) If leak light of a shorter wavelength enters a following PD, the light induces cross-talk. If leak light of a shorter wavelength goes into a laser, the transmission signals will be perturbed by the excitation induced by the leak light. These drawbacks, however, will be overcome by the following contrivances;

(i) thickening the light absorption layer, (ii) covering the end of the PD except the light receiving (absorption) layer with an opaque film, or (iii) narrowing the band gaps of the substrate, the buffer layer and the window layer to some values less than the absorption layer. These contrivances will solve the difficulties of the convergence or the alignment. Contrivance (iii) seems to be impossible in the case of the photodiodes having InP substrates.

Contrivance (iii), however, is feasible in the case of the photodiodes with GaAs substrates. AlGaAs mixture crystals satisfy the lattice-fitting condition with GaAs crystal in a wide range of the mixture ratio. All AlGaAs crystals have narrower band gaps than GaAs. If an AlGaAs photodiode having a GaAs substrate and an AlGaAs absorption layer is made, the light dispersed out of the AlGaAs absorption layer will safely be absorbed by the substrate, the buffer layer or the window layer due to the narrower band gaps. Such an AlGaAs photodiode will be endowed with the wavelength selectivity suitable for horizontal reception from the structural feature. Of course such a photodiode has never been produced, since there is no need for the AlGaAs photodiodes. The current technology can make such AlGaAs PDs, if necessary.

EMBODIMENT 7 (λ1 LD+λ2 PD)

Figure 36:
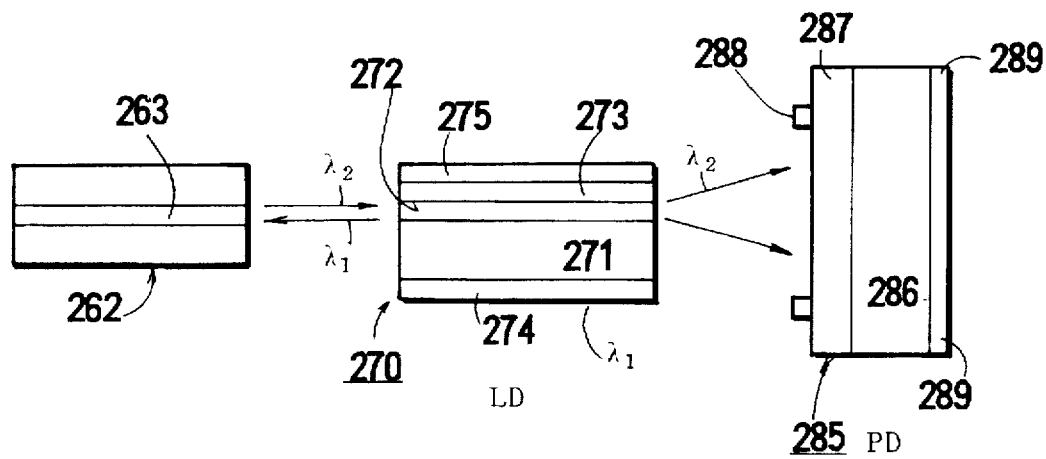
FIG. 36 is a schematic view of an example of an LD/PD module aligning a fiber, a λ1 laser diode and a λ2 photodiode on a straight line.

A basic embodiment is demonstrated by FIG. 36. The inner structure is omitted in the figure for simplifying the explanation. The embodiment has a λ1 laser diode (270) facing with the end of a fiber (262) and a λ2 photodiode (285) following the laser (270).

ONU terminals send signals by the λ1 light to the central station. The station sends signals riding on the λ2 light to the ONUs. Thus, λ2 is called "reception light" and λ1 is called "transmission light". The λ2 light from the station is received by the ONU terminals and detected by the PD (285). The laser (270) has an InP substrate, an InP cladding layer, an active layer (272) and an InP cladding layer (273) which have been grown epitaxially on the substrate. A p-electrode (275) is formed on the upper surface and an n-electrode (274) is formed on the bottom of the substrate. Injection of a current from the p-electrode (275) to the n-electrode (274) induces a stimulated emission of the λ1 light. The active layer is transparent to the λ2 light. The λ2 reception light passes the laser (270) without loss.

A photodiode (285) for receiving λ2 is furnished at the back of the laser (270). The photodiode (285) has an InP substrate, an InP buffer layer, an InGaAs light receiving layer, an InP window layer, an annular p-electrode (288) and an annular n-electrode (289). (286) denotes both the substrate and the buffer layer. (287) indicates both the window layer and the light receiving layer. The inner structure is omitted for simplicity. The rear side of the laser is coated with a reflection layer for reflecting the λ1 light completely but allowing the λ2 to pass through. Thus, only the λ2 light reaches the photodiode (285) and is detected by the PD in FIG. 36. The inequality λ1<λ2 enables the embodiment to realized such relation.

The fact that a laser emits the λ1 light signifies that the absorption edge of the active layer is λ1. The λ2 light can pass the laser without loss, since λ2>λ1. The active layer acts as a window for λ2. Nobody has proposed such a novel idea of utilizing an active layer as a window. This invention suggests the possibility of a complex assembly of light emitting devices and photodetectors by taking advantage of the wavelength selection property of semiconductor.

The module is explained more in detail. For example, λ1 and λ2 are assigned to be 1.3 µm and 1.55 µm respectively. In this case, the laser has an InP substrate and an InGaAsP active layer. The absorption edge of the active layer is 1.3 µm. 1.55 µm light can pass the active layer, if 1.55 µm light is directed to the layer. Although no one has noticed the fact, the 1.3 µm laser can be a window for the 1.55 µm light, because the laser does not absorb 1.55 µm light. Furthermore, the InGaAsP active layer plays the role of a waveguide for 1.3 µm light, which encloses and restricts the object light beams. Going into the laser at the front, the 1.55 µm light travels in the active layer and goes out of the rear end of the layer.

The light beams emitted backward from the laser slightly disperse. The photodiode, however, has a sufficiently wide light receiving region of about 100 µm to 200 µm diameter. Then, nearly all the beams are received by the aperture of the photodiode (285). This invention succeeds in making an LD/PD module of sending signals by 1.3 µm light and of receiving signals by 1.55 µm light by aligning a 1.3 µm LD and a 1.55 µm PD in series without WDMs.

The module, however, requires a contrivance of preventing the 1.3 µm laser light from going back to the photodiode, since the photodiode has some sensitivity to 1.3 µm. For the purpose, the rear end of the laser is coated with a reflection film which is reflective to 1.3 µm light but transparent to 1.55 µm light. Conventional lasers used to have a reflection film of a 80% to 90% reflection ratio on the rear side for forming a resonator with a front end. This invention demands a 100% reflection mirror for 1.3 µm. The selective mirror can be produced by piling a plurality of several kinds of dielectric films with different refractive indices and thicknesses.

The structure of the module is available for any set of λ1 and λ2 (λ1<λ2). For example, it is feasible to apply this type of module to a (λ1/λ2) set of 1.3 µm/1.46 µm or 1.46 µm/1.55 µm. Embodiment 7 is a basic module of the PD+LD type of the present invention. There are also some versions of this type of PD+LD for enhancing the performance of bidirectional multiwavelength optical communication network.

EMBODIMENT 8 (Lens+λ1 LD+λ2 PD)

Figure 37:
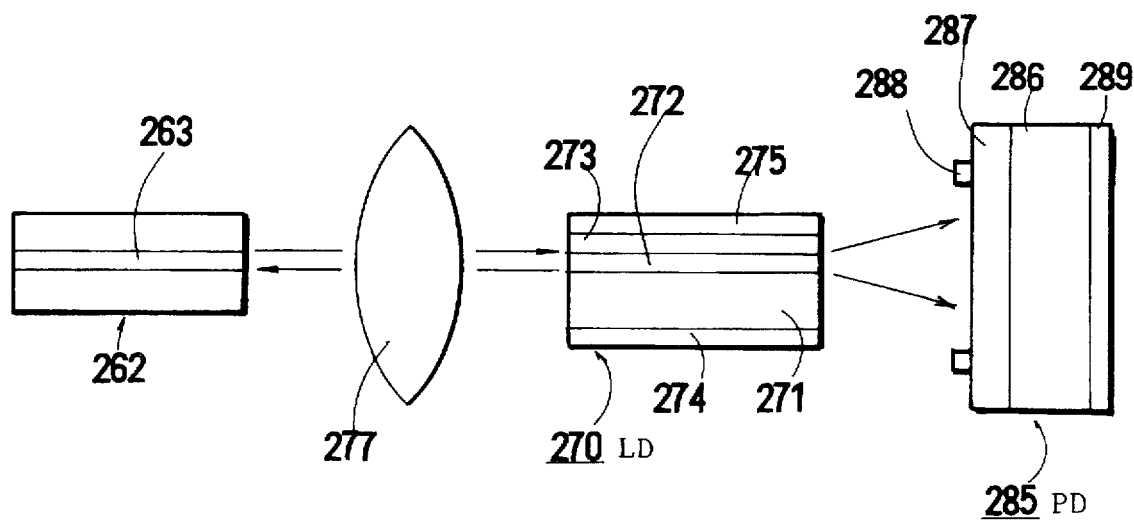
FIG. 37 is a schematic view of another example of an LD/PD module of the invention aligning a fiber, a lens, a λ1 laser diode and a λ2 photodiode on a straight line.

FIG. 37 shows another embodiment having a lens, a laser and a photodiode. A lens (277) is interposed between an optical fiber (262) and a laser (270) for enhancing the efficiency by converging the 1.3 µm laser light to the fiber (263). The lens (277) converges also the 1.55 µm light from the fiber (263) to the active layer of the laser (270) for penetrating the laser with a high efficiency. The lens raises the sensitivity for reception light and the power of the transmission light.

EMBODIMENT 9 (λ1 LD+λ1 PD+λ2 PD)

Figure 39:
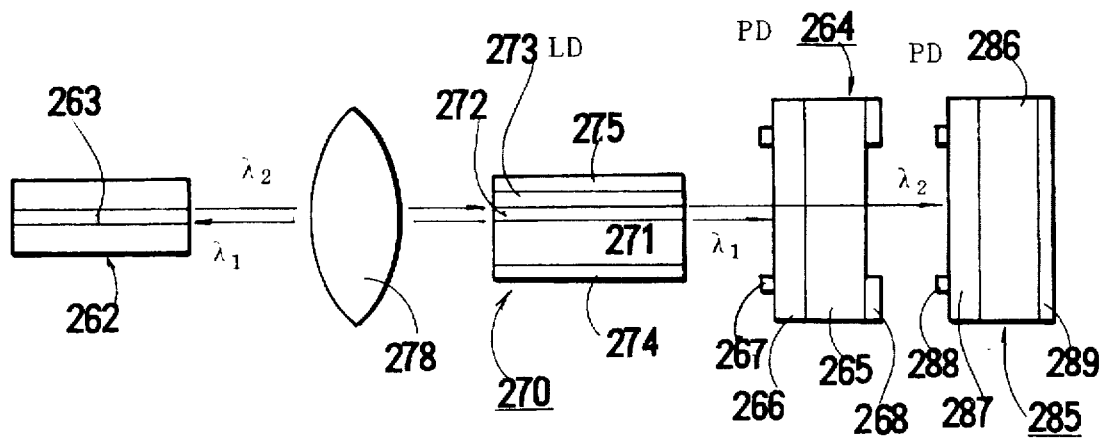
FIG. 39 is a schematic view of a third example of an LD/PD module of the invention aligning an optical fiber, a lens, a λ1 laser, a λ1 photodiode and a λ2 photodiode in series on a direct beam line.

An additional photodiode often accompanies a laser for regulating the power by monitoring the output power of the laser (FIG. 39). Like FIG. 6, a photodiode is furnished behind the laser in this module. The module controls the output of the laser by monitoring the light emitted backward from the laser, changing the driving current in the direction for reducing the difference between the actual power and the preferable power. The feed-back control is well know for driving laser modules.

Figure 8:
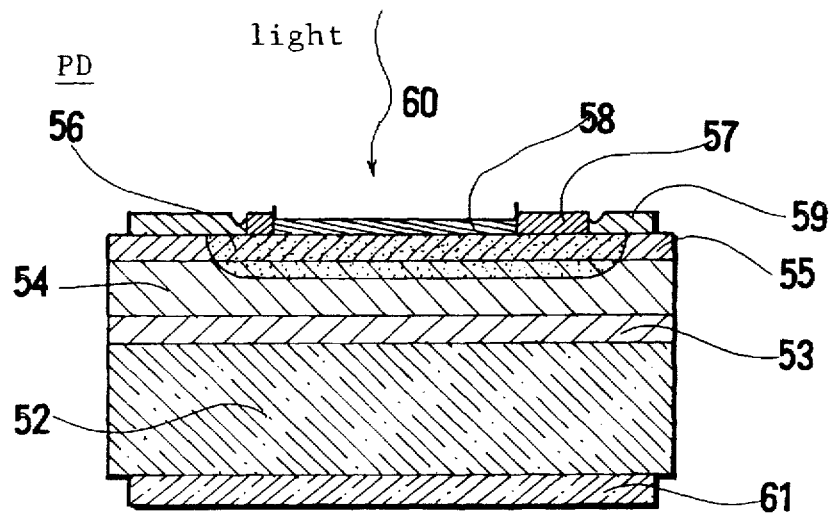
FIG. 8 is a sectional view of a prior photodiode chip.

It is also desirable to equip the module of the invention with the controlling device. The arrangement of the PD and the LD, however, impedes to apply such a controlling system to this invention, as it is. If a monitoring photodiode were positioned behind the laser, the monitoring photodiode would annihilate the reception signals in front of the main photodiode. As shown in FIG. 8, a conventional photodiode annihilates both λ1+λ2 by the wide bottom n-electrode (61), when the monitoring photodiode were shot by λ1+λ2.

Figure 9:
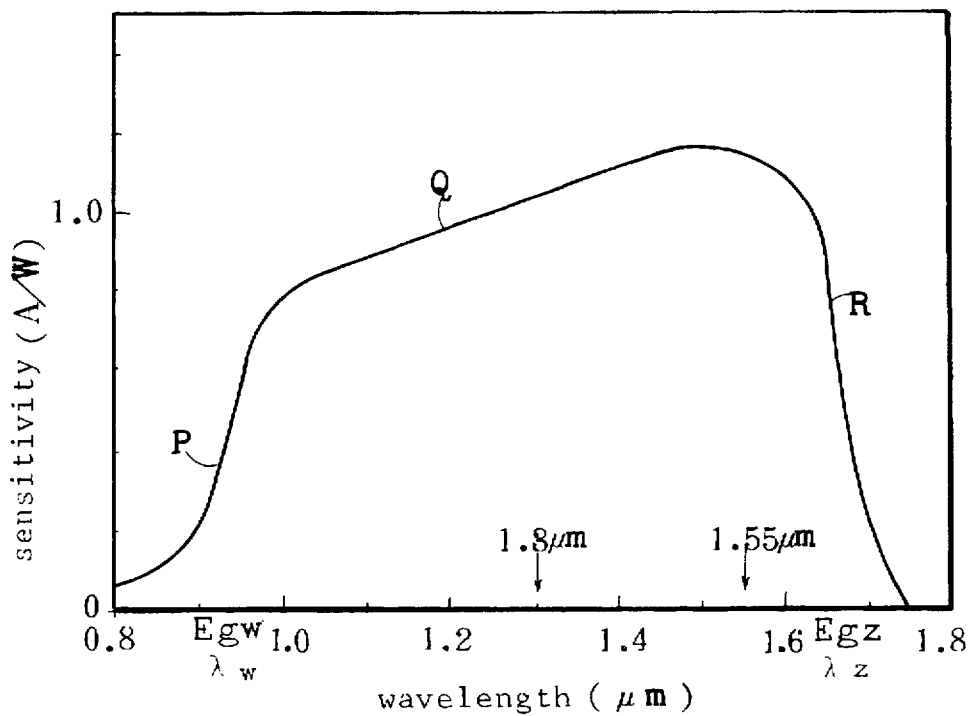
FIG. 9 is a graph of the relation between wavelength and sensitivity of the prior photodiode.

It seems only a structural difficulty at a first glimpse. The difficulty, however, cannot solved by changing the bottom n-electrode to a ring n-electrode for making an opening on the bottom. Conventional photodiodes have sensitivity both for 1.3 µm and 1.55 µm, as shown in FIG. 9. Even if a ring n-electrode were formed on the bottom of the substrate for permitting light to pass through, the monitoring photodiode could not detect the power of the laser exactly, since 1.55 µm light induces a photocurrent in the PD. The other problem is that almost all of the signal light would be absorbed by the monitoring PD. Thus, a conventional photodiode cannot be employed as a monitoring photodiode in the module of the present invention, even if the shape of the n-electrode were changed into an annular one. Fortunately, such a photodiode has already been given just by the present invention by FIG. 16. The PD in the former PD+LD type modules can directly be adopted as a monitoring photodiode, because the new PD can let light of longer wavelengths pass through.

An LD/PD module of FIG. 39 is produced by assembling the beforementioned laser, the narrow range monitoring photodiode and the final 1.55 µm photodiode in series. In FIG. 39, an end of a fiber (262), a lens (278), a 1.3 µm laser chip (270), a 1.3 µm eigen-wavelength photodiode (264) and a 1.55 µm photodiode (285) are aligned on a straight line. The laser (270) emits 1.3 µm light signals in both directions. The backward light is detected by the monitoring wavelength-selective photodiode (264) for regulating the power. The forward light is converged by the lens (278) and is introduced into the fiber (262) for carrying the signals from the terminal to the central station. The 1.55 µm light spreading out of the fiber (262) passes the lens (278), the laser (270) and the PD (264) without attenuation and arrives at the end 1.55 µm PD (285). The 1.55 µm PD converts the light signals from the central station into electric ones.

EMBODIMENT 10 (Lens+λ1 LD+λ1 PD+lens+λ2 PD)

Figure 40:
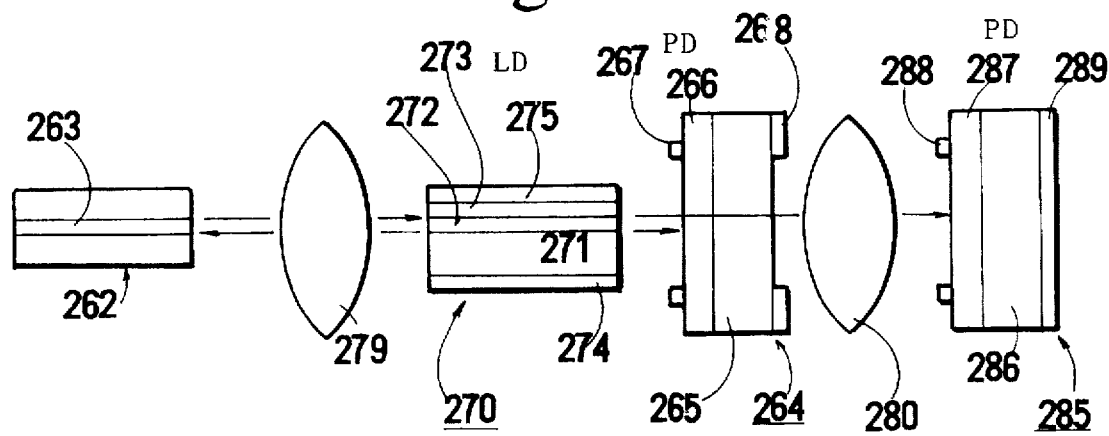
FIG. 40 is a schematic view of a fourth example of an LD/PD module of the invention aligning an optical fiber, a lens, a λ1 laser, a λ1 photodiode, a lens and a λ2 photodiode in series on a direct beam line.

FIG. 40 shows another embodiment having an additional lens (280) between the monitoring λ1 PD (264) and the end λ2 PD (285) to the previous example of FIG. 39. The lens (280) enables the λ2 PD (285) to receive the λ2 (1.55 µm) signal light with sufficient efficiency over a considerable distance. The lens enhances the freedom of design of the devices.

EMBODIMENT 11 (Improvement of a laser itself)

The abovementioned relate all to improvements of modules. Then, an improvement of a laser is also explained. A conventional laser diode has reflection films on both ends for making a resonator which reciprocates light between the end reflection films for absorbing pumping energy sufficient to emit coherent light. The rear end film has a higher reflection rate than the front film, since the light emitted from the front is used for various objects. The backward light is used for regulating the power by monitoring the power by the inherent PD. These reflection films act as a mirror to the emitted wavelength. Since the refractive index (n=3.5) is high enough, the reflection at the end attains to 30% without a mirror. Therefore, sometimes the front mirror film is omitted. But the rear end mirror is indispensable. It is usual to make a reflection mirror film of an 80% to 90% reflection ratio.

If the front mirror and the end mirror were to be formed on the ends of the laser of the present invention, the module would be inoperative, since the front and end mirrors would reflect the 1.55 µm light carrying the reception signals. Conventional reflection films have so small wavelength dependence that the films reflect almost all of the wavelengths near the emission wavelength. Little wavelength dependence has been deemed an ideal property of a mirror in general. If a 1.3 µm emission laser were to be employed in the linear LD/PD module, the end 1.55 µm PD cannot receive sufficient light power of 1.55 µm due to a big loss caused by the mirrors.

The high speed, long range optical communication system requires to reduce the optical loss as small as possible. Furthermore, the Inventors have noticed that the refection of 1.3 µm does not inherently contradict the transit of 1.55 µm. The difficulty shall be solved by forming a selective mirror on the ends which reflects 1.3 µm but admits 1.55 µm. Namely, the Inventors have noticed to adopt a film which acts as a reflection film to 1.3 µm but an antireflection film to 1.55 µm. The problem is whether such a miracle film can be produced actually. The Inventors have found a way of producing such a wavelength-selective film by designing the thickness, refractive indexes of dielectric multilayers of the film (FIG. 38).

Such a dielectric multifilm can be made by the current evaporation methods or the current CVD methods. The film (321) which shall coat the front end of the laser is built by piling a 606 nm $SiO_2$ film, a 24 nm a-Si(amorphous silicon) film and a 217 nm $SiO_2$ film in the order near the chip end. The multifilm can be produced by the plasma CVD method. The dielectric film exhibits a 30% reflection rate for 1.3 µm but has a 0.5% reflection for 1.55 µm. The selectivity for 1.3 µm and 1.55 µm is sufficient for making the module of the present invention. The other film (320) of FIG. 38 which shall coat the rear end of the laser is produced by piling a 220 nm $SiO_2$ film, a 56 nm a-Si film, a 103 nm $SiO_2$ film, an 84 nm a-Si film and a 470 nm $SiO_2$ film in the order from the end by the plasma CVD method.

The rear end film shows an 80% reflection for 1.3 µm but 0.5% reflection for 1.55 µm. These films are suitable for the end coating of the laser of this invention. The films can be made from various assemblies of materials of refractive indexes and thicknesses besides the example. The adoption of these dielectric multilayers on the ends of the laser realizes the novel module of the present invention with stable transmission performance and high sensitive reception.

Figure 38:
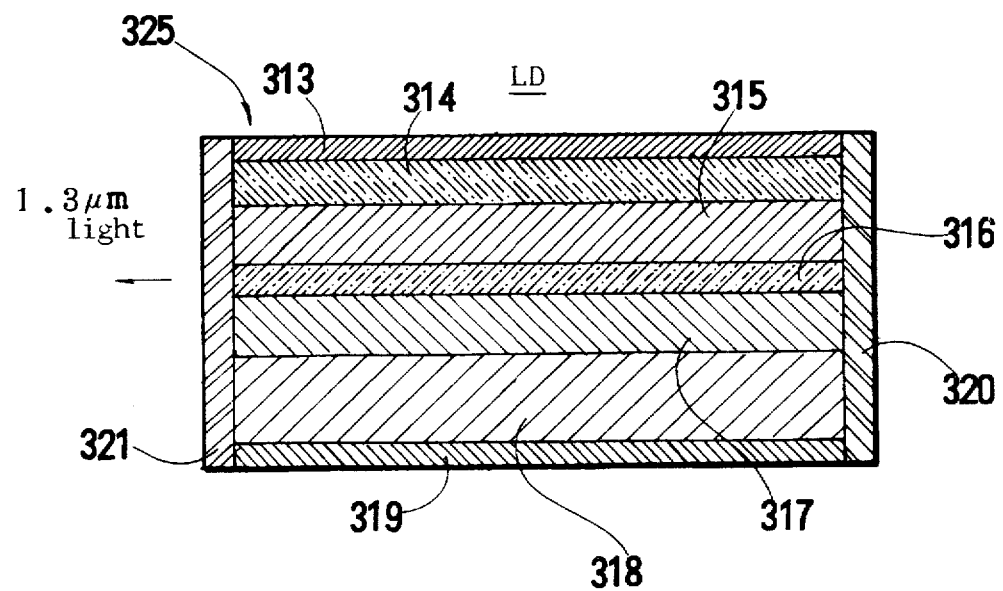
FIG. 38 is a section of the 1.3 μm laser employed in the present invention.

FIG. 38 shows the vertical section of the laser having such selective-films on both ends. The laser has been produced from an epitaxial wafer containing an n-InP substrate (318), an n-InP cladding layer (317), an InGaAsP active layer (316), an InP cladding layer (315) and an n-InGaAsP capping layer (314). P-regions are produced in stripes at the middle of chips by diffusing a p-impurity through a mask. Thus, at the middle stripe, the InGaAsP capping layer (314), the InP cladding layer (315) and the InGaAsP active layer (316) are partially converted from n-type to p-type conduction. Buried layers are grown on both sides of the active layer (316) for restricting the current and the light in narrow paths. The laser has a half-reflection film (320) coated on an rear end which fully reflects 1.3 µm light but admits 1.55 µm to pass. Another half-reflection film (321) coats a front end of the laser for reflecting 1.3 µm partially but admitting 1.55 µm. The laser allows 1.55 µm to pass through without loss. The passing 1.55 µm light has no influence on the laser, because, 1.55 µm light has smaller energy than the band gap of the active layer of the laser.

EMBODIMENT 12 (Storing devices in a box package)

FIG. 41 and FIG. 42A and 42B demonstrate an embodiment which contains optoelectronic devices in a box package. A covar box package maintains the 1.3 µm laser chip (325) of FIG. 16 and the 1.3 µm wavelength-selective monitoring photodiode (264) and a 1.55 µm photodiode (285) for detecting the reception signals. A package (326) and a cap (327) are made from covar. A submount (328), an insulating plate, is fixed in the package (326). Notches or steps are formed on the submount. The submount is partially coated with metal films. A plurality of pins (331), (332) . . . project from the bottom of the covar package (326). A lens (330) is fitted in a notch (364) at the forefront of the submount (328). A laser chip (325) is fixed on a metal coating at a point behind the lens (330). A 1.3 µm selective photodiode (264) is mounted on a metal coat of the submount (328) for monitoring the output power of the laser (325).

An end photodiode (285) is fixed on a metal coating (367) of the submount (328) behind the laser (325). An end of an optical fiber (338) is fixed in a hole (337) of the package (326). Traveling in the optical fiber (338), the 1.55 µm signals from the broadcasting station are converged by the lens (330), are led in the active layer of the laser (325) and the monitoring photodiode (264) and are detected by the end 1.55 µm photodiode (285). On the contrary, the 1.3 µm light emitted from the laser (325) is converged by the lens (330) to the optical fiber and is guided to the central station by the optical fiber (338). The power of the laser (325) is measured by the monitoring photodiode (264).

The embodiment employs the 1.3 µm LD chip (325) of a size of 300 µm×400 µm, the 1.3 µm PD (264) of 500 µm×500 µm and the 1.55 µm PD (285) of 500 µm×500 µm. The aperture of the 1.3 µm PD (264) is 300 µm in diameter. The aperture of the 1.55 µm PD (285) has a 200 µm diameter. The submount (328) is made from aluminum nitride (AlN). The submount is provide with the notch for the lens (330), the metal coatings and the grooves for mounting the LD (325), the PD (264) and the PD (285). The aperture of the preceding 1.3 µm PD (264) is designed to be larger than the aperture of the 1.55 µm PD (285) for preventing the 1.3 µm PD (264) from attenuating the 1.55 µm light.

The LD chip (325), the PD chip (264) and the PD chip (285) are soldered on the submount (328), for example, AuSn solder or SnPb solder. The lens (330) is glued to the submount by epoxy resin. Then, the submount (328) is fixed on the package (326) by a solder. The electrodes and the metal coatings or metal coatings and lead pins are connected by wirebonding golden wires of a 30 µm diameter.

The position of the fiber is adjusted by the steps of loosening the fiber (338) to the hole (337), exciting the laser (325), observing the power of 1.3 µm light at another end of the fiber (338), displacing the fiber for seeking the optimum position and adhering the fiber at the optimum position to the hole. Then, the package is sealed by the cap in dry nitrogen atmosphere, for example, by the seamseal method.

The embodiment succeeds in enabling the 1.55 µm light to pass the 1.3 µm LD (325) and the 1.3 µm PD (264) and reach the 1.55 µm PD (285) at the end by aligning the LD (325), the PD (264) and the PD (285) on an extension of the beam line of the fiber (338).

The module is examined by the test of exciting the 1.3 µm laser (325) and measuring the coupling efficiency between the module and the fiber. The power introduced in the fiber is as strong as the case of the laser without the front film (321) and the rear film (320). Another test of detecting the 1.55 µm light from the fiber by the PD (285) exhibits the similar sensitivity to the case of omitting the 1.3 µm LD (325) and 1.3 µm PD (264). These experiments confirm that the PD and the LD operate independently without being perturbed with each other.

The advantages of the embodiment are feasible mounting the module on a print plate owing to the rectangular shape of the box package. The use of the wide submount enables the embodiment to store a driving circuit of the laser, an amplifier of the PD or a signal processing circuit in the package.

In all the embodiments explained hitherto, the PDs and the LD work independently. The PD/LD module of the invention exhibits higher performance than prior PD module or prior LD module which are connected by WDMs. The scope of the invention is not restricted to the embodiments. Variations are allowable with regard to the packages, lenses and caps of modules. The set of two wavelengths is not confined to the set of 1.3 µm/1.55 µm.

The modules can be applied to any set of wavelengths. Favorable candidates are 1.46 µm/1.55 µm and 0.9 µm/1.3 µm in the lowest case of two wavelengths. The module according to the present invention can be produced by narrowing the sensitivity range of PDs and the emission range of an LD or LEDs in order not to overlap the emission region of λ1 and the sensitivity range of λ2.

The LD/PD module is assembled by aligning a plurality of eigen-wavelength photodiodes PD1, PD2, PD3, . . . , PDn having eigen wavelengths of λ1, λ2, λ3, . . . , λn (λ1<λ2<λ3< . . . <λn) in series in the order of increasing the eigen wavelengths and by aligning one or a plurality of light emitting devices following the series of the PDs. This invention constructs a linear module having only a linear beam line.

Since all the PDs and the LEDs or LD are arranged on a single beam line, this invention dispenses with expensive, bulky WDMs which bisect a path into two paths or unify two paths to one. Besides the WDMs, this invention excludes expensive dielectric multilayer filters which annihilate unnecessary light from the modules.

Figure 28:
FIG. 28 is a schematic view of the PD/LD module simplified by the present invention.
Figure 29:
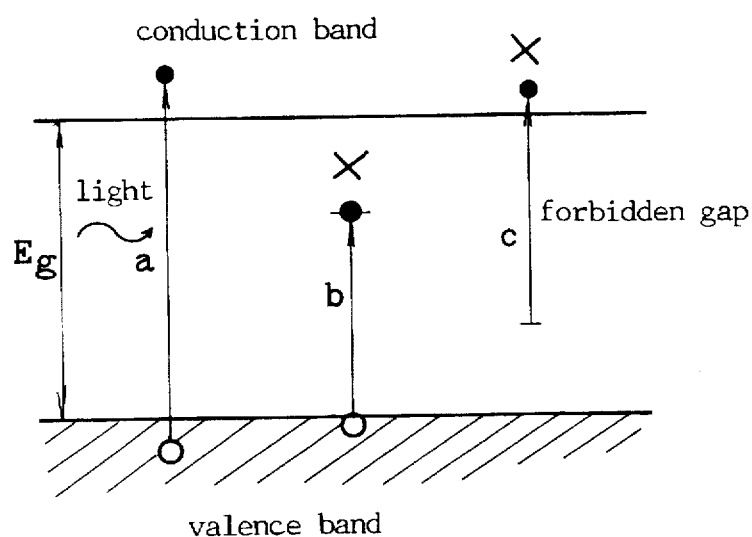
FIG. 29 is an explanatory figure of a band structure of a semiconductor for explaining the principle basing this invention.
Figure 30:
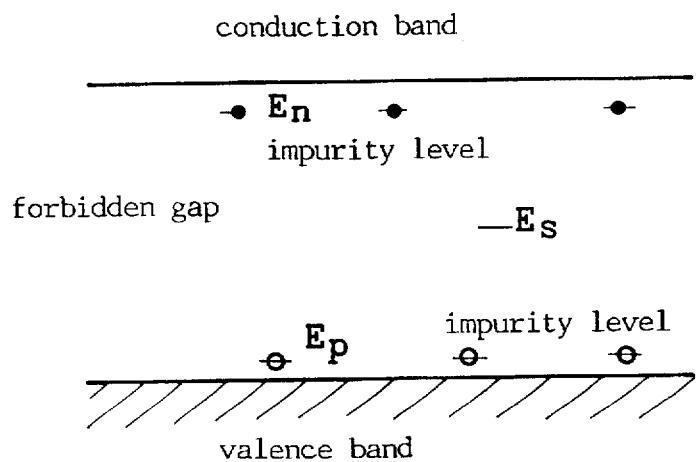
FIG. 30 is a simplified figure of a band structure having impurity levels in the forbidden gap.

In the case of n=2 (LD+PD), the prior module required three independent parts of a WDM (21), an LD module (25)

and a PD module (27). On the contrary, the module of this invention consists only of one PD/LD module. FIG. 28 shows the structure of the present invention corresponding to the prior one shown in FIG. 5. An optical fiber (16) is connected to the LD/PD module (220) explained before via an optical connector (17).

Figure 1:
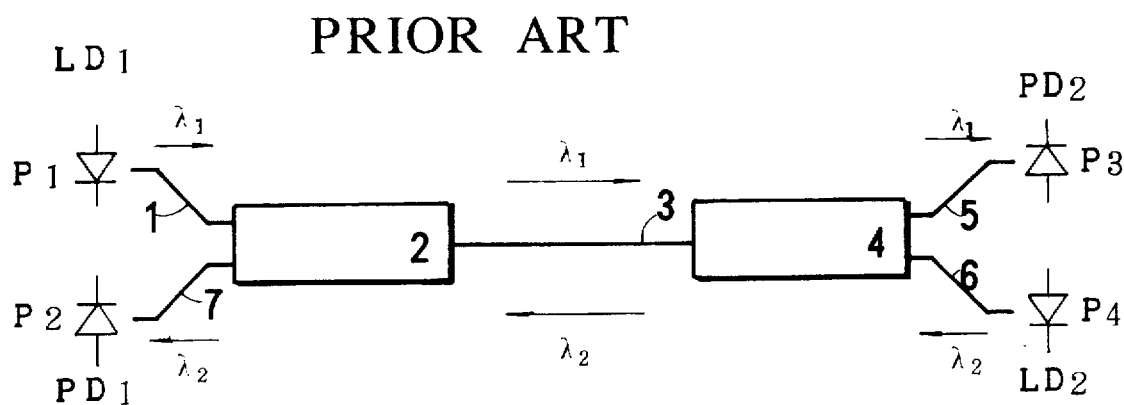
FIG. 1 is a schematic view of a bidirectional multiwavelength optical communication system.
Figure 5:
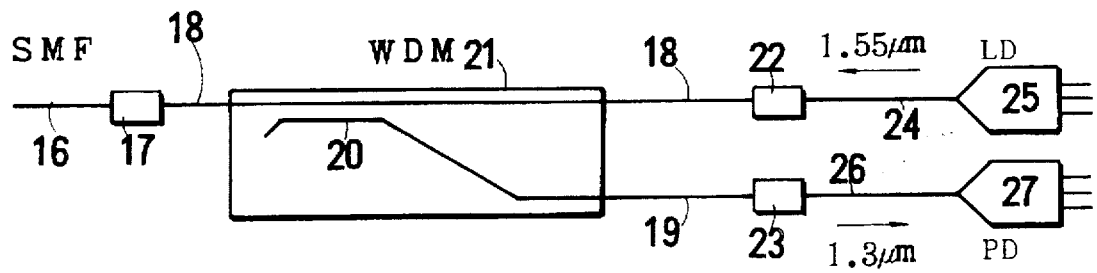
FIG. 5 is a conventional PD/LD module on an ONU terminal in a bidirectional multiwavelength communication system.
Figure 34:
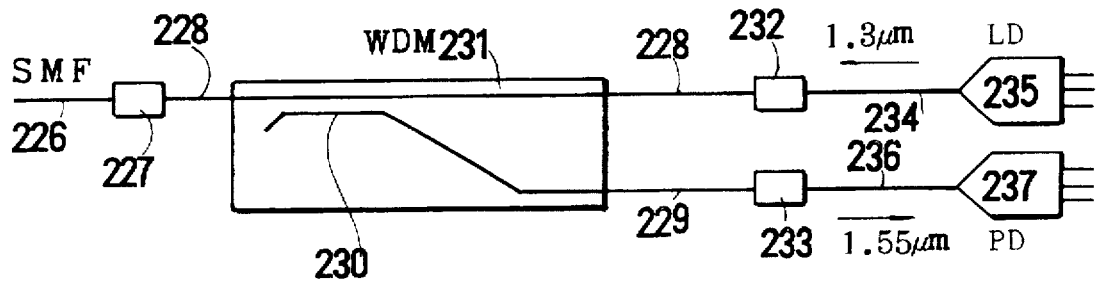
FIG. 34 is a figure of a structure of an ONU terminal of prior system.
Figure 2:
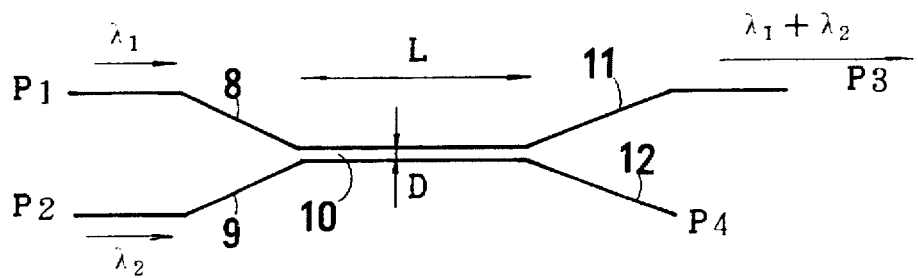
FIG. 2 is an explanatory figure of a WDM (wavelength division multiplexer) which unifies two wavelengths λ1 and λ2 in different paths into coexisting wavelengths λ1+λ2 on a path.
Figure 3:
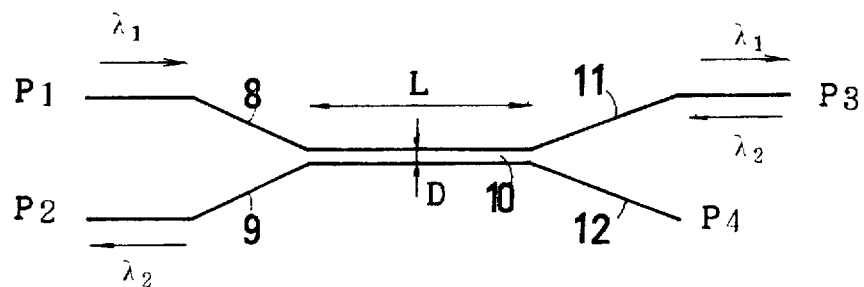
FIG. 3 is another explanatory figure of a WDM which is used for coupling a λ1 sending beam and a λ2 receiving beam into a single fiber.
Figure 4:
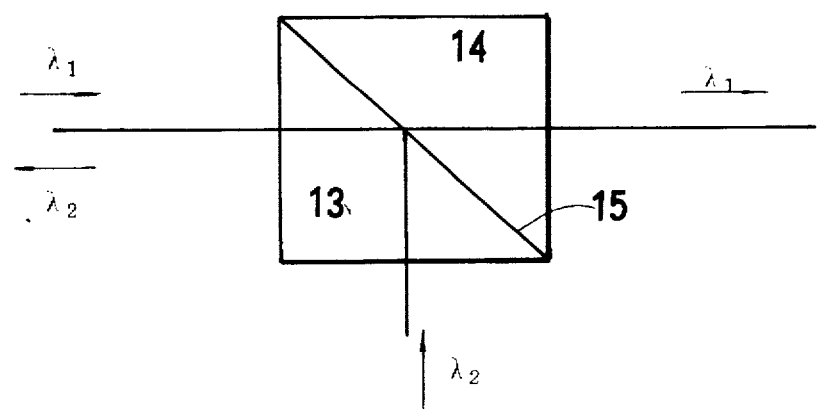
FIG. 4 is an explanatory figure of a dielectric multilayer type WDM.
Figure 7:
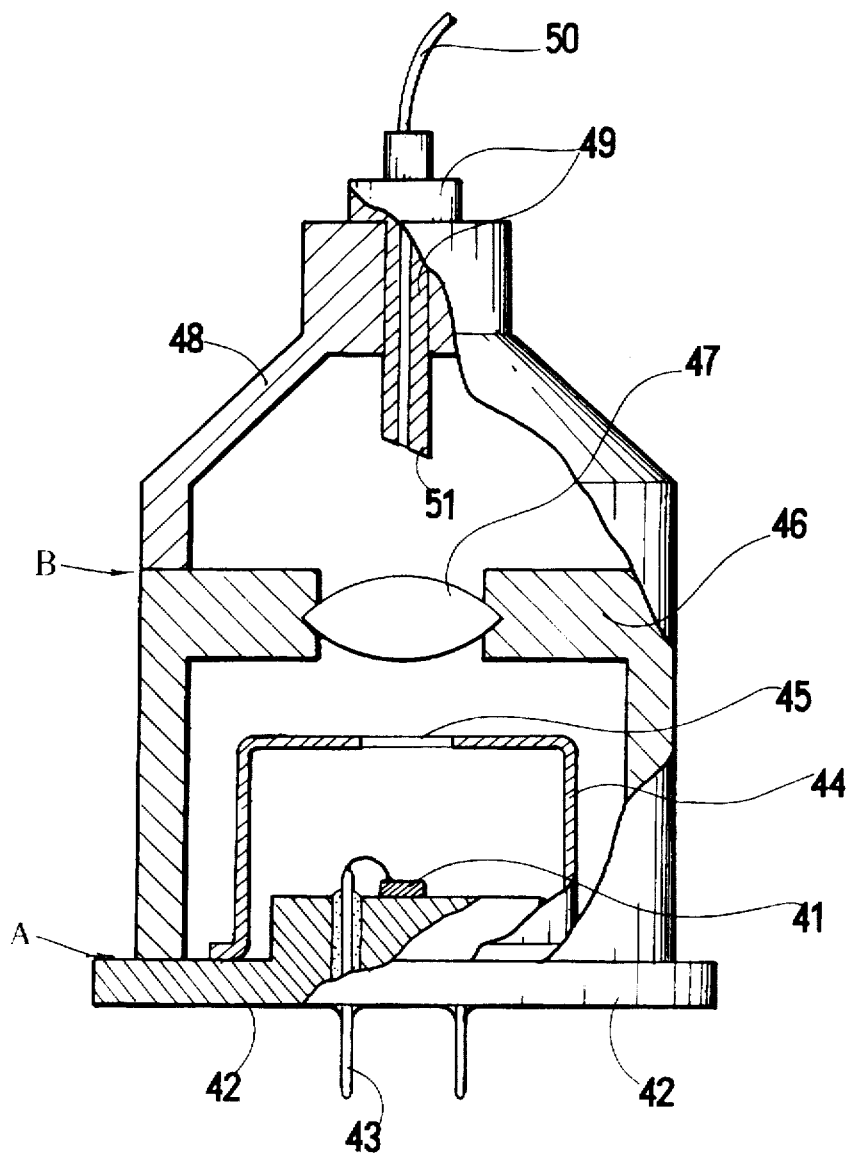
FIG. 7 is a sectional view of a prior photodiode module.

Comparison of FIG. 28 with FIG. 5 clarifies the advantages of reducing the number of parts, of decreasing the number of steps, of alleviating the cost and of facilitating the pervasion of the optical communication. This invention dispenses with the WDMs or couplers. Therefore, this invention is fully immune from the loss and the cross-talk due to the imperfection of spatial separation of WDMs or due to the defects of couplers.

The photodiodes and the light emitting devices are all endowed with monochromaticity and are aligned in series in the order of raising wavelengths ($\lambda 1 < \lambda 2 < \lambda 3 < \ldots < \lambda n$). All the PDs, the LEDs or the LD act independently without being disturbed by other devices. Thus, the module exhibits more superb a function than a sum of sole PD modules and sole LED modules. The scope of the protection is not restricted by the embodiments mentioned. Variations are available for the shape of packages, the existence of lenses, the kind of lenses or the connection with caps.

The embodiments used two wavelengths of 1.3 μm and 1.55 μm. Arbitrary set of wavelengths can be chosen according to the purpose of the bidirectional communication. For example, in the simplest case of n=2, this invention can be applied to following sets of two wavelengths;

(1) 1.3 μm/1.55 μm (2) 1.3 μm/1.46 μm (3) 1.46 μm/1.55 μm (4) 0.9 μm/1.3 μm. These sets of wavelengths (n=2) can be applied both to the case of a PD/LD module with a PD and an LD and to the case of a PD module having two PDs. Furthermore, in the case of n=3, a module having two photodiodes and an LD (or an LED) can take another set of wavelengths.

(5) 1.3 μm/1.46 μm/1.55 μm The module has a 1.3 μm PD, a 1.46 μm PD and a 1.55 μm LD in series. The PD/LD module can independently send or receive the signals carried by three wavelengths.

This invention allows higher order multiwavelength PDILD modules of the number n higher than 2 (n≧3). Monochromatic PDs, LDs or LEDs can be produced at any wavelengths besides 1.3 μm, 1.46 μm and 1.55 μm. When the communication system needs more than two wavelengths for bidirectional transmission, the system will conveniently be constructed by the PD/LD module of this invention having more than three PDs, LDs or LEDs in future.

The essence of the present invention is eigen-wavelength or wavelength-selective optoelectronic devices. In general, light emitting devices (LEDs or LDs) have inherently monochromaticity. Photodiodes, however, lack the monochromatic property, since PDs having a wide, flat range of sensitivity have been desired so far. Narrow band photodiodes contradict the common sense of the art.

This invention, however, tries to make such narrow sensitivity photodiodes for making linear PD/LD modules excluding WDMs or couplers. Monochromaticity of individual devices allows the modules to select arbitrary wavelengths for various purposes, which endows the PD/LD modules with high degree of flexibility.

Furthermore, the other LD+PDs type of this invention assembles a linear PD/LD module by placing a $\lambda 1$ laser which is transparent to $\lambda 2$ on the beam line near the end of a fiber and placing a $\lambda 2$ photodiode at the back of the laser on the beam line. The signal light progresses on a straight line without being separated spatially. The module does without WDMs, since the light is not divided into separated paths. Only a single PD/LD module can function as superbly as a prior PD/LD module which is constructed by three parts, i.e., a WDM, an LD module and a PD module.

FIG. 28 shows an ONU module making use of the module of the invention. The new ONU module has neither WDMs nor bisecting paths. Exclusion of bisections reduces the size of the module, the number of parts and the number of processes for production. Omission of WDMs reduces the loss due to WDMs. This invention is further immune from the joint loss, since the module is free from joints.

Figure 43:
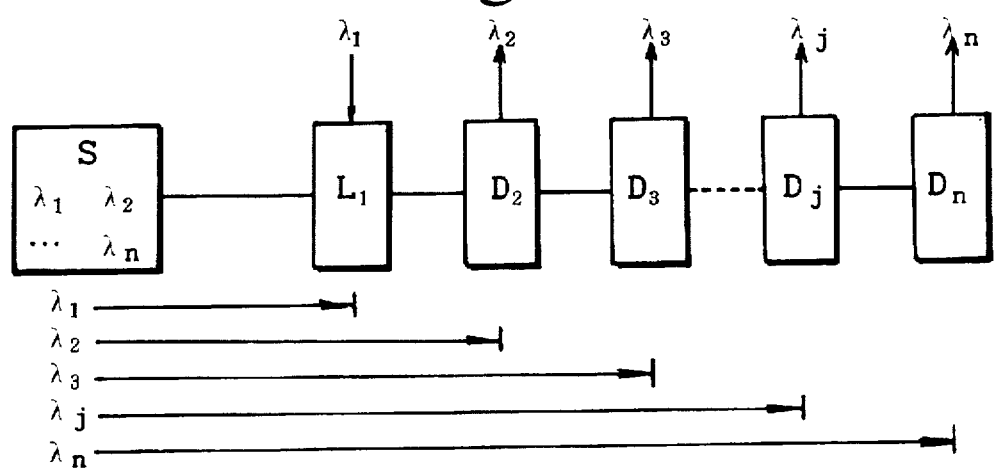
FIG. 43 is an explanatory figure of the LD/PD module which aligns a laser LD1 emitting λ1 and eigen-wavelength photodiodes PD2, PD3, PD4, ..., PDn sensing λ2, λ3, ..., λn (λ1<λ2<λ3< ... <λn) in series in the order of raising the eigen wavelengths.

Above mentioned embodiments relate to the simplest module (LD+PD) of aligning a laser and a photodiode in series for a system making use of two wavelengths. The linear LD/PD module, however, can be applied to a system including n different wavelengths of $\lambda 1 < \lambda 2 < \lambda 3 < \ldots < \lambda n$ (FIG. 43). The module has a laser LD emitting $\lambda 1$ and (n-1) photodiodes PD2, PD3, PD4, . . . . PDn for sensing eigen wavelengths $\lambda 2$, $\lambda 3$, . . . . $\lambda n$. The laser LD and the photodiodes PD2, PD3, PD4, . . . . PDn are aligned in series on a straight line which is an extension of the fiber. The j-th wavelength of $\lambda 1 + \lambda 2 + \lambda 3 + \ldots + \lambda n$ of the reception signals is allowed to pass LD, PD1, PD2, . . . .PDj-1 and is absorbed by PDj by narrowing the sensitivity range of all the PDs. Namely, the selectivity is given by narrowing the sensitivity region of PDs.

The eigen wavelengths $\lambda 2$, $\lambda 3$, . . . . $\lambda n$ are the middle values in the narrow sensitivity ranges.

This invention enables the j-th eigen PDj to sense only $\lambda j$ among the reception signals of $\lambda 1 + \lambda 2 + \lambda 3 + \ldots + \lambda n$. Prior modules would require (n-1) WDMs for separating n different wavelengths, if the system adopted n wavelengths. A WDM, however, cannot entirely separate n different wavelengths in the ratio of 1:(n-1). It would be hard to separate n different wavelengths by VWDMs. This invention can solve the difficulties of cross-talk and imperfect separation by making the best use of the wavelength selection by the absorption edge wavelengths of semiconductors.

Figure 31:
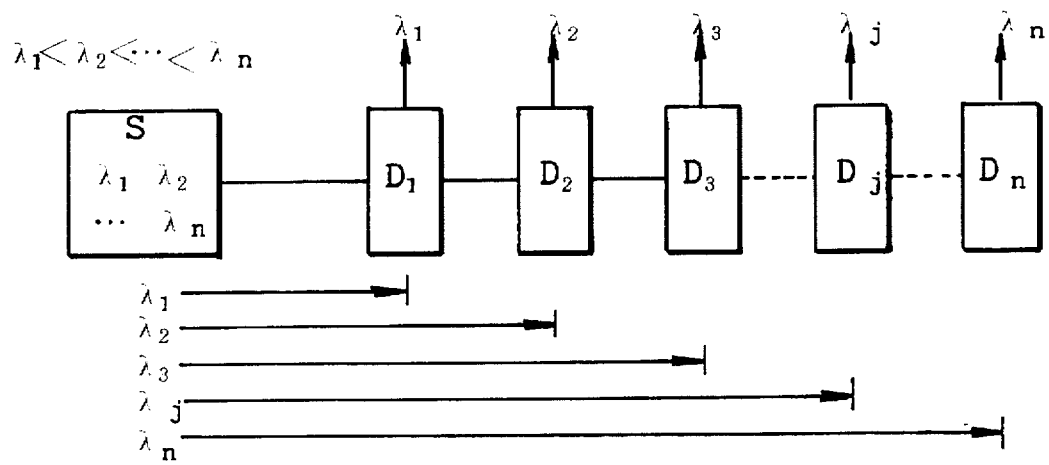
FIG. 31 is an explanatory figure of the PD module which aligns n eigen-wavelength photodiodes having eigen wavelength λ1<λ2<λ3< . . . <λn in series in the order of increasing the eigen wavelengths on the beam line.
Figure 32:
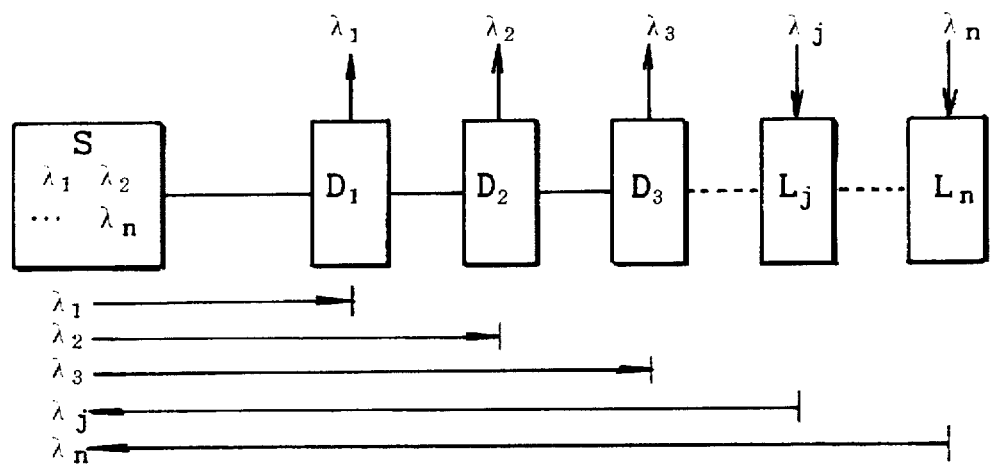
FIG. 32 is an explanatory figure of the PD/LD module which aligns eigen-wavelength photodiodes in series in the order of increasing the eigen wavelengths and eigen-wavelength (monochromatic) light emitting devices in the order of increasing the wavelengths following the set of the photodiodes.
Figure 33:
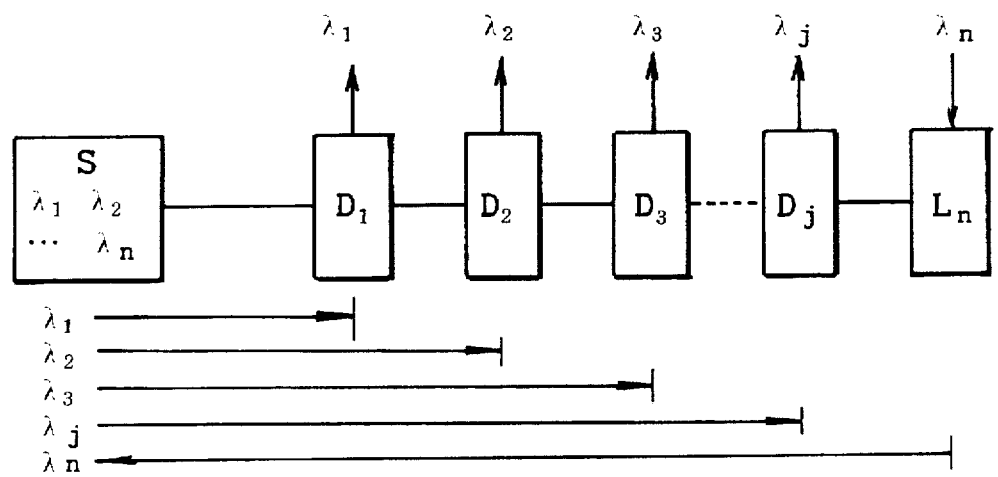
FIG. 33 is an explanatory figure of the PD/LD module which aligns eigen-wavelength photodiodes in series in the order of raising the eigen wavelengths and a laser emitting a wavelength longer than the maximum wavelength of the preceding photodiodes.
Figure 35:
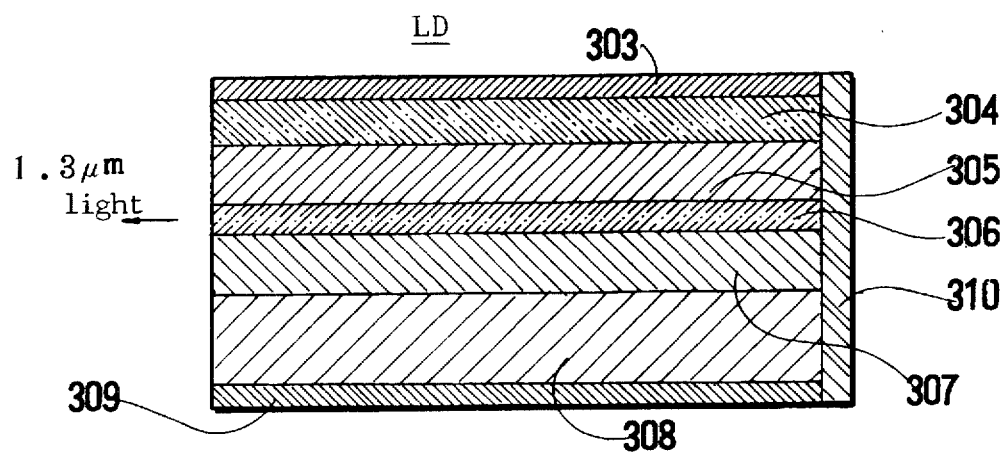
FIG. 35 is a sectional view of a prior laser diode chip.

There are five types of linear modules according to the present invention, explained before;

| | | |
|---|---|---|
| ① PD/LD module | PD1PD2PD3 . . . LDn | (FIG.33) |
| ② PD/LED module | PD1PD2 . . . PDkLEDk+1 . . . LEDn | (FIG.32) |
| ③ LD/PD module | LD1PD2PD3PD . . . PDn | (FIG.43) |
| ④ LED/PD module | LED1LED2 . . . LEDkPDk+1PDk+2 . . . PDn | |
| ⑤ PD module | PD1PD2PD3 . . . PDn-1PDn | (FIG.31) |

Various types of the linear modules will contribute to the bidirectional multiwavelength communication systems.

What we claim is:

1. A linear PD/LD module comprising;

(n−1) eigen-wavelength photodiodes PD1, PD2, PD3, . . . PDn−1 with isolated, narrow sensitivity ranges at eigen wavelengths $\lambda 1, \lambda 2, \lambda 3, \ldots,$ and $\lambda n-1$ satisfying inequalities of $\lambda 1<\lambda 2<\lambda 3< \ldots <\lambda n-1$ and;

a laser diode emitting $\lambda n$ which is longer than $\lambda n-1$;

wherein the j-th photodiode (j=1,2,3, . . . ,n−1) has a substrate, a light receiving layer, a window layer, an annular electrode with aperture on a top surface and another annular electrode with an aperture on a bottom surface for allowing light to pass from the top aperture to the bottom aperture or from the bottom aperture to the top aperture, the first photodiode PD1 has a window layer of an edge wavelength of $\lambda w1$ and a light receiving layer of an edge wavelength of $\lambda z1$ which satisfy inequalities $\lambda w1<\lambda 1<\lambda z1<\lambda 2$, the j-th photodiode PDj has a window layer of an edge wavelength of $\lambda wj$ and a light receiving layer of an edge wavelength of $\lambda zj$ which satisfy inequalities $\lambda j-1<\lambda wj<\lambda j<\lambda zj<\lambda j+1$(j= 2, 3, . . . ,n−1), the j-th photodiode absorbs and senses only $\lambda j$ light but allows the other light of a wavelength longer than $\lambda j$ to pass, the (n−1) photodiodes PD1, PD2, PD3, . . . . PDn−1 and the laser are aligned in series in the order of increasing the eigen wavelengths $\lambda 1<\lambda 2<\lambda 3< \ldots <\lambda n$ on a straight line as PD1+PD2+ PD3+ . . . +PDn−1+LD, the $\lambda n$ light emitted from the laser passes all the preceding photodiodes PD1, PD2, PD3, . . . , PDn−1 and the $\lambda j$ light in the $\lambda 1+\lambda 2+\lambda 3+ \ldots +\lambda n-1$ light emitted from an optical fiber is absorbed and sensed by the PDj.

2. A linear PD/LD module as claimed in claim 1, wherein in the case of n=2, the module includes a photodiode PD1 which senses $\lambda 1$ light but allows light of wavelengths longer than $\lambda 1$ to pass and a laser diode LD which emits $\lambda 2$ light ($\lambda 1<\lambda 2$), the photodiode and the laser are aligned on the beam line from the fiber and the band gap (Eg2) of the active layer of the laser is smaller than the band gap (Eg1) of the light receiving layer of the photodiode.

3. A linear PD/LD module as claimed in claim 2, wherein the optical fiber carrying signal light, the photodiode PD1 and the laser diode LD are aligned in this order on a straight line.

4. A linear PD/LD module as claimed in claim 3, wherein a lens is interposed between the optical fiber and the photodiode (PD1).

5. A linear PD/LD module as claimed in claim 1, 2 or 3, wherein a lens is interposed between the final photodiode PDn−1 and the laser LD.

6. A linear PD/LD module as claimed in claim 2 or 3, wherein a lens is interposed between the fiber and the PD1 and another lens is interposed between the photodiode PD1 and the laser LD.

7. A linear PD/LD module as claimed in claim 1 or 2, wherein the photodiode has a built-in lens on the bottom surface facing the laser diode.

8. A linear PD/LD module as claimed in claims 1, wherein another photodiode is exterposed behind the laser diode for monitoring the power of the laser.

9. A linear PD/LD module as claimed in claim 2, wherein a lens, a reception photodiode for receiving signals, a laser diode and another photodiode for monitoring the power of the laser are mounted in a package having a cap and a header in this order, the lens is fixed on a cap fixed on the header and the reception photodiode, the laser and the monitoring photodiode are mounted on a side of a pole of the header.

10. A linear PD/LD module as claimed in claim 9, wherein one or all of the reception photodiode, the laser and the monitoring photodiode are fixed via an insulating submount on the side of the pole of the header.

11. A linear PD/LD module as claimed in claim 9 or 10, wherein an end of the optical fiber is held by a ferrule, the ferrule is maintained by a ferrule holder and the ferrule holder is fixed on the header.

12. A linear PD/LD module as claimed in claim 9 or 10, wherein a cylinder having a dummy fiber is fitted on the header, a female connector is welded on the cylinder, an end of the optical fiber is fixed to a male connector and the male connector can be attached to or can be detached from the female connector.

13. A linear PD/LD module as claimed in claim 3, wherein the module has a submount and a box-type package, the reception photodiode, the lens, the laser and the monitoring photodiode are mounted in this order on the submount, the submount is stored in the box package and the end of the fiber is fixed at a side of the package.

14. A linear PD/LD module as claimed in claim 2, wherein the photodiode absorbs and senses 1.3 μm light but allows 1.55 μm light to pass and the laser emits 1.55 μm light.

15. A linear PD/LD module as claimed in claim 14, wherein the reception photodiode for receiving 1.3 μm signal light has a light receiving layer made from an InGaAsP mixture crystal ($\lambda g=1.42$ μm).

16. A linear PD/LD module as claimed in claim 14, wherein the reception photodiode has an n-InP substrate, an InP buffer layer, an InGaAsP ($\lambda g=1.42$ μm) light receiving layer, an InGaAsP ($\lambda g=1.15$ μm) window layer epitaxially grown on the substrate, a p-region is formed in the window layer and the light receiving layer, an annular p-electrode is formed on the p-region and an annular n-electrode is formed on the bottom of the substrate for allowing light to pass through the bottom aperture enclosed by the annular n-electrode and the top aperture enclosed by the annular-p electrode.

17. A linear PD/LD module as claimed in claim 15, wherein the top aperture enclosed by the p-electrode is covered with an antireflection film being transparent to 1.3 μm to 1.55 μm and the bottom aperture enclosed by the n-electrode is covered with an antireflection film being transparent to 1.55 μm light.

18. A linear PD/LD module as claimed in claim 15 or 17, wherein the window layer of the photodiode is an InP layer ($\lambda g=0.92$ μm).

19. A linear PD/LED module comprising;

k eigen-wavelength photodiodes PD1, PD2, PD3, . . . . PDk with isolated, narrow sensitivity ranges at eigen wavelengths $\lambda 1, \lambda 2, \lambda 3, \ldots,$ and $\lambda k$ satisfying inequalities of $\lambda 1<\lambda 2<\lambda 3< \ldots <\lambda k$ and;

(n−k) light emitting diodes LEDk+1, LEDk+2, . . . , LEDn emitting light of wavelengths of $\lambda k+1, \lambda k+2, \ldots, \lambda n$ satisfying inequalities of $\lambda k<\lambda k+1<\lambda k+2< \ldots <\lambda n$;

wherein the j-th photodiode (j=1,2,3, . . . ,k) has a substrate, a light receiving layer, a window layer, an annular electrode with aperture on a top surface and another annular electrode with an aperture on a bottom surface for allowing light to pass from the top aperture to the bottom aperture or from the bottom aperture to the top aperture, the first photodiode PD1 has a window layer of an edge wavelength of $\lambda w1$ and a light receiving layer of an edge wavelength of $\lambda z1$ which satisfy inequalities $\lambda w1<\lambda 1<\lambda z1<\lambda 2$, the j-th photodiode PDj (j=2, 3, . . . ,k) has a window layer of an edge wavelength of $\lambda wj$ and a light receiving layer of an edge wavelength of $\lambda zj$ which satisfy inequalities $\lambda j-1<\lambda wj<\lambda j<\lambda zj<\lambda j+1$(j=2, 3, . . . ,k), the j-th photodiode absorbs and senses only $\lambda j$ light but allows the other light of a wavelength longer than $\lambda j$ to pass, the PDs are aligned in series in the order of raising the eigen wavelengths, the h-th LEDh (h=k+1, k+2, ... ,n) has a substrate, an active layer of the edge wavelength $\lambda h$ emits light of an eigen wavelength $\lambda h$ and allows the light of wavelengths longer than $\lambda h$ to pass, the LEDs are aligned in series in the order of raising the eigen wavelengths, the photodiodes and the light emitting diodes L EDk+1,LEDK+2, ... , LEDn are aligned in series in the order of increasing the eigen wavelengths $\lambda 1 < \lambda 2 < \lambda 3 < ... < \lambda n$ on a straight line as PD1+PD2+ ... +PD k+LEDk+1+LEDk+2+ ... +LEDn, the $\lambda j$ light in received signals $(\lambda 1+\lambda 2+\lambda 3+ ... +\lambda j)$ passes through the preceding photodiodes PD1, PD2, ... ,PDj−1 and is fully absorbed by the correspondent photodiode PDj and the $\lambda h$ light emitted from the h-th LEDh (h=k+1, k+2, ... ,n) passes all the photodiodes PD1, PD2, ... , PDk and the preceding light emitting diodes LEDk+1, ... , LEDh−1 but is fully absorbed by the (h+1)-th LED.

20. A linear PD module comprising;

n eigen-wavelength photodiodes PD1, PD2, PD3, ... PDn−1, PDn with isolated, narrow sensitivity ranges at eigen wavelengths $\lambda 1, \lambda 2, \lambda 3, ... , \lambda n-1$ and $\lambda n$ satisfying inequalities of $\lambda 1 < \lambda 2 < \lambda 3 < ... < \lambda n$;

wherein the j-th photodiode (j=1,2,3, ... ,n) has a substrate, a light receiving layer, a window layer, an annular electrode with aperture on a top surface and another annular electrode with an aperture on a bottom surface for allowing light to pass from the top aperture to the bottom aperture or from the bottom aperture to the top aperture, the first photodiode PD1 has a window layer of an edge wavelength of $\lambda w1$ and a light receiving layer of an edge wavelength of $\lambda z1$ which satisfy inequalities $\lambda w1 < \lambda 1 < \lambda z1 < \lambda 2$, the i-th photodiode PDj has a window layer of an edge wavelength of $\lambda wj$ and a light receiving layer of an edge wavelength of $\lambda zj$ which satisfy inequalities $\lambda j-1 < \lambda wj < \lambda j < \lambda zj < \lambda j+1 (j=2, 3, ... ,n)$, the j-th photodiode absorbs and senses only $\lambda j$ light but allows the other light of a wavelength longer than $\lambda j$ to pass, the n photodiodes PD1, PD2, PD3, ... , PDn−1 and PDn are aligned in series in the order of increasing the eigen wavelengths $\lambda 1 < \lambda 2 < \lambda 3 < ... < \lambda n$ on a straight line as PD1+PD2+PD3+ ... +PDn−1+PDn, and the $\lambda j$ light in the $\lambda 1+\lambda 2+\lambda 3+ ... +\lambda n$ light emitted from an optical fiber passes the preceding photodiodes $\lambda 1, \lambda 2, \lambda 3, ... , \lambda j-1$ and is absorbed and sensed by the PDj.

21. A linear LD/PD module comprising;

a laser diode emitting $\lambda 1$ light and;

an eigen wavelength photodiode being positioned at the back of the laser for sensing $\lambda 2$ light;

wherein the laser has an active layer of a band gap Eg1, the photodiode has a light receiving layer of a band gap Eg2 which is smaller then Eg1, the laser and the photodiode are aligned in series on an extension of an optical fiber, the $\lambda 1$ light of the laser does not reach the photodiode, the optical fiber emits signal light of $\lambda 2$, the $\lambda 2$ light passes the laser and reaches the $\lambda 2$ photodiode and the photodiode detects the $\lambda 2$ light.

22. A linear LD/PD module as claimed in claim 21, wherein an end of an optical fiber, a lens, the laser and the photodiode is aligned in series in this order on the beam line of the fiber.

23. A linear LD/PD module as claimed in claim 22, wherein the module has an optical connector having a male housing and a female housing, the male housing holds an end of the optical fiber, the female housing has a dummy fiber, a holder maintains the fiber and the header having the lens, the laser and the photodiode and the male housing and the female housing can attach or detach with each other.

24. A linear LD/PD module as claimed in claim 21, 22 or 23, wherein an additional photodiode for detecting $\lambda 1$ light from the laser is interposed between the laser and the $\lambda 2$ photodiode and the additional $\lambda 1$ photodiode has an annular n-electrode with an aperture on the bottom and an annular p-electrode with another aperture on the top for allowing $\lambda 2$ light to pass through the $\lambda 1$ photodiode.

25. A linear LD/PD module as claimed in claim 21, wherein $\lambda 1=1.3$ μm and $\lambda 2=1.55$ μm.

26. A linear LD/PD module as claimed in claim 25, wherein the laser has an InP substrate and an InGaAsP active layer, the laser generates 1.3 μm light, both ends of the laser are coated with films which act as an antireflection film for 1.55 μm light but a half-reflection film for 1.3 μm light with a definite reflection ratio.

27. A linear LD/PD module as claimed in claim 26, wherein the film covering the front end of the laser consists of a 606 nm thick $SiO_2$ layer, a 24 nm thick a-Si layer and a 217 nm thick $SiO_2$ layer piled on the front end in this order, the front end film exhibits about 30% reflection ratio for 1.3 μm but less than 1% reflection ratio for 1.55 μm and the film covering the rear end consists of a 220 nm thick $SiO_2$ layer, a 56 nm thick a-Si layer, a 103 nm thick $SiO_2$ layer, a 84 nm thick a-Si layer and 470 nm thick $SiO_2$ layer piled on the rear end in this order and the rear end film shows a 80% reflection ratio for 1.3 μm but less than 1% reflection ratio for 1.55 μm.

28. A linear LD/PD module as claimed in claim 25, 26, or 27, wherein the photodiode for receiving signals travelling in the fiber has an InP substrate and an InGaAs light receiving layer.

29. A linear LD/PD module as claimed in claim 25, 26, or 27, wherein the monitoring photodiode has an InP substrate, an InP buffer layer, InGaAsP ($\lambda g=1.42$ μm) light receiving layer, an InGaAsP ($\lambda g=1.15$ μm) or InP ($\lambda g=0.92$ μm) window layer, a p-region is formed on the top surface, an annular p-electrode with an aperture is formed on the p-region and an annular n-electrode with aperture is formed on the bottom of the substrate for allowing light to pass the photodiode.

30. A linear LD/PD module as claimed in claim 21, wherein a submount supports an end of an optical fiber, a lens, a 1.3 μm-emission laser diode, a 1.3 μm monitoring photodiode, a 1.55 μm-sensing photodiode in series on a straight line, the submount is fixed in a box metal package and the package is sealed by a metallic cap.

31. A linear LD/PD module comprising;

a laser LD1 for emitting $\lambda 1$ light;

a wavelength-selective photodiode PD2 for sensing $\lambda 2$ light;

a wavelength-selective photodiode PD3 for sensing $\lambda 3$ light, ... , and;

a wavelength-selective photodiode PDn for sensing $\lambda n$ light;

wherein the wavelengths satisfy inequalities of $\lambda 1 < \lambda 2 < \lambda 3 < ... < \lambda n$, the (j−1)th photodiode PDj (j=2,3,4, ... ,n−1) has a narrow sensitivity curve which does not overlap the sensitivity curve of any other photodiodes, the (j−1)th photodiode PDj has an annular p-electrode with an aperture and an annular n-electrode with an aperture for allowing light to pass the PDj, the light receiving layer of PDj absorbs fully $\lambda j$ light but does not absorb $\lambda j+1, \lambda j+2, \ldots, \lambda n$ light, the window layer of PDj can absorb $\lambda 1, \lambda 2, \lambda 3, \ldots, \lambda j-1$ and the LD1 and the PD2, PD3, PD4, . . . .PDn are aligned in series in the order of raising the eigen wavelengths on an extension of a beam line from an optical fiber which carries a transmission wavelength $\lambda 1$ from the module and (n−1) reception wavelengths $\lambda 2, \lambda 3, \ldots, \lambda n$ to the module.

32. A linear LD/PD module as claimed in claim 31, wherein the rear end of the laser diode LD1 is covered with a wavelength-selective reflection film which is fully-reflective to $\lambda 1$ but is transparent to $\lambda 2, \lambda 3, \ldots, \lambda n$.

33. A linear LD/PD module as claimed in claim 31, wherein an additional photodiode PDa is interposed between the laser and the first photodiode PD2 for monitoring the power emitted by the laser LD1.

34. A linear LED/PD module comprising;

a light emitting diode LED1 for emitting $\lambda 1$ light;

a light emitting diode LED2 for emitting $\lambda 2$ light, . . . ;

a light emitting diode LEDk for emitting $\lambda k$ light;

a wavelength-selective photodiode PDk+1 for sensing $\lambda k+1$ light;

a wavelength-selective photodiode PDk+2 for sensing $\lambda k+2$ light, . . . and;

a wavelength-selective photodiode PDn for sensing $\lambda n$ light (k=1, 2, 3, . . . , n−1);

wherein the wavelengths satisfies inequalities of $\lambda 1 < \lambda 2 < \lambda 3 < \ldots < \lambda n$, the h-th photodiode LEDh (h=1, 2, 3, . . . , k) has a narrow emission curve which does not overlap the emission curve of any other light emitting diodes, the h-th light emitting diode LEDh has an annular p-electrode with an aperture and an annular n-electrode with an aperture for allowing light to pass the LEDh, the (j−k)-th photodiode PDj (j=k+1, k+2, k+3, . . . , n) has a narrow sensitivity curve which does not overlap the sensitivity curve of any other photodiodes, the (j−1)th photodiode PDj has an annular p-electrode with an aperture and an annular n-electrode with an aperture for allowing light to pass the PDj, the light receiving layer of PDj absorbs fully $\lambda j$ light but does not absorb $\lambda j+1, \lambda j+2, \ldots, \lambda n$ light, the window layer of PDj can absorb $\lambda 1, \lambda 2, \lambda 3, \ldots, \lambda j-1$ and the LED1, LED2, . . . .LEDk, PDk+1, PDk+2, PDk+3, PDK+4, . . . . PDn are aligned in series in the order of raising the eigen wavelengths on an extension of a beam line from an optical fiber which carries k transmission wavelengths $\lambda 1, \lambda 2, \lambda 3, \ldots, \lambda k$ from the module and (n−k) reception wavelengths $\lambda k+1, \lambda k+2, \lambda k+3, \ldots, \lambda n$ to the module.

35. A linear LD/PD module as claimed in claim 28, wherein the monitoring photodiode has an InP substrate, an InP buffer layer, InGaAsP ($\lambda g=1.42$ μm) light receiving layer, an InGaAsP ($\lambda g=1.15$ μm) or InP ($\lambda g=0.92$ μm) window layer, a p-region is formed on the top surface, an annular p-electrode with an aperture is formed on the p-region and an annular n-electrode with aperture is formed on the bottom of the substrate for allowing light to pass the photodiode.

* * * * *